(12) United States Patent
Yoda

(10) Patent No.: US 8,839,520 B2
(45) Date of Patent: Sep. 23, 2014

(54) MOUNTED STRUCTURE, LIQUID DROPLET EJECTION HEAD, LIQUID DROPLET EJECTION APPARATUS AND MANUFACTURING METHOD

(75) Inventor: Tsuyoshi Yoda, Matsumoto (JP)

(73) Assignee: Seiko Epson Corporation (JP)

( * ) Notice: Subject to any disclaimer, the term of this patent is extended or adjusted under 35 U.S.C. 154(b) by 224 days.

(21) Appl. No.: 12/844,373

(22) Filed: Jul. 27, 2010

(65) Prior Publication Data

US 2010/0291715 A1  Nov. 18, 2010

Related U.S. Application Data

(62) Division of application No. 11/337,920, filed on Jan. 23, 2006, now Pat. No. 7,784,913.

(30) Foreign Application Priority Data

Jan. 26, 2005  (JP) ................................. 2005-017951
Jan. 26, 2005  (JP) ................................. 2005-017952
Mar. 18, 2005  (JP) ................................. 2005-078974
Oct. 25, 2005  (JP) ................................. 2005-309522

(51) Int. Cl.
| | |
|---|---|
| *B21D 53/76* | (2006.01) |
| *B23P 17/00* | (2006.01) |
| *H05K 3/36* | (2006.01) |
| *B41J 2/14* | (2006.01) |
| *H05K 3/40* | (2006.01) |
| *H05K 3/18* | (2006.01) |
| *H05K 1/03* | (2006.01) |
| *H05K 3/32* | (2006.01) |

(52) U.S. Cl.
CPC ............. *B41J 2/14233* (2013.01); *H05K 3/403* (2013.01); *H05K 3/185* (2013.01); *B41J 2002/14419* (2013.01); *H05K 1/0306* (2013.01); *H01L 2224/16* (2013.01); *H05K 3/32* (2013.01); *B41J 2002/14491* (2013.01)
USPC ............................................. 29/890.1; 29/830

(58) Field of Classification Search
CPC ....... B41J 2/1603; B41J 2/1626; B41J 2/1631
USPC ......................................... 29/890.1, 829, 830
See application file for complete search history.

(56) References Cited

U.S. PATENT DOCUMENTS 6,616,270 B1 *  9/2003  Miyata et al. .................... 347/68
7,422,314 B2 *  9/2008  Yokouchi ........................ 347/68
(Continued)

FOREIGN PATENT DOCUMENTS

JP  02-066953  3/1990
JP  04-04180984  6/1992
(Continued)

*Primary Examiner* — David Angwin
(74) *Attorney, Agent, or Firm* — Harness, Dickey & Pierce, P.L.C.

(57) ABSTRACT

A method of manufacturing a device that has a semiconductor element includes: forming a first wiring on a first surface of a first member; forming a second wiring on a second surface of a second member with a gap from a connection terminal and a third wiring on an inclined plane of the second member, the second member being disposed on the first member so that the first and second surfaces face in the same direction, the third wiring being aligned with, and connecting, the first and second wirings; disposing the semiconductor element on the first or second surface; and providing plating that electrically connects the first, second and third wiring with the connection terminal, wherein the connection terminal faces the second wiring, and the plating is provided in the gap between the connection terminal and the second wiring.

6 Claims, 23 Drawing Sheets

(56) References Cited

U.S. PATENT DOCUMENTS

| | | | |
|---|---|---|---|
| 7,422,315 B2 * | 9/2008 | Hori | 347/71 |
| 7,448,732 B2 * | 11/2008 | Hori | 347/68 |
| 7,506,970 B2 * | 3/2009 | Mita | 347/68 |
| 7,549,223 B2 * | 6/2009 | Mita | 29/890.1 |
| 7,571,985 B2 * | 8/2009 | Sanada | 347/50 |
| 7,614,727 B2 * | 11/2009 | Hori | 347/71 |
| 7,621,622 B2 * | 11/2009 | Kachi | 347/68 |
| 7,625,070 B2 * | 12/2009 | Kojima | 347/58 |
| 7,651,198 B2 * | 1/2010 | Yokouchi | 347/68 |
| 7,784,913 B2 * | 8/2010 | Yoda | 347/58 |
| 7,815,292 B2 * | 10/2010 | Enomoto et al. | 347/68 |
| 7,815,294 B2 * | 10/2010 | Kojima et al. | 347/71 |
| 2003/0206218 A1 * | 11/2003 | Miyata et al. | 347/70 |
| 2006/0152548 A1 * | 7/2006 | Yasoshima et al. | 347/45 |

FOREIGN PATENT DOCUMENTS

| | | |
|---|---|---|
| JP | 07-304178 | 11/1995 |
| JP | 08-148531 | 6/1996 |
| JP | 2000-127379 | 5/2000 |
| JP | 2000-135790 | 5/2000 |
| JP | 2001-093907 | 4/2001 |
| JP | 2003-086910 | 3/2003 |
| JP | 2003-266394 | 9/2003 |
| JP | 2004-237624 | 8/2004 |
| JP | 2004-262225 | 9/2004 |

* cited by examiner

FIG. 7
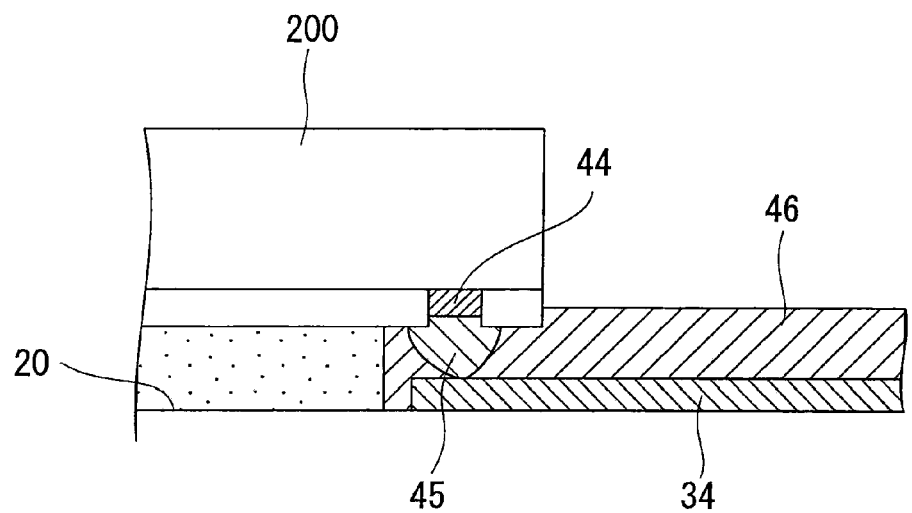
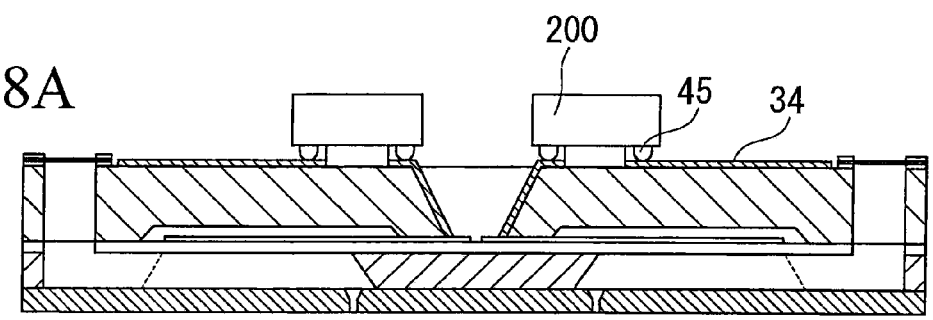
FIG. 8A
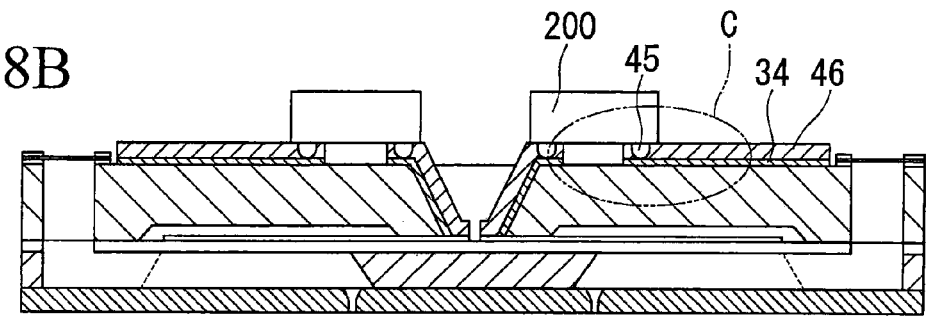
FIG. 8B

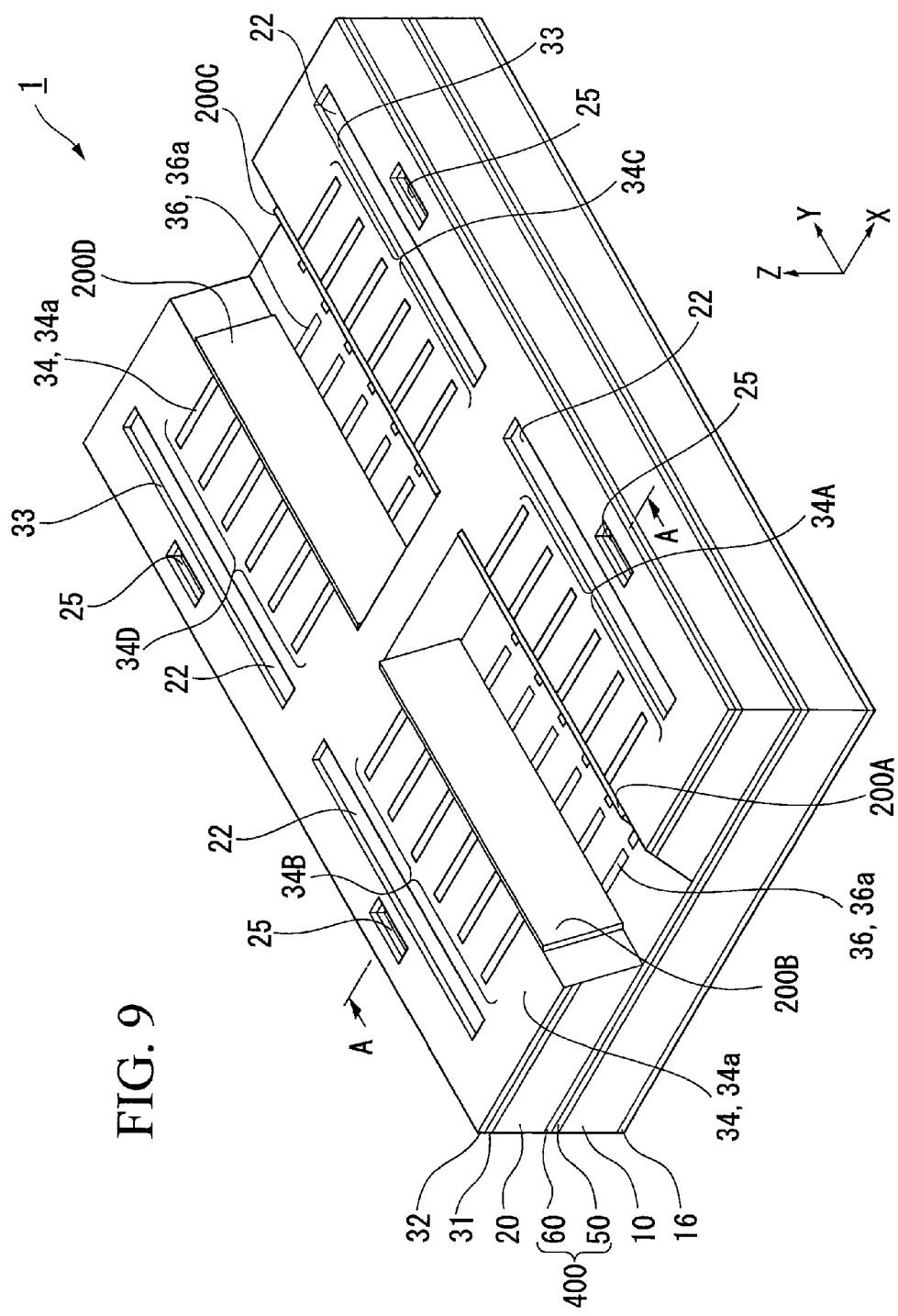

MOUNTED STRUCTURE, LIQUID DROPLET EJECTION HEAD, LIQUID DROPLET EJECTION APPARATUS AND MANUFACTURING METHOD

CROSS-REFERENCE TO RELATED APPLICATION

This application is a divisional of U.S. application Ser. No. 11/337,920 filed Jan. 23, 2006, which claims priority to Japanese Patent Application No. 2005-017951, filed Jan. 26, 2005, Japanese Patent Application No. 2005-017952, filed Jan. 26, 2005, Japanese Patent Application No. 2005-078974, filed Mar. 18, 2005, and Japanese Patent Application No. 2005-309522, filed Oct. 25, 2005, the contents of which are incorporated herein by reference.

BACKGROUND

1. Technical Field

The present invention relates to mounted structure, liquid droplet ejection head, liquid droplet ejection apparatus, and manufacturing method thereof.

2. Related Art

A liquid droplet ejection method (ink jet method) is proposed for use when manufacturing an image forming device or micro device. The liquid droplet ejection method is a method for forming a desired pattern ejected onto a substrate, in which a functional liquid which includes a material for forming the device or for forming the image is made into liquid droplets and is ejected from the droplet ejection head.

In the liquid droplet ejection head (ink jet type recording head) disclosed in Japanese Unexamined Patent Application, First Publication No. 2000-127379, a wiring semiconductor element (driver IC) connection terminal arranged on an upper part of a step difference, and a driven element (piezoelectric element) arranged on a lower part of the step difference are connected by wire bonding.

Using a liquid droplet ejection head, in a method which realizes an image forming device or micro device manufacture, in order to realize minute detailing of a highly detailed image or micro device, the liquid droplet ejection head nozzle aperture distance between nozzle apertures (nozzle pitch) should by made as small (narrow) as possible. Since piezoelectric elements are multiply formed corresponding to the nozzle apertures, if the nozzle pitch is made small, the distance between the piezoelectric elements should also be small, corresponding to the nozzle pitch. If the distance between the piezoelectric elements is small, connection between the multiple piezoelectric elements, and between the respective wiring and the driver IC, by the wire bonding method is difficult.

SUMMARY

An advantage of some aspects of the invention is to provide a structure capable of mounting, even if the wiring has a narrow pitch semiconductor element, a method of manufacture of a device, a liquid droplet ejection head and its method of manufacture.

A further object of some aspects of the invention is to provide a liquid droplet ejection apparatus which has a liquid droplet ejection head.

A mounting structure according to an aspect of the invention includes: a first member that has a first surface on which is formed a first wiring; a second member disposed on the first surface of the first member and having a second surface and a side surface, the second surface facing in a same direction as the first surface of the first member and on which is formed a second wiring, the side surface on which is formed a third wiring that combines the first wiring and the second wiring; a semiconductor element disposed on the first surface of the first member or on the second surface of the second member; and plating that electrically connects the first wiring, the second wiring, the third wiring, and a connection terminal of the semiconductor element.

In accordance with an embodiment of the invention, even if the wiring has a narrow pitch, semiconductor element mounting is possible for wire bonding, without providing a space for a guide wire.

It is preferable that a configuration be adopted in which, the side surface of the second member is an inclined surface.

According to this configuration, in comparison with when the side surface of the second member is a vertical surface, third wiring can be easily formed on the side surface of the second member.

It is preferable that a configuration be adopted in which, at least one of the first wiring, the second wiring, and the third wiring is composed of a photosensitive resin mixed with a catalyst.

According to this configuration, patterning of wiring with only photolithography is possible, simplifying the manufacturing process. Furthermore, plating is reliably provided by a catalyst.

A manufacturing method of a device that has a semiconductor element, the method according to an aspect of the invention includes: forming a first wiring on a first surface of a first member; forming a second wiring on a second surface of a second member and a third wiring on a side surface of the second member, the second member disposed on the first surface of the first member, the second surface facing in a same direction as the first surface of the first member, the third wiring combining the first wiring and the second wiring; disposing the semiconductor element on the first surface of the first member or on the second surface of the second member; and providing plating that electrically connects the first wiring, the second wiring, the third wiring, and a connection terminal of the semiconductor element.

In accordance with an embodiment of the invention, an electrical connection is assured by plating even if there is mutual positional slippage or a gap between the connection terminal and the wiring. Furthermore, simultaneous execution of mounting the semiconductor element and the electrical connection of each wiring becomes possible, simplifying the manufacturing process.

A liquid droplet ejection head that ejects liquid droplets through deformation of a driven element, the head according to an aspect of the invention includes: a first substrate having a pressurizing chamber with a nozzle aperture that ejects liquid droplets, and a first surface on which is formed a first wiring electrically connected to the drive element; a second substrate disposed on the first surface of the first substrate and covering the driven element, the second substrate having a second surface and a side surface, the second surface facing in a same direction as the first surface of the first substrate and on which is formed a second wiring, the side surface on which is formed a third wiring that combines the first wiring and the second wiring; a semiconductor element disposed on the second surface of the second substrate, and which drives the driven element; and plating that electrically connects the first wiring, the second wiring, the third wiring, and a connection terminal of the semiconductor element.

In accordance with an embodiment of the invention, in conjunction with the narrow pitching of the nozzle aperture, even if the first wiring has a narrow pitch, the semiconductor element can be mounted without providing a space for a guide wire for wire bonding.

It is preferable that a configuration be adopted in which, the second substrate is a silicon substrate having a <100> orientation, and the side surface of the second substrate is an inclined surface formed by etching the silicon substrate.

According to this configuration, an inclined surface can be easily formed.

It is preferable that a configuration be adopted in which, at least one of the first wiring, the second wiring, and the third wiring is composed of a photosensitive resin mixed with a catalyst.

According to this configuration, patterning of the wiring with only photolithography is possible, simplifying the manufacturing process. Furthermore, plating is reliably provided by the catalyst.

It is preferable that a configuration be adopted in which, a part of the second wiring is arranged facing the connection terminal of the semiconductor element, and the connection terminal of the semiconductor element is provided with a conductive protrusion that protrudes and faces the second wiring.

According to this configuration, by the protrusion of the semiconductor element, the semiconductor element and the second wiring can be reliably combined by means of plating, enabling improved reliability of the electrical connection.

A manufacturing method of a liquid droplet ejection head that ejects liquid droplets through deformation of a driven element, the method according to an aspect of the invention includes: forming a first wiring on a first surface of a first substrate that has a pressurizing chamber with a nozzle aperture that ejects liquid droplets; forming a second wiring on a second surface of a second substrate and a third wiring on a side surface of the second substrate, the second substrate disposed on the first surface of the first substrate, the second surface facing in a same direction as the first surface of the first substrate, the third wiring combining the first wiring and the second wiring; disposing the semiconductor element on the second surface of the second substrate; and providing plating that electrically connects the first wiring, the second wiring, the third wiring, and a connection terminal of the semiconductor element.

In accordance with an embodiment of the invention, even if there is positional slippage or a gap between the connection terminal and the wiring or among the wiring, an electrical connection can be secured by means of the plating, making it possible to mount the semiconductor element and electrical connection of each wiring, simplifying the manufacturing process.

A mounting structure according to an aspect of the invention includes: a stepped body having an upper step surface, a lower step surface, and a side surface that combines the upper step surface and the lower step surface, a first wiring formed on the lower step surface of the stepped body, a second wiring formed on the upper step surface of the stepped body, a semiconductor element disposed on the side surface of the stepped body, and plating that electrically connects the first wiring, the second wiring, and a connection terminal of the semiconductor element.

In accordance with an embodiment of the invention, even if the wiring is made to be a narrow pitch, mounting the semiconductor element can be accomplished without providing a wire guide space for wire bonding.

It is preferable that a configuration be adopted in which, the side surface of the stepped body is an inclined surface.

According to this configuration, the semiconductor device can be easily mounted in comparison with when the side surface of the stepped body is a vertical surface.

It is preferable that a configuration be adopted in which, at least one of the first wiring, the second wiring, and the third wiring is composed of a photosensitive resin mixed with a catalyst.

According to this configuration, patterning of the wiring only with photolithography is possible, simplifying the manufacturing process. Furthermore, plating is reliably provided by the catalyst.

A manufacturing method of a device that has a semiconductor element, the method according to an aspect of the invention includes: forming a first wiring on a lower step surface of a stepped body, forming a second wiring on an upper step surface of the stepped body, disposing the semiconductor element on a side surface that combines the upper step surface and the lower step surface of the stepped body, and providing plating that electrically connects the first wiring, the second wiring, and a connection terminal of the semiconductor element.

In accordance with an embodiment of the invention, even if slippage between each wiring and the electrical connection of the semiconductor element is caused by a manufacturing error or the like, the electrical connection can be secured by plating. Furthermore, there is no need to form wiring on the side surface of the stepped body, simplifying the manufacturing process.

A liquid droplet ejection head that ejects liquid droplets through deformation of a driven element, the head according to an aspect of the invention includes: a first substrate having a pressurizing chamber with a nozzle aperture that ejects liquid droplets, and a first surface on which is formed a first wiring electrically connected to the driven element; a second substrate disposed on the first surface of the first substrate and covering the driven element, the second substrate having a second surface and a side surface, the second surface facing in a same direction as the first surface of the first substrate and on which is formed a second wiring, the side surface on which is formed a third wiring that combines the first wiring and the second wiring; a semiconductor element disposed on the side surface of the second substrate, and which drives the driven element; and plating that electrically connects the first wiring, the second wiring, the third wiring, and a connection terminal of the semiconductor element.

In accordance with an embodiment of the invention, in conjunction with the narrow pitching of the nozzle aperture, even if the first wiring electrically connected to the drive element is made to be a narrow pitch, the semiconductor element can be mounted without providing a wire guide space for wire bonding.

It is preferable that a configuration be adopted in which, the second substrate is a silicon substrate having a <100> orientation, and the side surface of the second substrate is an inclined surface formed by etching the silicon substrate.

According to this configuration, the inclined surface can be simply formed. Furthermore, the semiconductor element can be easily mounted on the side surface of the protective substrate.

It is preferable that a configuration be adapted in which, at least one of the first wiring, the second wiring, and the third wiring is composed of a photosensitive resin mixed with a catalyst.

According to this configuration, patterning of the wiring becomes possible with only photolithography, simplifying the manufacturing process. Furthermore, plating is reliably provided.

A manufacturing method of a liquid droplet ejection head that ejects liquid droplets through deformation of a driven element, the method according to an aspect of the invention includes: forming a first wiring on a first surface of a first substrate that has a pressurizing chamber with a nozzle aperture that ejects liquid droplets; forming a second wiring on a second surface of a second substrate and a third wiring on a side surface of the second substrate, the second substrate disposed on the first surface of the first substrate, the second surface facing in a same direction as the first surface of the first substrate, the third wiring combining the first wiring and the second wiring; disposing the semiconductor element on the side surface of the second substrate; and providing plating that electrically connects the first wiring, the second wiring, the third wiring, and a connection terminal of the semiconductor element.

In accordance with an embodiment of the invention, even if positional slippage between each of the wiring and the connection terminal of the semiconductor element is caused by a manufacturing error or the like, an electrical connection can be positively secured by plating, simplifying the manufacturing process without forming wiring on the side surface of the protective substrate.

A mounting structure according to an aspect of the invention includes: a first member that has a first surface on which is formed a first wiring; a second member disposed on the first surface of the first member and having a second surface, a third surface and a side surface, the second surface facing in a same direction as the first surface of the first member and on which is formed a second wiring, the third surface being adjacent to the first member and on which is formed a third wiring, the side surface on which is formed a forth wiring that combines the second wiring and the third wiring; a semiconductor element disposed on the second surface of the second member; and plating that electrically connects the first wiring, the second wiring, the third wiring, the forth wiring, and a connection terminal of the semiconductor element.

In accordance with an embodiment of the invention, even if the wiring is made to be a narrow pitch, the semiconductor can be mounted without providing a wire guide for wire bonding. Furthermore, it is sufficient if only plating of the second member is provided, and the influence of plating processing on the first member can be avoided. Furthermore, improved electrical reliability of the mounting construction can be achieved.

It is preferable that a configuration be adapted in which, the side surface of the second member is an inclined surface.

According to this configuration, forming the wiring on the side surface of the second member is easy in comparison to when the side surface of the second member is a vertical surface.

It is preferable that a configuration be adapted in which, at least one of the first wiring, the second wiring, the third wiring, and the forth wiring is composed of a photosensitive resin mixed with a catalyst.

According to this configuration, patterning of each wiring is possible using only photolithography, thereby simplifying the manufacturing process. Furthermore, plating can be reliably provided by means of a catalyst.

It is preferable that a configuration be adapted in which, the side surface of the second member has multiple inclined surfaces of mutually different angles relative to the second surface.

According to this configuration, exposure of the side surface of the second membrane may be accomplished by dividing one side from the other side, and in comparison with exposing the entire side surface body once, adjustment of the focal point depth of the exposure device is easy. Furthermore, forming the wiring on the side surface of the second member can be simply accomplished at low-cost.

It is preferable that a configuration be adapted in which, the side surface of the second member has multiple inclined surfaces in which a mutually narrow angle is obtuse, or a curved surface.

According to this configuration, each wiring can be formed continuously, and applied to another surface from one surface of the second member. Furthermore, even when a gap occurs between each wiring, a conductive connection can be positively realized between each wiring by means of plating grown from the closely proximate wiring. Furthermore, improved electrical reliability of the mounting construction can be achieved.

A manufacturing method of a device that has a semiconductor element, the method according to an aspect of the invention includes: forming a first wiring on a first surface of a first member; forming a second wiring on a second surface of a second member, a third wiring on a third surface of the second member, and a forth wiring on a side surface of the second member, the third surface being opposite the second surface; disposing the semiconductor element on the second surface of the second member; providing plating that electrically connects the second wiring, the third wiring, the forth wiring and a connection terminal of the semiconductor element; and disposing the second member on the first surface of the first member to electrically connect the plating and the first wiring.

In accordance with an embodiment of the invention, even if there is positional slippage or a gap between the connection terminal and the wiring or mutually between the wiring, a secure conductive connection is realized between the wiring by means of plating grown from the proximate wiring. Furthermore, the electrical reliability of the mounting construction can be improved.

A liquid droplet ejection head that ejects liquid droplets through deformation of a driven element, the head according to an aspect of the invention includes: a first substrate having a pressurizing chamber with a nozzle aperture that ejects liquid droplets, and a first surface on which is formed a first wiring electrically connected to the driven element; a second substrate disposed on the first surface of the first substrate and covering the driven element, the second substrate having a second surface, a third surface and a side surface, the second surface facing in a same direction as the first surface of the first substrate and on which is formed a second wiring, the third surface contacting the first surface of the first substrate and on which is formed a third wiring, the side surface on which is formed a third wiring that combines the second wiring and the third wiring; a semiconductor element disposed on the second surface of the second substrate, and which drives the driven element; and plating that electrically connects the first wiring, the second wiring, the third wiring, the forth wiring, and a connection terminal of the semiconductor element.

In accordance with an embodiment of the invention, in conjunction with making the nozzle aperture to be a narrow pitch, even if the fourth wiring conductively connected to the drive element is made to be a narrow pitch, the semiconductor element can be mounted without providing a wire guide space for wire bonding. Furthermore, it is sufficient if plating is provided on only the protective substrate, and the influence of the plating process on the drive element requiring high precision can be avoided. Furthermore, the electrical reliability of the droplet ejection head can be improved.

It is preferable that a configuration be adapted in which, the second substrate is a silicon substrate having a <100> orientation, and the side surface of the second substrate is an inclined surface formed by etching the silicon substrate.

According to this configuration, the inclined surface can be simply formed. Furthermore, formation can be easily accomplished of the wiring on the side surface of the protective substrate.

It is preferable that a configuration be adapted in which, at least one of the first wiring, the second wiring, the third wiring and the fourth wiring is composed of a photosensitive resin mixed with a catalyst.

According to this configuration, it is possible for patterning of wiring to be realized using only photolithography, simplifying the manufacturing process. Furthermore, the plating can be positively provided by the catalyst.

It is preferable that a configuration be adapted in which, the side surface of the second substrate has multiple inclined surfaces of mutually different angles relative to the second surface.

According to this configuration, exposure of the side surface of the protective substrate may be realized by dividing one side from the other side, and in comparison with exposing the entire side surface body once, adjustment of the focal point depth of the exposure device is easy. Furthermore, the wiring can be simply formed at low-cost.

It is preferable that a configuration be adapted in which, the side surface of the second substrate has multiple inclined surfaces in which a mutually narrow angle is obtuse, or a curved surface.

According to this configuration, each wiring can be formed continuously, and applied to another surface from one surface of the protective substrate. Furthermore, even when a gap occurs between each wiring, a conductive connection can be positively realized between each wiring by means of plating grown from the closely proximate wiring.

It is preferable that a configuration be adapted in which, the plating and the first wiring are electrically connected via an anisotropic conductive film.

According to this configuration, even if the first wiring is made to be a narrow pitch, the first wiring and plating can be positively electrically connected through the oriented conductive film.

It is preferable that a configuration be adapted in which, the semiconductor element is sealed.

According to this configuration, the semiconductor element can be protected in the manufacturing process of a liquid droplet ejection head. Furthermore, the semiconductor element can be protected even after the completion of the liquid droplet ejection head.

A manufacturing method of a liquid droplet ejection head that ejects liquid droplets through deformation of a driven element, the method according to an aspect of the invention includes: forming a first wiring on a first surface of a first substrate that has a pressurizing chamber with a nozzle aperture that ejects liquid droplets; forming a second wiring on a second surface of a second substrate, a third wiring on a third surface of the second substrate, and a forth wiring on a side surface of the second substrate, the third surface being opposite the second surface; disposing the semiconductor element on the second surface of the second substrate; providing plating that electrically connects the second wiring, the third wiring, the forth wiring and a connection terminal of the semiconductor element; and disposing the second substrate on the first surface of the first substrate to cover the driven element and to electrically connect the plating and the first wiring.

In accordance with an embodiment of the invention, even if there is positional slippage or a gap between the connection terminal and the wiring or among the wiring, an electrical connection can be secure by means of the plating. Furthermore, it is possible to mount the semiconductor element on the protective substrate and to simultaneously execute the electrical connection of each wiring, simplifying the manufacturing process.

A liquid droplet ejection apparatus according to an aspect of the invention has a liquid droplet ejection head described above.

In accordance with an embodiment of the invention, since the nozzle aperture is provided with a narrow pitch liquid droplet ejection head, it is possible to draw a pattern with high precision.

BRIEF DESCRIPTION OF THE DRAWINGS

FIG. 7 is a partially enlarged view showing a mounting construction according to the second embodiment.

FIGS. 8A and 8B are a cross-sectional process diagrams showing the construction method of a liquid droplet ejection head.

FIG. 9 is a perspective view showing a liquid droplet ejection head according to the third embodiment.

DESCRIPTION OF EXEMPLARY EMBODIMENTS

An explanation of the embodiments of the present invention is provided hereafter, with reference to the drawings. In the following explanation, an intersecting XYZ coordinate system is established, with reference to which an explanation is provided according to the position of each member. A specific direction on a level plane is made to be the X-axis direction, the intersecting direction on the same plane of which is the Y-axis direction, and the respectively intersecting directions (namely the vertical direction) in the X-axis direction and the Y-axis direction are made to be the Z-axis direction.

First Embodiment

Figure 1:
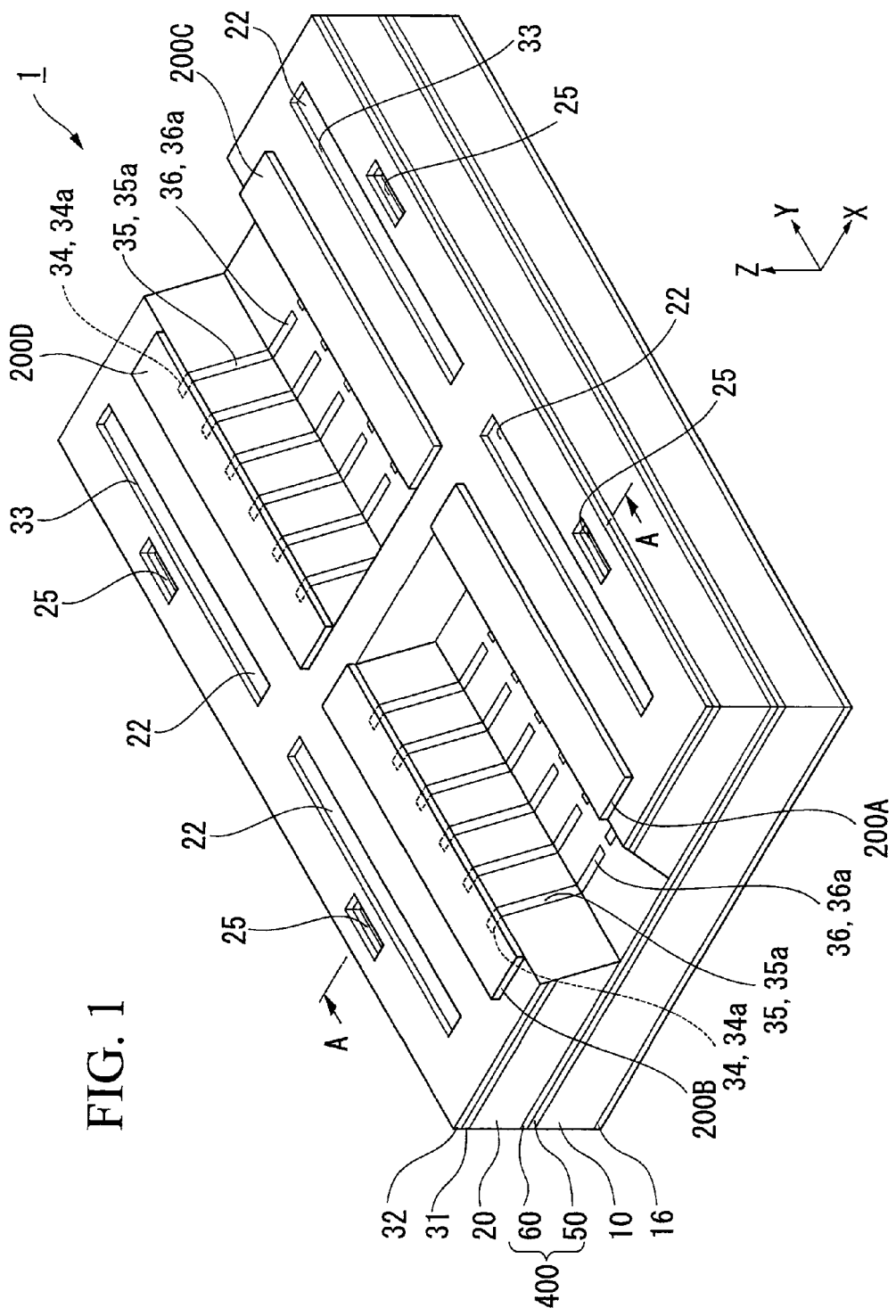
FIG. 1 is a perspective view showing a liquid droplet ejection head according to the first embodiment.
Figure 2:
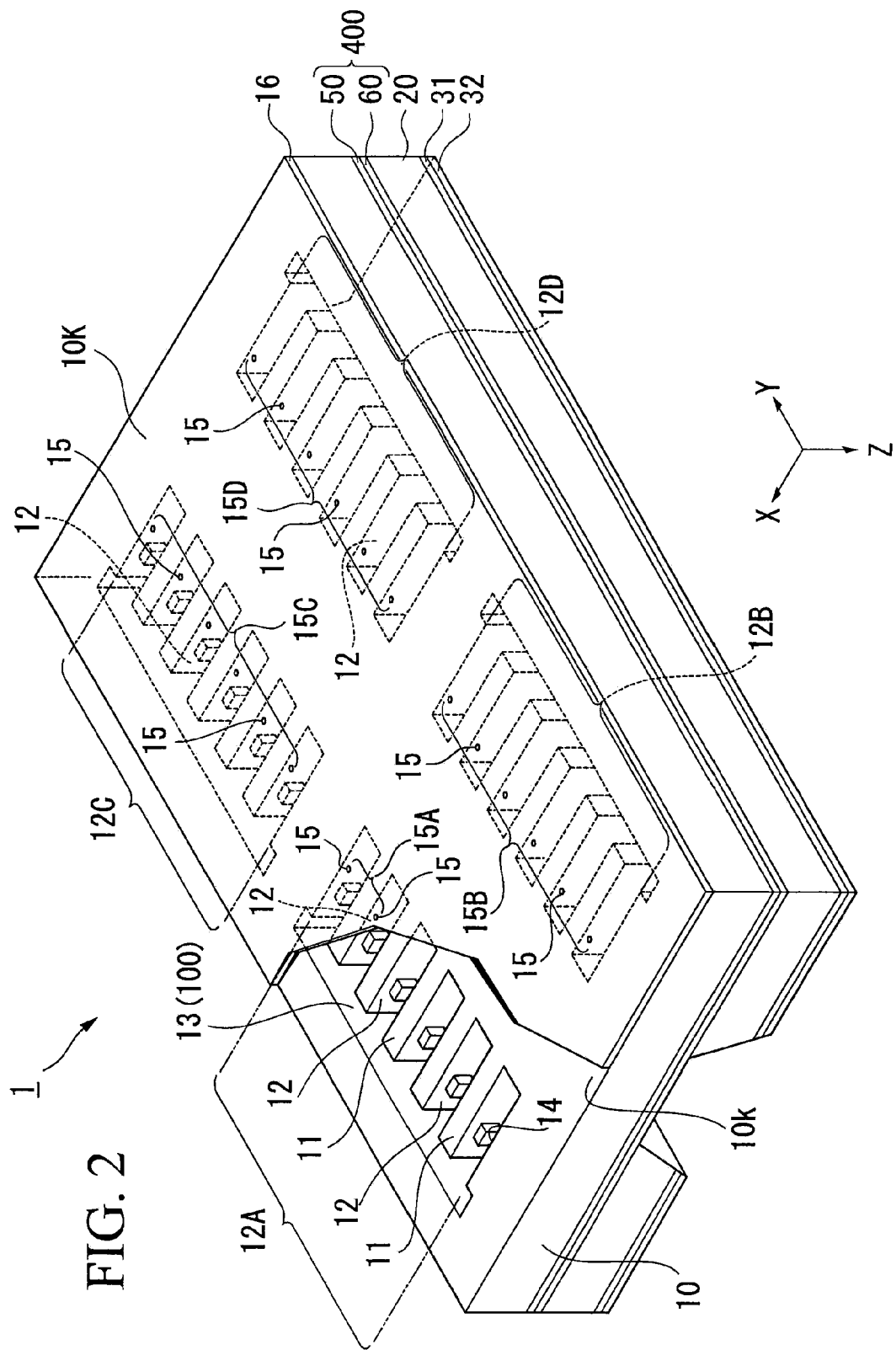
FIG. 2 is a perspective view showing the liquid droplet ejection head is viewed from the lower side.
Figure 3:
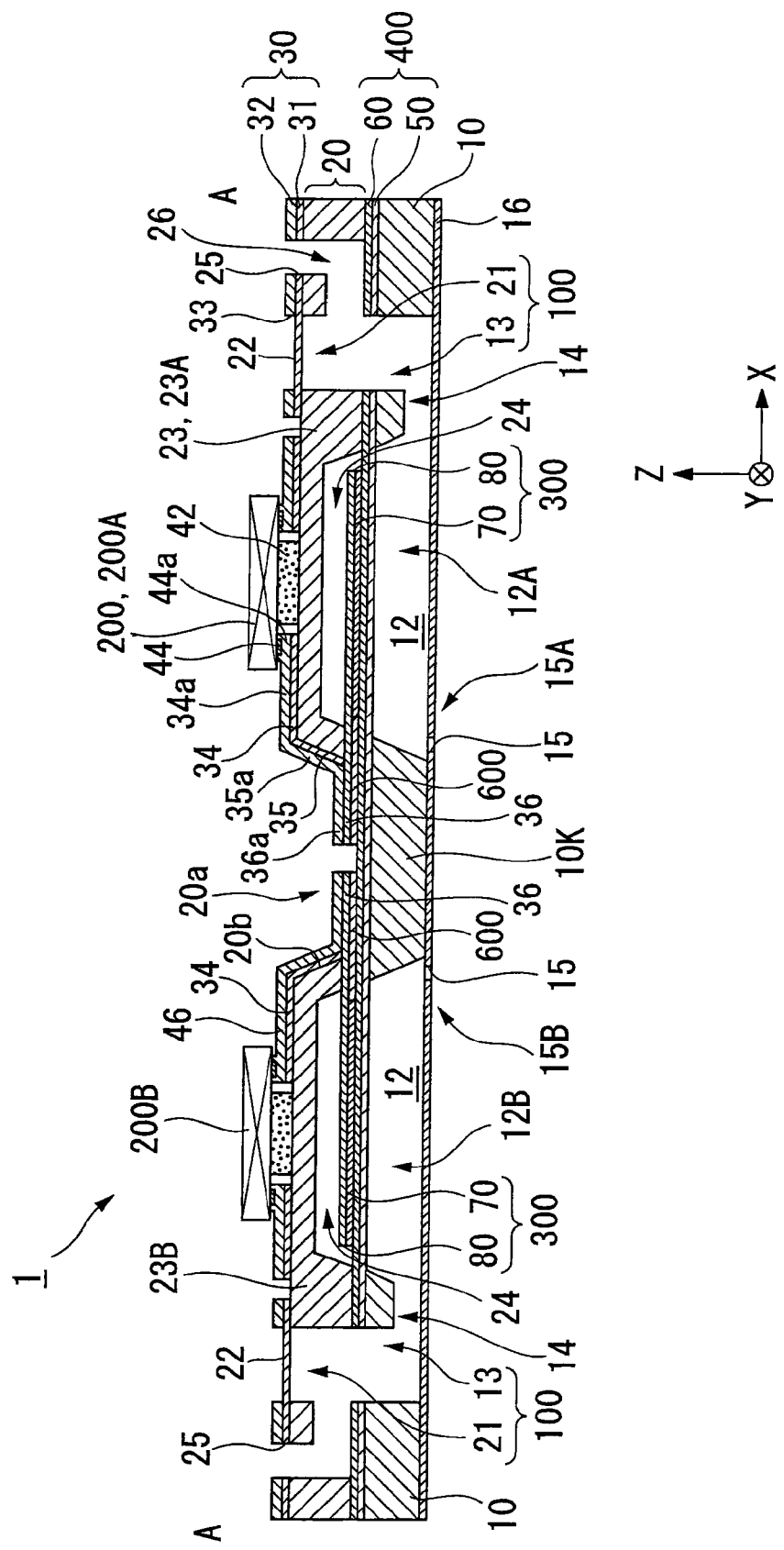
FIG. 3 is a cross-sectional view along the line A-A of FIG. 1.

An explanation of a first Embodiment of a liquid droplet ejection head according to the present invention is described hereafter with reference FIGS. 1 to 3. FIG. 1 is a perspective view of an embodiment of the liquid droplet ejection head, FIG. 2 is a partially fragmented diagram of a perspective view in which the liquid droplet ejection head is viewed from below, and FIG. 3 is a cross-sectional diagram of line A-A, in FIG. 1.

As shown in FIG. 3, a liquid droplet ejection head 1 of the present Embodiment turns functional fluid into droplets, and ejects them from a nozzle. The liquid droplet ejection head 1 is provided with a flow path forming substrate (first member, first substrate) 10, a pressurizing chamber 12 which communicates with a nozzle aperture 15 from which the liquid droplets are ejected, and a piezoelectric element (driven element) 300 which produces a pressure change in the pressurizing chamber 12 arranged on the upper surface of the pressurizing chamber 12, and a reservoir forming substrate (protective substrate, second member, second substrate) 20 which covers the piezoelectric element 300 arranged on the upper surface of the pressurizing chamber 20, and a semiconductor element 200 which drives the piezoelectric element 300 arranged on the upper surface of the reservoir forming substrate 20. The operation of the liquid droplet ejection head 1 is controlled by an un-shown external controller connected to the semiconductor element 200.

As shown in FIG. 2, on the lower side (−Z side) of the liquid droplet ejection head 1 is mounted a nozzle substrate 16. On the nozzle substrate 16 are arranged multiple nozzle apertures 15 which eject liquid droplets, and which are arranged in the Y-axis direction. In this embodiment, groups of nozzle apertures 15 arranged in multiple regions on the nozzle substrate 16 are respectively designated as a first nozzle aperture group 15A, a second nozzle aperture group 15B, a third nozzle aperture group 15C, and a fourth nozzle aperture group 15D.

The first nozzle aperture group 15A and the second nozzle aperture group 15B are arranged in a row in the X-axis direction. The third nozzle aperture group 15C is provided on the first nozzle aperture group 15A+Y side, and the fourth nozzle aperture group 15D is provided on the nozzle aperture group 15B+Y side. The third nozzle aperture group 15C and the fourth nozzle aperture group 15D are arranged in a row in the X-axis direction.

FIG. 2 shows a construction in which each nozzle aperture group 15A-15D is respectively composed of a six-unit nozzle aperture 15. However, each nozzle aperture group is actually composed, for example, of a 20-unit nozzle aperture 15.

The flow path forming substrate 10 is arranged on the upper side (+Z side) of the nozzle substrate 16, in which the lower surface of the flow path forming substrate 10 and the nozzle substrate 16 are fixed by an adhesive or a thermal deposition film, or the like. The flow path forming substrate 10 may be composed of silicon, glass, or ceramic material or the like, and in the present embodiment is formed of silicon. On the underside of the flow path forming substrate 10 are formed multiple partition walls 11 extending from the center in the X-axis direction, by the partial removal of a silicon single crystalline substrate including a welding base material of the flow path forming substrate 10 by means of anisotropic etching. By means of partition walls 11, multiple regions having a comb-shape are formed in the compartments on the flow path forming substrate 10. Among these aperture regions, components are formed to extend in the X-axis direction of the pressurizing chamber (first member) 12 enclosed by the nozzle substrate 16 and an oscillating plate 400. The pressurizing chamber 12 houses a functional liquid, which is ejected from the nozzle apertures 15 by means of the pressure applied when operating the liquid droplet ejection head 1.

Each pressurizing chamber 12 is provided corresponding to multiple nozzle apertures 15. In other words, the pressurizing chamber 12 is provided in multiple rows in the Y-axis direction so as to correspond to the multiple apertures 15 respectively composing the first through fourth nozzle aperture groups 15A-15D. The multiply formed pressurizing chambers 12 corresponding to the first nozzle aperture group 15A compose a first pressurizing chamber group 12A, the pressurizing chambers 12 multiply formed corresponding to the second nozzle aperture group 15B compose a second pressurizing chamber group 12B, the pressurizing chambers 12 multiply formed corresponding to the third nozzle aperture group 15C compose a third pressurizing chamber group 12C, and the pressurizing chambers 12 multiply formed corresponding to the fourth aperture group 15D compose a fourth pressurizing chamber group 12D. The first pressurizing chamber group 12A and the second pressurizing chamber group 12B are arranged in rows in the X-axis direction, in between which are formed partition walls 10K extending in the Y-axis direction. In the same manner, the third pressurizing chamber group 12C and the fourth pressurizing chamber group 12D are arranged in rows extending in the X-axis direction, between which are also formed partition walls 10K.

Furthermore, among the com-shape aperture regions formed on the flow path substrate 10, the part formed to extend in the Y-axis direction shown in the drawing composes a reservoir 100. The end of a substrate external margin side (+X side) in the multiple pressurizing chambers 12 which forms the first pressurizing chamber group 12A is connected to the reservoir 100, which holds the functional liquid supplied to the pressurizing chamber 12 in reserve, and becomes a common functional liquid preservation chamber (ink chamber) of the multiple pressurizing chambers 12 composing the first pressurizing chamber group 12A. In the respective second, third and fourth pressurizing chamber groups 12B, 12C, and 12D as well, the reservoir 100 is connected in the same manner as indicated above, and composes a temporary functional liquid accumulation unit which is supplied to the respective pressurizing groups 12B to 12D.

As shown in FIG. 3, the reservoir 100 has a reservoir portion 21 formed on the reservoir formed substrate 20, and is composed from a coupled part formed in the current flow formed substrate 10. The coupling part 13 has a function for connecting the reservoir portion 21 to each of the respective pressurizing chambers 12. On the outside (opposite side to the flow path forming substrate 10) of the reservoir forming substrate 20 is connected a compliance substrate 30 constructed of a laminated layer including a sealing film 31 and a fixed plate 32. In the compliance substrate 30, the sealing film 31 arranged internally is formed from a material (for example, polyphenylene sulfide film having a thickness of approximately 6 µm) having elasticity characteristics of low rigidity. On the other hand, the fixed plate 32 arranged on the outside is formed from material (for example, stainless steel having a thickness of 30 µm), a hard metalic.

In the fixed plate 32 is formed an aperture 33 formed by cutting out the plane surface region corresponding to the reservoir 100. With such a structure, the upper part of the reservoir 100 seals only the elastic sealing film 31, and forms a deformable elastic part 22 by changing the internal pressure. Furthermore, in the compliance substrate 30, is formed a functional liquid introduction aperture 25 for supplying functional liquid to the reservoir 100. In the reservoir forming substrate 20 is provided an introduction path 26 which communicates with the functional liquid introduction aperture 25 and the reservoir 100.

Functional liquid introduced from the functional liquid introduction aperture 25 flows into the reservoir 100 through the introduction path 26, and is supplied to the multiple pressurizing chambers 12 composing the first pressurizing chamber group 12A, through a supply path 14. Pressure changes are generated in the reservoir 100 by the flow of the functional liquid or by heating the periphery when driving the piezoelectric element 300. However, since a flexible part 22 of the reservoir 100 absorbs the pressure changes produced by elastic deformation, the inside of the reservoir 100 ordinarily remains fixed.

On the upper surface side (+Z side) of the flow path forming substrate 10 shown in the drawing, is arranged an oscillation plate 400. The oscillation plate 400 has a construction which laminates a flexible film 50 and a lower electrode film 60 chronologically from the flow path forming substrate 10 side. The flexible film 50 arranged on the flow path forming substrate 10 side is formed, for example, from a silicon oxide film having a thickness of approximately 1-2 µm. The lower electrode film 60 is formed, for example, from a metallic film having a thickness of approximately 0.2 µm. In the embodiment, the lower electrode film 60 functions as a common electrode of multiple piezoelectric elements 300 arranged between the flow path forming substrate 10 and the reservoir forming substrate 20.

On the upper surface side (+Z side) of the oscillation plate shown in the drawing is arranged the piezoelectric element 300 for deforming the oscillation plate 400. The piezoelectric element 300 has a structure in which a piezoelectric film 70 and an upper electrode film 80 are laminated from the lower electrode film 60 side. The piezoelectric film 70 is formed, for example, from a PZT film or the like having a thickness of approximately 1 µm. The electrode film 80 is formed, for example, from a metallic film having a thickness of approximately 0.1 µm. As a summary of the piezoelectric element 300, in addition to the piezoelectric film 70 and the upper electrode film 80, the lower electrode 60 may also be included. The lower electrode film 60 functions as the oscillation plate piezoelectric element 300, and also functions as an oscillation plate 400. In the embodiment, the flexible film 50 and lower electrode film 60 adopt a structure which functions as the oscillation plate 400. However, by eliminating the flexible film 50, the lower electrode film 60 may also be composed to jointly serve as the flexible film 50.

The piezoelectric element 300 (the piezoelectric film 70 and upper electrode film 80) is multiply provided so as to correspond to the multiple nozzle apertures 15 and the pressurizing chambers 12. In the embodiment, a group of piezoelectric elements 300 provided in multiple rows in the Y-axis direction so as to respectively correspond to the nozzle apertures 15 composing the first nozzle aperture group 15A are made to be a so-called second piezoelectric element group. Furthermore, a first piezoelectric element group corresponding to the third nozzle aperture group is referred to as a third piezoelectric element group, and the first piezoelectric element group corresponding to the fourth nozzle aperture group is referred to as the fourth piezoelectric element group. The first piezoelectric element group and a second piezoelectric element group are arranged in rows in the X-axis direction. In the same manner, the third piezoelectric element group and the fourth piezoelectric element group are arranged in rows in the X-axis direction.

In order to cover the piezoelectric element 300, the reservoir forming substrate (protective substrate, second member, second substrate) 20 is arranged on the upper surface side (+Z side) of the flow path forming substrate 10 shown in the drawing. Since the reservoir forming substrate 20, in addition to the flow path forming substrate 10, is a member which forms the base of the liquid droplet ejection head 1, it is desirable that, as its structural member, use be made of a rigid material which has roughly the same thermal expansion ratio as that of the flow path forming substrate 10. In the case of the embodiment, since the flow path forming substrate 10 is formed from silicon, optimal use is made of a silicon single crystal substrate of the same material. Since the silicon substrate easily realizes high precision processing by means of anisotropic etching, there is the advantage that a piezoelectric element support 24, described hereafter, can be easily formed. As with the flow path forming substrate 10, it is also possible to compose a reservoir forming substrate 20, by using glass or ceramic material or the like.

On the reservoir forming substrate 20 is provided a seal 23 which tightly seals the piezoelectric element 300. In the embodiment, the part which seals the first piezoelectric element group is made to be a first seal 23A, and the part which seals a second piezoelectric element group is made to be the second seal 23B. In the same manner, the part which seals the third piezoelectric element group is made to be a third seal, and the part which seals the fourth piezoelectric element group is made to be the fourth seal. The third seal is provided with a piezoelectric element support (element support) 24 formed from an indentation of a plane surface viewed as being approximately rectangular and extending vertically from the page surface of FIG. 3. The piezoelectric element support 24, in addition to assuring that there is no obstacle and that there is sufficient space on its periphery to permit movement of the piezoelectric element 300, also has the function of tightly sealing the space. The piezoelectric element support 24 has measurements which enable sealing of at least the piezoelectric film 70 of the piezoelectric element 300. Furthermore, the piezoelectric element support 24 may also be partitioned for multiple piezoelectric elements 300.

In this manner, the reservoir forming substrate 20 functions as a protective substrate that shields the piezoelectric element 300 from the external environment.

With the reservoir forming substrate 20, by sealing the piezoelectric element 300, deterioration of the piezoelectric element 300 caused by external aqueous components and the like can be prevented. Furthermore, with the present embodiment, the inside of the piezoelectric element support 24 is sealed, but by creating an internal vacuum or an environment of nitrogen or argon within the piezoelectric element support 24, it can be maintained at low humidity. By such a construction, deterioration of the piezoelectric element 300 can be effectively prevented.

In the reservoir forming substrate 20, a groove 20a is provided which penetrates the reservoir forming substrate 20 between the first seal 23A and the second seal 23B in the reservoir forming substrate 20. Through the groove 20a, the upper surface of the flow path forming substrate 10 is exposed to the outside. Steps are formed from the upper surface of the exposed flow path substrate 10 to the upper surface of the seal 23 of the reservoir forming substrate 20.

A side surface 20b of the groove 20a of the reservoir forming substrate 20 is an inclined surface. Particularly, if the reservoir forming substrate 20 is composed of a silicon substrate having a <1, 0, 0> orientation, and if the silicon substrate is wet etched with an alkali solution of KOH and the like, through differences in the etching rate of each surface direction, the side surface 20b of the groove 20a is made to be an inclined surface of approximately 54°.

Among the piezoelectric elements 300 sealed by the piezoelectric element support 24 of the reservoir substrate 20, the end of the −X side of the upper electrode film 80 extends to the upper surface of the exposed flow path forming substrate 10, thereby composing a first wiring 36. The first wiring 36 is composed of a metallic material including Al or N i-Cr, Cu, Ni, Au, and Ag and the like. The first wiring 36 may also be accomplished with a photosensitive resin material mixed with a catalyst. When the lower electrode film 60 is arranged in a planar sheet state on the flow path forming substrate 10, an insulation film 600 is arranged for preventing short-circuiting between the upper electrode film 80 extending to the outside of the piezoelectric element support 24 and the lower electrode film 60. Furthermore, in lieu of extending the upper electrode film 80 in its existent state, the electrode wiring electrically connected to the upper electrode film 80 is formed on the flow path forming substrate 10, and the electrode wiring may also be drawn to the outside of the piezoelectric element support 24 and used as the first wiring 36.

The second wiring 34 is formed on the upper surface of the reservoir forming substrate 20, and the third wiring 35 is formed on the side surface of the reservoir forming substrate 20. As shown in FIG. 1, the first wiring 36 and the same number of second wiring 34 and the third wiring 35 are formed in the same Y-directional position as the first wiring 36. and coupling is accomplished between the second wiring 34 and the third wiring 35. However, a gap of approximately several μm-10 μm may also be formed.

The second wiring 34 and the third wiring 35 shown in FIG. 3, should desirably be structured with a resin material mixed with a catalyst. Specifically, particles of Pd (palladium) are dispersed composed of a photosensitive resin material. In this case, it is possible for the second wiring 34, and the third wiring 35 to be formed by means of photolithography. In other words, the resin material is coated on the upper surface and the side surface of the reservoir forming substrate 20, and patterning can be accomplished of the second wiring 34 and the third wiring 35 by exposure and development.

The second wiring 34 and the third wiring 35 may also be constructed with a metallic material composed of Al or Ni—Cr, Cu, Ni, Au, and Ag. However, in patterning the metallic material, it is necessary for a resist to be subjected to masked etching, complicating the manufacturing process. In this regard, with a structure using a photosensitive resin material mixed with a catalyst, the second wiring 34 and the third wiring 35 can be patterned using only photolithography, simplifying the manufacturing process.

On the upper surface side (+Z side) of the reservoir forming substrate 20 shown in the drawing, the semiconductor element 200 is arranged face down. The semiconductor element 200 includes, for example, a semiconductor integrated circuit (IC) which includes a circuit substrate or a drive circuit. As shown in FIG. 1, the present embodiment arranges four semiconductor elements 200A-200D to drive the first through fourth piezoelectric element groups.

Furthermore, in the margin of the lower surface side (−Z side) of the semiconductor element 200 shown in the drawing, are provided multiple connection terminals 44, composed of a metallic material of Al or Ni—Cr, Cu, Ni, Au, and Ag and the like. At the end of the −X side of the semiconductor element 200A are arranged the same number of connection terminals 44 as for the second wiring 34, arranged in a row at the same pitch as the second wiring 34. Furthermore, at the end of the semiconductor terminal 200A+X side is formed a connection terminal 44 which is electrically connected to an external controller. By adjusting the amount of adhesive arranged on the lower surface of the semiconductor element 200 and the amount of heat/pressure applied when adhering, a gap of approximately several μm-10 μm is formed between the connection terminals 44 and the second wiring 34.

In this manner, a gap is provided between the connection terminal 44 and the second wiring 34. Furthermore, since fixing is accomplished between the reservoir forming substrate 20 and the flow path forming substrate 10 through an (un-shown) adhesive, a gap is also provided between the third wiring 35 and the first wiring 36. Furthermore, the resin material mixed with a catalyst and which composes the second wiring 34 and the third wiring 35 is an electrical insulating material, in which state the semiconductor element 200 and the piezoelectric element 300 are not electrically connected.

Plating 46 is provided on the surface of the first-third wiring and the connection terminal. Specifically, plating 36a is provided on the surface of the first wiring 36, plating 35a is provided on the surface of the third wiring 35, plating 34a is provided on the surface of the second wiring 34, and plating 44a is a provided on the surface of the connection terminal 44. With the second wiring 34 and the third wiring 35 composed of a resin material mixed with a catalyst, the plating 34a and the plating 35a are provided relative to the catalyst. The plating 46 are composed of a metallic material such as Cu, or Ni, and the Au and the like. Plating may also be mixed by different materials on the surface of each wiring and connection terminal.

Figure 4:
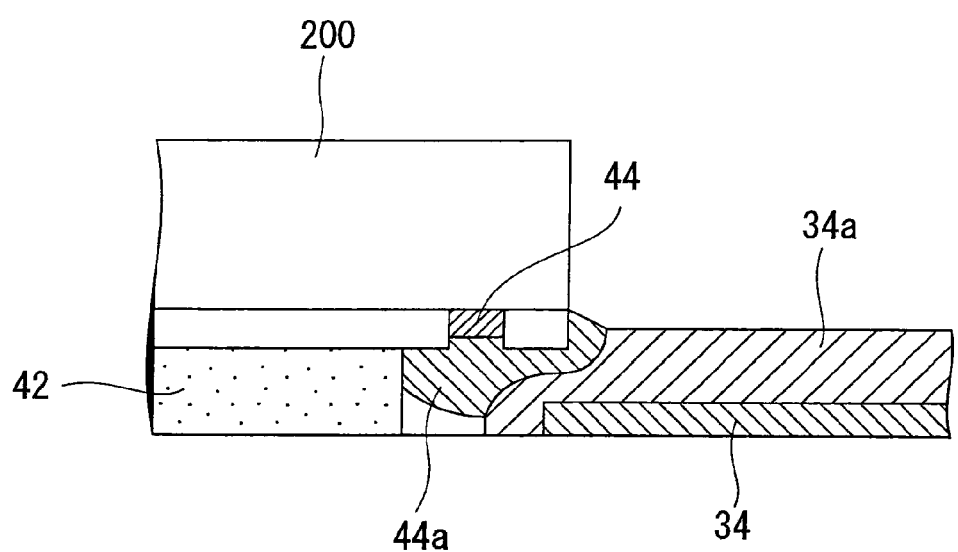
FIG. 4 is a partially enlarged view showing the mounting construction according to the first embodiment.
Figure 6A:
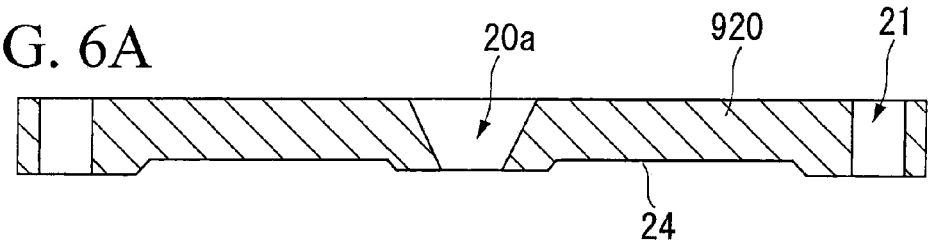
FIGS. 6A, 6B, 6C, 6D, and 6E are cross-sectional process diagrams showing the construction method of a liquid droplet ejection head.
Figure 6B:
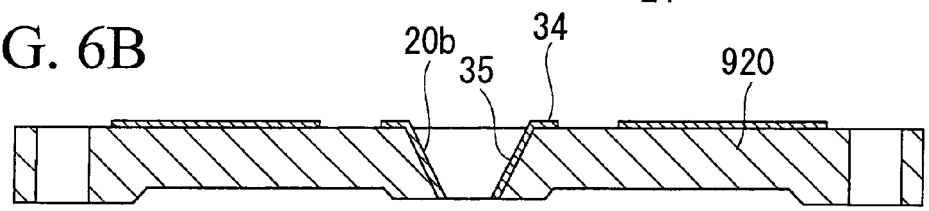
Figure 6C:
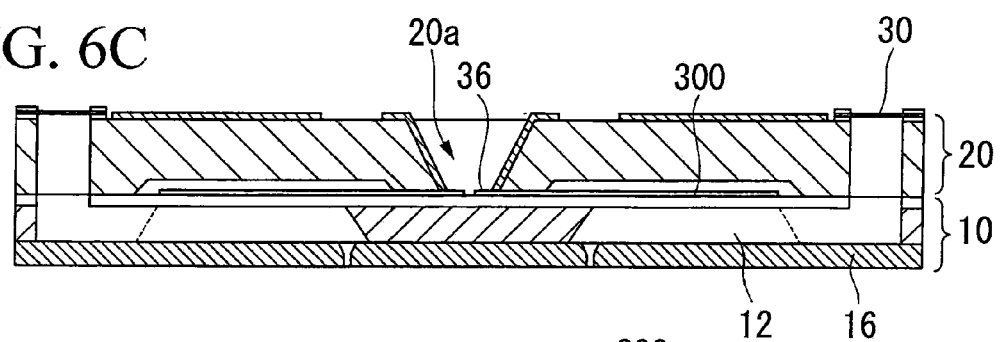
Figure 6D:
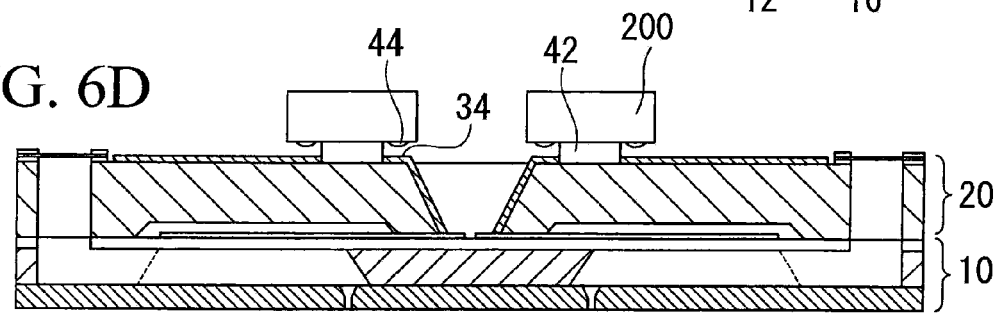
Figure 6E:
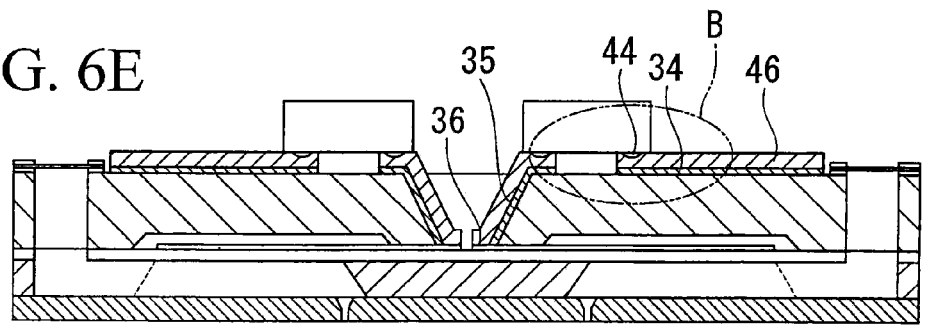

FIG. 4 is an explanatory diagram of the mounting structure according to the first embodiment, and is an enlarged view of section B of FIG. 6E. As shown in FIG. 4, plating 44a is provided on the surface of the connection terminal 44 of the semiconductor element 200, and plating 34a is provided on the surface of the second wiring 34. By combining the grown plating 44a and 34a, the connection terminal 44 and the second wiring 34 are electrically connected, thereby mounting the semiconductor element 200. In the same manner, combining the plating 35a which is provided /grown on the surface of the third wiring 35 shown in FIG. 3 and the plating 36a produced/grown on the surface of the first wiring 36, the third wiring 35 and the first wiring 36 are electrically connected, electrically connecting the semiconductor element 200 and the piezoelectric element 300.

In ejecting the functional liquid droplets from the liquid droplet ejection head 1 shown in FIG. 3, the un-shown external functional liquid supply device connected to the functional liquid introduction aperture 25 is driven by an external controller (omitted from the drawing) connected to the liquid droplet ejection head 1. The functional liquid sent from the external functional liquid supply device, after being supplied to the reservoir 100 through the functional liquid introduction aperture 25, realizes an internal flow circuit of the liquid droplet ejection head 1 which reaches the nozzle aperture 15.

Furthermore, the external controller sends a drive power or instruction signal to the semiconductor element 200 mounted on the reservoir forming substrate 20. The semiconductor element 200 receiving the instruction signal or the like transmits the drive signal to each piezoelectric element 300 based on the directive from the external controller.

Then, an electric voltage is applied between the respective lower electrode film 60 and the upper electrode film 80 corresponding to the pressurizing chamber 12, as a result of which an electric potential is produced in the flexible film 50, the lower electrode film 60 and the piezoelectric film 70, and by changing the capacity of each pressurizing chamber 12 by means of displacement, the internal pressure is increased, and liquid droplets are expelled from the nozzle aperture 15.

Figure 5:
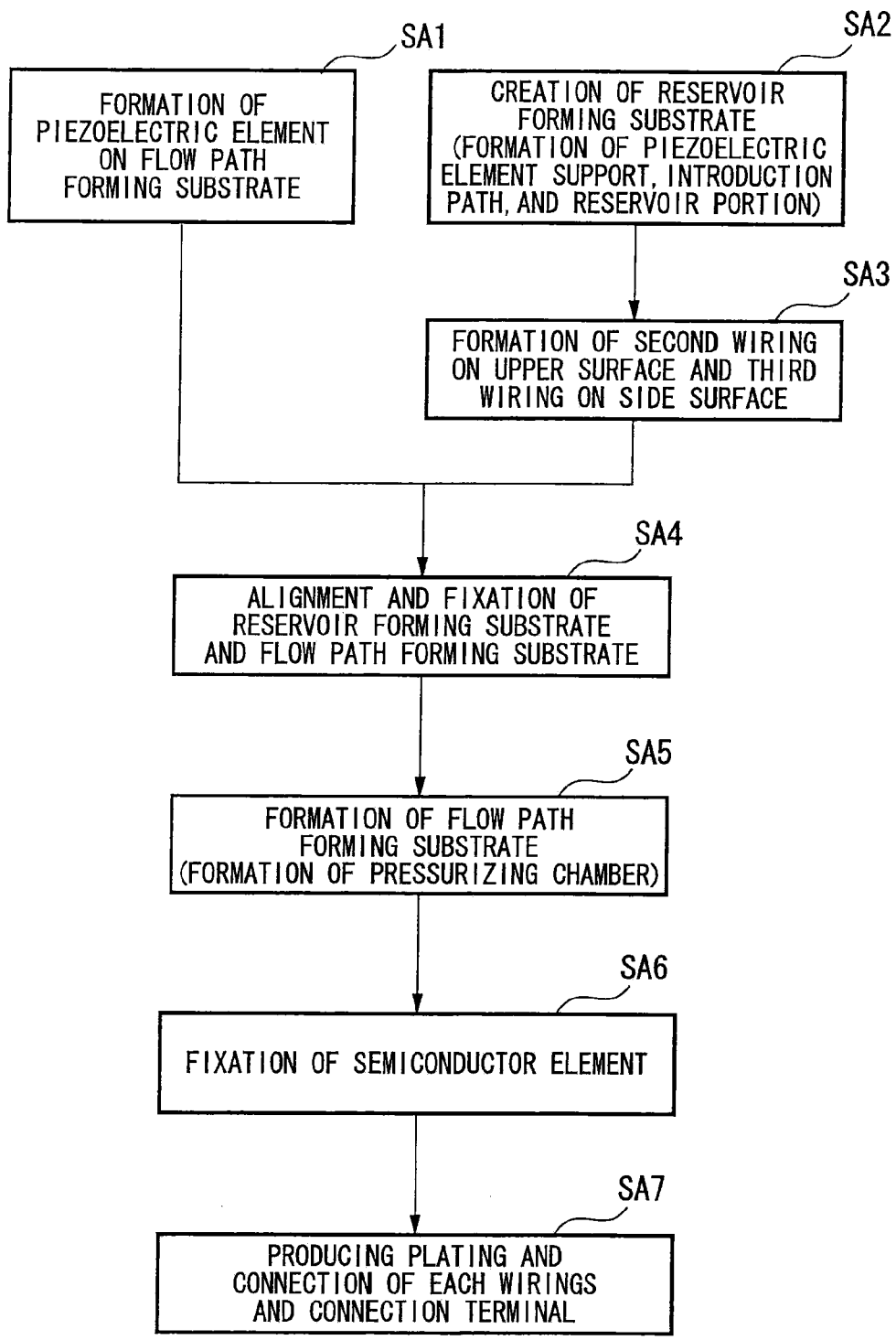
FIG. 5 is a flowchart diagram showing the manufacturing method of a liquid droplet ejection head.

An explanation of the method of manufacture of the liquid droplet ejection head is provided hereafter, with reference to the flowchart diagram of FIG. 5 and the cross-sectional process diagrams of FIGS. 6A to 6E.

First of all, an explanation is provided of an outline of the construction process of the liquid droplet ejection head, with reference to FIGS. 5 and 3.

In constructing the liquid droplet ejection head, a laminated layer is formed of the flexible film 50 and lower electrode film 60 on the flow path forming substrate 10 prior to the etching process shown in FIG. 3. Next, by forming a pattern of the piezoelectric film 70 and the upper electrode film 80 on the lower electrode film 60, a piezoelectric element 300 is formed (in step SA1).

Furthermore, in parallel with step SA1, by executing anisotropic etching on the silicon single crystal substrate, the reservoir forming substrate 20 is created (in step SA2) which is provided with the groove 20a or the piezoelectric element support 24, the introduction path 26, and a reservoir portion 21 and the like. Next, a pattern is formed (in step SA3) of the third wiring 35 on the side surface, by forming the second wiring 34 on the surface of the reservoir forming substrate 20.

Next, in a position covering the piezoelectric element 300 on a flow path forming substrate which has passed step SA1, positional alignment is accomplished on the reservoir forming substrate 20 which has passed Step SA3, and fixing is accomplished (in step SA4). Subsequently, by executing anisotropic etching on the flow path forming substrate formed from the silicon single crystal substrate, the pressurizing chamber 12 or supply path 14 shown in FIG. 3, and the coupling pare 13 are formed (in step SA5). Next, the semiconductor element 200 on the upper surface of the reservoir forming substrate 20 is secured (in step SA6).

Plating is provided in the first through third wiring and the connection terminal of the semiconductor element, thereby establishing (in step SA7), a conductive connection between the semiconductor element 200 and the piezoelectric element 300.

A detailed explanation concerning the manufacturing process of the reservoir forming substrate 20 and the mounting process of the semiconductor element is provided hereafter, with reference to FIGS. 6A to 6E, which are diagrams corresponding to the summary cross-sectional structure along the line A-A of FIG. 1.

As shown in FIG. 6A, the center of the surface (+Z side surface) of a silicon single crystal substrate 920 is removed by etching, thereby forming the groove 20a. Specifically, initially the surface of the silicon single crystal substrate 920 is heat oxidized to form a silicon oxide film. Next, a resist is coated on the surface of the silicon single crystal substrate 920, forming the aperture of the resistance on the part in which the groove 20a is to be formed by photolithography. The resist aperture is then processed with fluoric acid, forming a silicon oxide film aperture. Still further, the silicon single crystal substrate 920 is immersed in an aqueous solution of potassium hydrate (KOH) in a 35 percent weight volume, and anisotropic etching is accomplished on the silicon single crystal substrate 920 exposed from the aperture of the silicon oxide film. Since the silicon oxide film functions as an etching stopper, penetration by the etching of the silicon single crystal substrate 920 is suspended. After the completion of etching, the surface of the silicon single crystal substrate 920 is again heat oxidized, forming a silicon oxide film. In the same manner, the reservoir portion 21 and piezoelectric element support 24 are formed by etching.

Next, as shown in FIG. 6B, the second wiring 34 is formed on the upper surface of the silicon single crystal substrate 920, and the third wiring 35 is formed on the side surface 20b of the groove 20a. Specifically, first of all coating is accomplished on the surface of the silicon single crystal substrate 920, by means of a method in which the liquid state of the resin material mixed with a catalyst is spin coated or spray coated. Next, the resin material is exposed through a mask on which has been drawn the pattern of the second wiring 34 and the third wiring 35, and developed, thereby patterning the second wiring 34 and the third wiring 35 on the surface of the silicon single crystal substrate 920.

In composing the second wiring 34 and the third wiring 35 with metallic material, a metallic film is formed by means of sputtering, patterning being accomplished by means of etching through the resist mask. By a sputtering method or inkjet method through the Si mask, the second wiring 34 may be directly partitioned, thereby forming a reservoir forming substrate 20.

Next, as shown in FIG. 6C, the reservoir forming substrate 20 is positionally aligned and fixed in a position which covers the piezoelectric element 300 on the flow path forming substrate 10 prior to etching processing. The first wiring 36 of the piezoelectric element 300 extending to the center on the flow path forming substrate 10, in order to achieve exposure through the groove 20a formed in the center of the reservoir forming substrate 20, is pre-arranged on both substrates in patterning. By executing anisotropic etching on the flow path forming substrate 10 formed from the silicon single crystal substrate, a pressurizing chamber 12 is created. Subsequently, a compliance substrate 30 is connected to the reservoir forming substrate 20, and a nozzle substrate 16 is connected to the flow path forming substrate 10.

Next, as shown in FIG. 6D, the semiconductor element 200 is attached to the upper surface of the reservoir forming substrate 20. Specifically, first of all an adhesive 42 formed from a thermoplastic resin material is coated on the lower surface center of the semiconductor element 200. Next, the connection terminal 44 of the semiconductor element 200 is positionally aligned with the second wiring 34 of the reservoir forming substrate 20, and the semiconductor element 200 is heated and pressure is applied relative to the reservoir forming substrate 20. Here, by adjusting the amount of coating of the adhesive or the amount of heat/pressure applied when adhering, the gap between the connection terminal 44 and the second wiring 34 can be set to approximately several μm-10 μm. Subsequently, the adhesive 42 is hardened by cooling the entire body, and the semiconductor element 200 becomes fixed on the upper surface of the reservoir forming substrate 20. After adhering the semiconductor element 200 to the reservoir forming substrate 20, the reservoir forming substrate 20 may be fixed to the flow path forming substrate 10.

Next, as shown in FIG. 6E, plating 46 is provided on the surface of the first wiring 36, the third wiring 35, the second wiring 34 and the connection terminal 44. Specifically, non-electrolytic plating is executed by means of the following process.

First of all, with the objective of improving the wettability of the surface of each wiring and connection terminal, and the removal of residue, submersion is accomplished for 1-5 minutes in an aqueous solution which includes fluoric acid in an amount of 0.01-0.1 percent, and sulfuric acid in an amount of 0.01-1 percent. Or, immersion may be accomplished for from 1 to 10 minutes in a 0.1-10 percent aqueous solution of an alkali base such as sodium hydroxide.

Next, the surface oxide film is removed by immersion for from one second to 5 minutes in an alkali solution having a pH of 9-13 and which has been heated to 20-60° C., with a sodium hydroxide base. Immersion may also be accomplished for from one second to 5 minutes in an acidic aqueous solution having a pH of from 1-3 and which has been heated to 20-60° C. using 5-30 percent nitric acid as the base.

Next, immersion is accomplished for from one second to two minutes in a zincate liquid solution having a pH of from 11-13 and which has inclusions of ZnO, and Zn is substituted on the surface of each wiring and connection terminal. Next, immersion is accomplished in a nitric acid solution of from 5-30 percent for from 1-60 seconds, and the Zn is removed. Once again immersion is accomplished for from one second to two minutes in a zincate solution, and minute particles of Zn are provided on the surface of each wiring and connection terminal.

Next, Ni plating is provided by immersion in a non-electrolytic Ni plating solution. Such plating is provided until a high level is reached of approximately 2-30 μm. Furthermore, the plating solution is a solution in which hypo phosphoric acid is used as the reduction agent, with a pH of 4-5, and a solution temperature of 80-95° C. Phosphorus is provided owing to the hypo phosphoric acid solution.

Furthermore, the Ni surface may be substituted with Au by immersion in a substitute Au plating solution. The Au is formed to a thickness of approximately 0.05 μm-0.3 μm. Furthermore, as the Au solution, use may be made of a cyan free type, with a pH of 6-8, and a solution temperature of 50-80° C., immersion being accomplished for from 1 to 30 minutes.

In this manner, Ni or Ni—Au plating is provided on the surface of each wiring and connection terminal. Furthermore, execution may be accomplished of a thickness of Au plating on the Ni—Au wiring. Even if each of the wirings including the subterranean plating is thin, the electrical resistance can be reduced by applying a plating thickness.

Aqueous washing processing is performed between each chemical process. For the washing use is made of an overflow structure, or a QDR mechanism. $N_2$ bubbling is accomplished from the lowermost surface. The bubbling method is a method in which $N_2$ is passed out through openings in a resin tube or the like or through a sinter combined body. By this means, an adequate rinse can be accomplished in a short period of time.

By means of this process, as shown in FIG. 4, plating 44a is provided on the surface of the semiconductor element 200 and the connection terminal 44. Until the plating 44a and the plating 34a are mutually combined, by growing both platings, the connection terminal 44 and the second wiring 34 are electrically connected. In the same manner, until the plating 35a provided on the surface of the third wiring 35 and the plating 36a provided on the surface of the first wiring 36 shown in FIG. 3 are combined, by growing both platings, the third wiring 35 and the first wiring 36 are electrically connected. By this means, the semiconductor element 200 and the piezoelectric element 300 are electrically connected.

By means of the above, the liquid droplet ejection head of the present embodiment is formed.

As explained above, the liquid droplet ejection head 1 of the present embodiment is constructed so that the first wiring 36 conductively connected to the piezoelectric element 300 formed on the upper surface of the flow path forming substrate 10 and, and the second wiring 34 formed on the upper surface of the reservoir forming substrate 20, and the third wiring 35 formed on the side surface of the reservoir forming substrate 20 and the connection terminal 44 of the semiconductor element 200 are conductively connected by means of the plating 46 provided on the surface of each wiring 34-36 and the connection terminal 44.

According to such a construction, as in the case of connecting the semiconductor element 200 and the first wiring 36 by means of wire bonding, there is no need to provide a wire guide space. Therefore, in addition to establishing a narrow pitch for the nozzle aperture 15, even if the first wiring 36 is made to have a narrow pitch, an electrical connection with the first wiring 36 can be assured, enabling mounting of the semiconductor element 200. In other cases as well, in comparison with mounting by means of conventional wire bonding, mounting is possible which has a short TAT, low-cost, and high yield.

Furthermore, even if there is positional slippage or a gap between the connection terminal 44 and the wiring 36 or mutually between the wiring, an electrical connection can be assured by provided plating. Furthermore, mounting of the semiconductor element 200 and the electrical connection of each wiring can be simultaneously executed, simplifying the manufacturing process.

Furthermore, since the liquid droplet ejection head 1 is such that the reservoir forming substrate 20 side surface 20b is an inclined surface, the third wiring 35 can be easily formed. Furthermore, the semiconductor element 200 and the piezoelectric element 300 can be positively electrically connected.

Furthermore, according to the liquid droplet ejection head 1 of the present embodiment, it is possible for the nozzle aperture 15 to be given a narrow pitch, and if the device is constructed using the applied liquid droplet ejection head 1, high fine precision and minuteness can be realized.

Furthermore, according to the mounting structure of the present embodiment, since a positive electrical connection can be achieved between the step difference lower part of the wiring 36 and the step difference upper part of the semiconductor element 200, mounting is possible not only of the liquid droplet ejection head, but also through step differences in other devices as well, and broad application can be made relative to electronic equipment or transport devices or printing devices and the like.

Second Embodiment

An explanation of the second embodiment of the liquid droplet ejection head is provided hereafter, with reference to FIG. 7.

FIG. 7 is an explanatory diagram of the mounting structure according to the second embodiment, and is an enlarged view of part C of FIG. 8B. As shown in FIG. 7, in the liquid droplet ejection head according to the second embodiment, in addition to the fact that the second wiring 34 extends to a position facing the connection terminal 44 of the semiconductor element 200, there is the point that an electrically conductive protrusion 45 is protrudingly formed facing the second wiring 34, in which regard it differs from the first embodiment. A detailed explanation concerning construction parts which are the same as in the first embodiment is omitted.

In the second embodiment, the second wiring 34 formed on the upper surface of the reservoir forming substrate 20 extends to a position facing the connection terminal 44 of the semiconductor element 200. Furthermore, on the surface of the connection terminal 44 the conductive protrusion (bump) 45 is protrudingly formed facing the second wiring 34. The conductive protrusion 45 is formed to a height thickness of from several μm-10 μm by means of a metallic material such as Al or Ni—Cr, Cu, Ni, Au or Ag and the like. The plating 46 is provided so as to cover the second wiring 34 and protrusion 45.

Next, an explanation is provided of the construction method of the liquid droplet ejection head according to the second embodiment, with reference to the cross-sectional process diagrams in FIGS. 8A and 8B. From the reservoir forming substrate 20 forming process to the fixing process of the flow path forming substrate, the process is the same as the first embodiment, as shown in FIGS. 6A to 6C.

As shown in FIG. 8A, the semiconductor element 200 is pressured to the reservoir forming substrate, and is adhered by the adhesive 42. Owing to aberrations in the height of the protrusion 45, a slight gap may also be formed between the front end of the protrusion 45 and the second wiring 34.

Next, as shown in FIG. 8B, the plating 46 is provided on the surface of each wiring and the protrusion 45. Specifically, non-electrolytic plating is executed by the same process as that of the first embodiment. In this instance, since the front end of the protrusion 45 is connected to the second wiring 34, plating can be positively provided on the surface of both. This would be the same, even if there is a slight gap between the front end of the protrusion 45 and the second wiring 34. By this means, a positive electrical connection can be established between the connection terminal and the second wiring 34.

As indicated above, in the second embodiment, in addition to the second wiring 34 extending to a position facing the connection terminal 44 of the semiconductor element 200, an conductive protrusion 45 is constructed so as to be protrudingly formed on the connection terminal 44 facing the second wiring 34. Furthermore, in connecting the front end of the protrusion 45 to the second wiring 34, the structure educes the plating 46 on the surface of both.

According to such a structure, it is possible to positively electrically connect the semiconductor element 200 connection terminal 44 to the second wiring 34, enabling improved reliability of the electrical connection.

Furthermore, mounting can be accomplished in which the amount of plating when electrical connection can be completed is small amount, with short TAT, at low-cost, and with high yield. Furthermore, in the case of applying a plating thickness, since plating is also grown in the lateral direction of the wiring, making the wiring to have a narrow pitch is difficult; relative to which, in the second embodiment, since the amount of plating used when electrical connection is small, narrow pitching of the wiring and narrow pitching of the nozzle aperture 15 of the liquid droplet ejection head 1 can be easily accomplished.

In the case of structuring the second wiring 34 with a photosensitive resin mixed with a catalyst, since the second wiring 34 is flexible, breakage caused by contact with the protrusion 45 can be prevented. Furthermore, in the state in which initial pressure is applied to the second wiring 34 by the protrusion 45, it becomes possible for the semiconductor element 200 to become fixed to the reservoir forming substrate 20, with improved reliability of the electrical connection.

Third Embodiment

Figure 10:
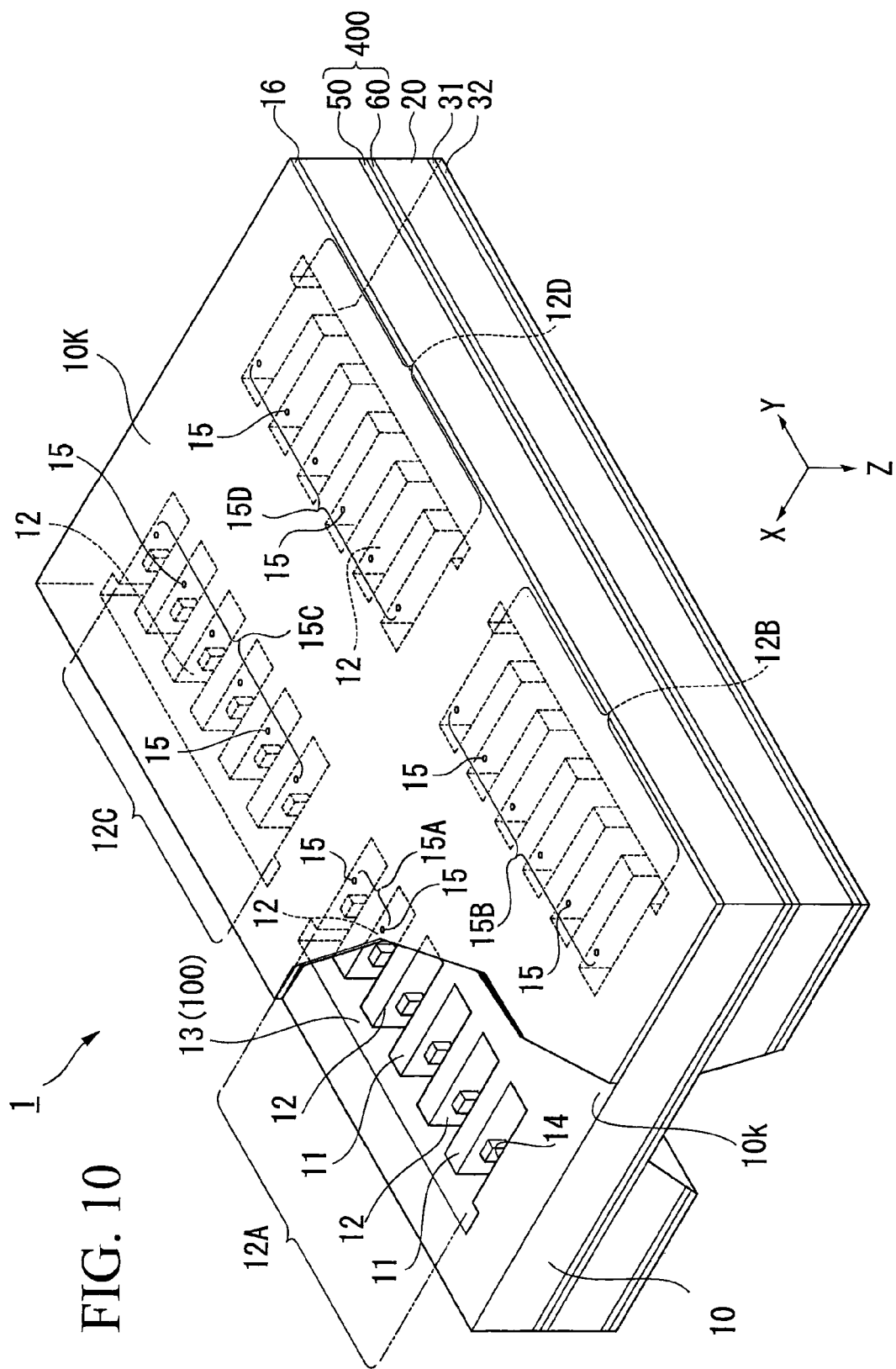
FIG. 10 is a perspective view showing the liquid droplet ejection head from the lower side.
Figure 11:
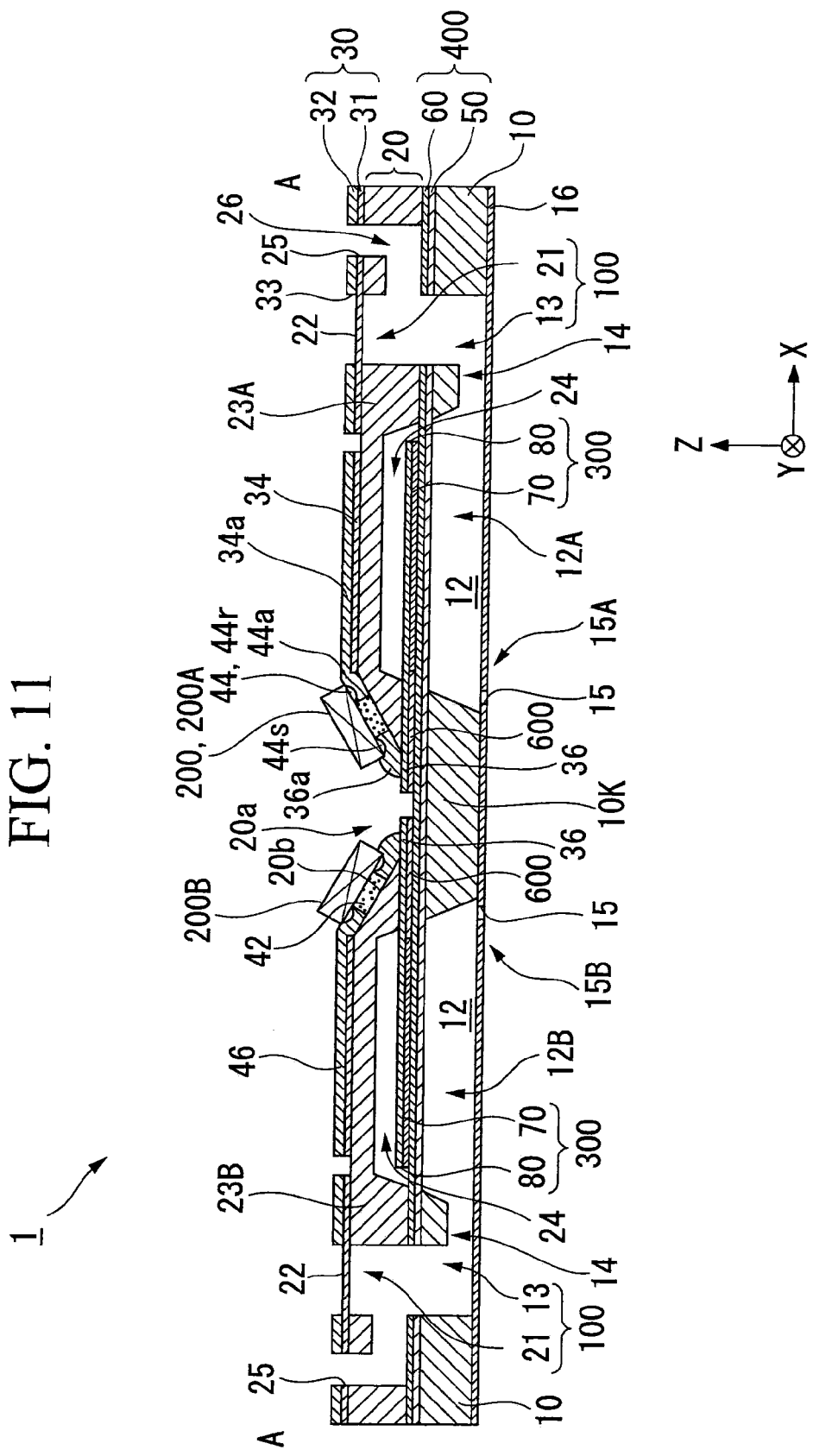
FIG. 11 is a cross-sectional view along the line A-A of FIG. 9.

An explanation is provided concerning the third embodiment of the liquid droplet ejection head of the present invention, with reference to FIGS. 9 to 11. FIG. 9 is a perspective view showing the third Embodiment of the liquid droplet ejection head, and FIG. 10 is a partially broken diagram of the oblique construction diagram in which the liquid droplet ejection head is viewed from below, and FIG. 11 is a cross-sectional diagram along the line A-A of FIG. 9.

As shown in FIG. 11, the liquid droplet ejection head 1 of the present embodiment emits functional liquid in liquid droplet form from the nozzle. The liquid droplet ejection head 1 is provided with a pressurizing chamber 12 which is coupled to the nozzle aperture 15 from which the liquid droplets are ejected, and the piezoelectric element (driven element) 300 which produces pressure changes in the pressurizing chamber 12 arranged on the upper surface of the pressurizing chamber 12, and the reservoir forming substrate (protected substrate) 20 which covers the piezoelectric element 300 is arranged on the upper surface of the pressurizing chamber 12, and a semiconductor element 200 which drives the piezoelectric element 300 is arranged on the side surface 20b of the reservoir forming substrate 20. Moreover, the operation of the liquid droplet ejection head 1 is controlled by an external controller, not shown in the diagram, and which is connected to the semiconductor element 200.

As shown in FIG. 10, to the lower side (−Z side) of the liquid droplet ejection head 1 is attached the nozzle substrate 16. On the nozzle substrate 16 are provided the multiple nozzle apertures 15 which eject liquid droplets, arranged in the Y axis-direction. In this embodiment, the nozzle apertures 15, of the group arranged in multiple regions on the nozzle substrate 16, respectively includes a first nozzle aperture group 15A, a second nozzle aperture group 15B the third nozzle aperture group 15C and the fourth nozzle aperture group 15D.

The first nozzle aperture group 15A and the second nozzle aperture group 15B are arranged in a row in the X-axis direction. The third nozzle aperture group 15C is provided on the +Y side of the first nozzle aperture group 15A, and the fourth nozzle aperture group 15D is provided on the +Y side of the second nozzle aperture group 15B. The third nozzle aperture group 15C and the fourth nozzle aperture group 15D are arranged in a row in the X-axis direction.

In FIG. 10 is shown a construction accomplished by means of 6 nozzle apertures 15 respectively including each of the nozzle aperture groups 15A-15D. However, in actuality, each nozzle aperture group is composed of a nozzle aperture 15 including 720 units.

In the upper side (+Z side) of the nozzle substrate 16 is arranged the flow path forming substrate 10. The nozzle substrate 16 and the lower surface of the flow path forming substrate 10 are fixed, for example, through an adhesive or thermal deposition material, or a film or the like. The flow path forming substrate 10 can be structured with silicon, glass or a ceramic material or the like, and in the present embodiment is formed by silicon. The inside of the flow path forming substrate 10 has multiple partition walls 11 which extend in the X direction from the center. The partition walls 11 are formed such that the silicon single crystal substrate including the welded base metal of the flow path forming substrate 10 is partially removed by anisotropic etching. By means of the partition walls 11, in the flow path forming substrate 10, aperture regions have a comb-shape. From among these aperture regions, parts formed extending in the X-axis direction compose the pressurizing chamber 12 encompassed by the nozzle substrate 16 and an oscillation plate 400. The pressurizing chamber 12 houses the functional liquid, which is ejected from the nozzle aperture 15 by means of pressure applied when operating the liquid droplet ejection head 1.

Each pressurizing chamber 12 is provided corresponding to the multiple nozzle apertures 15. In other words, the pressurizing chamber 12 is provided with multiple rows in the Y-axis direction so as to correspond to the multiple nozzle apertures 15 which respectively compose the first-fourth nozzle aperture groups 15A-15D. The multiply formed pressurizing chambers 12 corresponding to the first nozzle aperture group 15A compose the first pressurizing chamber group 12A, and the multiply formed pressurizing chambers 12 corresponding to the second nozzle aperture group 15B compose the second pressurizing chamber group 12B. The multiply formed pressurizing chambers 12 corresponding to the third nozzle aperture group 15C compose the third pressurizing chamber group 12C. The multiply formed pressurizing chambers 12 corresponding to the fourth nozzle aperture group 15D compose the fourth pressurizing chamber group 12D. The first pressurizing chamber group 12A and the second pressurizing chamber group 12B are arranged in a row in the X-axis direction. Between these are formed partition walls 10K extending in the Y-axis direction. In the same manner, the third pressurizing chamber group 12C and the fourth pressurizing chamber group 12D are arranged in a row in the X-axis direction, between which are the formed partition walls 10K extending in the Y-axis direction.

Furthermore, among the aperture regions having a comb-shape formed in the flow path forming substrate 10, the part formed to extend in the Y direction shown in the drawing composes the reservoir 100. The end of the substrate outside border side (+X side) in the multiple pressurizing chambers 12 forming the first pressurizing chamber group 12A is connected to the reservoir 100. The reservoir 100 supports in reserve the functional liquid supplied to the pressurizing chamber 12 becoming the joint functional liquid maintenance chamber (ink chamber) of the multiple pressurizing chambers 12 composing the first pressurizing chamber group 12A. To the respective second, third, and fourth pressurizing chamber groups 12B, 12C, and 12D is also connected the reservoir 100, in the same manner, and composes temporary storage for the functional liquid supplied to the respective pressurizing chamber groups 12B-12D.

As shown in FIG. 11, the reservoir 100 is composed from the reservoir portion 21 formed in the reservoir forming substrate 20, and a coupler 13 formed in the flow path forming substrate 10. The coupler 13 has the function of connecting the reservoir portion 21 to each of the respective pressurizing chambers 12. To the outside (the side of the flow path forming substrate 10) of the reservoir forming substrate 20 is connected the compliance substrate 30 which has a construction laminating the sealing film 31 and the fixed plate 32. In the compliance substrate 30, the internally arranged sealing film 31 is formed from a material having low elasticity (for example a polyphenylene sulfide film of a thickness of approximately 6 μm). On the other hand, the fixed plate 32 arranged on the outside is formed from a hard metallic material (for example stainless steel having a thickness of approximately 30 μm). In the fixed plate is formed an aperture 33 formed from a cut out of the plane surface region corresponding to the reservoir 100. By this means, the upper part of the reservoir 100 is sealed by only the elastic sealing film 31, and becomes an elastic unit 22, deformable through changes in internal pressure. Furthermore, in the compliance substrate 30 is formed the functional liquid introduction aperture 25 through which to functional liquid is supplied to the reservoir 100. The reservoir forming substrate 20 is provided with an introductory path 26 which couples the functional liquid introductory path 25 and the reservoir 100.

The functional liquid introduced from the functional liquid introduction path 25 flows into the reservoir 100 through the introductory path 26, and is supplied to the respective multiple pressurizing chambers 12 composing the first pressurizing chamber group 12A through the supply path 14. Through heat on the periphery, or the flow of the functional liquid when driving the piezoelectric element 300, there is a concern that pressure changes will occur within the reservoir 100. However, since the elastic part 22 of the reservoir 100 is deflected and deformed, since the pressure changes are absorbed, the inside of the reservoir 100 is ordinarily maintained at a fixed pressure.

On the surface side (+Z side) of the flow path forming substrate 10 is arranged an oscillation plate 400. The oscillation plate 400 has a construction which successively laminates the flexible film 50 and the lower electrode film 60 from the flow path forming substrate 10. The flexible film 50 arranged on the flow path forming substrate 10 side is formed from a silicon oxide film have a thickness, for example, of 1-2 μm, and the lower electrode film 60 is formed from metallic film having a thickness of, for example, 0.2 μm. In the present embodiment, the lower electrode film 60 functions as a joint electrode with multiple piezoelectric elements 300 arranged between the flow path forming substrate 10 and the reservoir forming substrate 20.

On the upper surface side (+Z side) of the oscillation plate 400 is arranged the piezoelectric element 300 for deforming the oscillation plate 400. The piezoelectric element 300 has a construction which laminates, chronologically from the lower electrode film 60 side, the piezoelectric body film 70 and the upper electrode film 80. The piezoelectric body film 70 is formed, for example, from a PZT film having a thickness of approximately 1 μm. The upper electrode film 80 is formed, for example, from a metallic film having a thickness of approximately 0.1 μm.

The piezoelectric element 300, in addition to the piezoelectric body film 70 and the upper electrode film 80, may also include the lower electrode film 60. Whereas, the lower electrode film 60 functions as the piezoelectric element 300, it may also function as the oscillation plate 400. With the present embodiment, a structure is adopted in which the flexible film 50 and the lower electrode film 60 function as the oscillation plate 400. However, by eliminating the flexible film 50, the lower electrode film 60 may also be made to function jointly as the flexible film 50.

The piezoelectric elements 300 (piezoelectric body film 70 and the upper electrode film 80) are multiply provided corresponding to multiple nozzle apertures 15 and pressurizing chambers 12. In the present embodiment, conveniently, the first piezoelectric element 300 group provided in multiple rows in the Y axis direction so as to effectively correspond to the nozzle apertures 15 composing the first nozzle aperture group 15A is called the first piezoelectric element group, and the first piezoelectric element 300 provided in multiple rows in the Y-direction respectively corresponding to the nozzle apertures 15 composing the second nozzle aperture group 15B is called the second piezoelectric element group. Furthermore, the piezoelectric element group corresponding to the third nozzle aperture group is called the third piezoelectric element group, and the first piezoelectric element group corresponding to the fourth nozzle aperture is called the fourth piezoelectric element group, the first piezoelectric element group and the second piezoelectric element group being arranged in a row in the X-axis direction, and the third piezoelectric element group and the fourth piezoelectric element being arranged in rows in the X-axis direction.

The reservoir forming substrate (protective substrate) 20 is arranged on the upper surface side (+Z side) of the flow path forming substrate 10 so as to cover the piezoelectric element 300. Since the reservoir forming substrate 20, along with the flow path forming substrate 10, is a member that forms a part of the liquid droplet ejection head 1, as a structural member, it is desirable for use to be made of a rigid material that has roughly the same thermal expansion ratio as the flow path forming substrate 10. In the case of the present embodiment, since the flow path forming substrate 10 is formed from silicon, optimal use should be made of a silicon single crystal substrate of the same material. Since the silicon substrate can easily execute precision processing by means of anisotropic etching, the piezoelectric element support 24 described hereafter has the advantage of being easily formed. In the same manner as with the flow path forming substrate 10, it may also be composed of a reservoir forming substrate 20 which uses glass or ceramic material or the like.

The reservoir forming substrate 20 is provided with the seal 23 which tightly seals the piezoelectric element 300. In the case of the present embodiment, the part which seals the first piezoelectric element group is called the first seal 23A, and the part which seals the second piezoelectric element group is called the second seal 23B. In the same manner, the part which seals the third piezoelectric element group is called the third seal, and the part which seals the fourth piezoelectric element group is called the fourth seal. The seal 23 is provided with a piezoelectric element support (element support) 24 formed from the indentation of the plane surface visually abbreviated rectangular shape extending in the direction vertical from the paper surface of FIG. 11. The piezoelectric element support 24, in addition to assuring space so that movement of the piezoelectric element 300 in the periphery of the piezoelectric element 300 is not obstructed, has the function of tightly sealing the space. The piezoelectric element 70 support 24 has measurements which enable sealing of at least the piezoelectric film from among the piezoelectric elements 300. Furthermore, the piezoelectric element support 24 may also be partitioned for each of multiple piezoelectric elements 300.

In this manner, the reservoir forming substrate 20 functions as a protective substrate which shields the piezoelectric element 300 from the outside environment. By sealing the piezoelectric element 300 by means of the reservoir forming substrate 20, characteristic deterioration and the like of the piezoelectric element 300 caused by external aqueous components and the like can be prevented. Furthermore, in the current embodiment, the inside of the piezoelectric element support 24 is made to only be in a sealed state. However, by creating a vacuum, or an environment of nitrogen or argon or the like, the inside of the piezoelectric element support 24 can be maintained at low humidity, by which structural deterioration of the piezoelectric element 300 can be effectively prevented.

In the reservoir forming substrate 20, the groove 20a is provided between the first seal 23A and the second seal 23B, which penetrates the reservoir forming substrate 20. Through the groove 20a, the upper surface of the flow path forming substrate is exposed to the outside. Making the upper surface of the exposed flow path forming substrate to be a lower step surface, the upper surface of the seal 23 of the reservoir forming substrate 20 can be made to be an upper step surface, thereby composing a stepped body.

The side surface 20b of the groove 20a of the reservoir forming substrate 20 which combines the upper surface of the seal 23 of the reservoir substrate 20 and the upper surface of the flow path forming substrate 10 is an inclined surface. In particular, the reservoir forming substrate 20 is composed of a silicon substrate having a <1, 0, 0> orientation, and if the silicon substrate is subjected to wet etching with an alkali solution of KOH and the like, then an inclined surface of approximately 54° can be made of the side surface 20b of the groove 20a through differences in the etching rate in each surface direction.

Among the piezoelectric elements 300 sealed by the piezoelectric element support 24 of the reservoir forming substrate 20, the end of the-X side of the upper electrode film 80 is extended to the upper surface of the exposed flow path forming substrate 10, thereby composing the first wiring 36. The first wiring 36 is composed of a metallic material of Al or Ni—Cr, Cu, Ni, Au, and Ag and the like. However, it is also possible for it to be composed of a photosensitive resin material mixed with a catalyst, as with the second wiring 34 described hereafter. When the lower electrode film 60 is arranged in an abbreviated beta state on the flow path forming substrate 10, the insulation film 600 for preventing short-circuiting between the two is arranged between the upper electrode film 80 which extends to the outside of the piezoelectric elements support 24 and the lower electrode film 60. Furthermore, the upper electrode film 80, in lieu of being extended in its existent state may also form electrode wiring electrically connected to the upper electrode 80 on the flow path forming substrate 10, with the electrode wiring being drawn to the outside of the piezoelectric elements support 24, as the first wiring 36.

On the upper surface of the reservoir forming substrate 20, a second wiring 34 is formed in order to electrically connect the semiconductor element, described hereafter, to the external controller. The second wiring 34 is desirably constructed with a resin material mixed with a catalyst. Specifically, it is composed of a photosensitive resin material in which minute particles of Pd (Palladium) are dispersed. In this case, it is possible to form the second wiring 34 by means of photolithography. In other words, the resin material is coated on the upper surface and the side surface of the reservoir forming substrate 20, and patterning of the second wiring 34 is accomplished by means of exposure and development.

The second wiring 34 may also be the composed of a metallic material of Al, or Ni—Cr, Cu, Ni, Au, and Ag and the like. However, in patterning the metallic material it is necessary for the resist to be etched as a mask, complicating the manufacturing process. In this regard, if it is composed of a photosensitive resin substance mixed with a catalyst, it is possible for the second wiring 34 to be patterned by only means of photolithography, simplifying the manufacturing process.

On the side surface 20b of the groove 20a formed on the reservoir forming substrate 20, the semiconductor element 200 is arranged in a face down state. The semiconductor element 200 is constructed to include, for example, a circuit substrate or a semiconductor circuit (IC) which includes a drive circuit. The width of the semiconductor element 200 is formed to be equivalent to the height of the side surface 20b of the reservoir forming substrate 20. As shown in FIG. 9, in the present embodiment, four semiconductor elements 200A-200D are arranged to drive the first-fourth piezoelectric element groups.

In the center of the lower surface side (−Z side) of the semiconductor element 200 shown in FIG. 11b is arranged the adhesive 42 formed from a thermal elastic material composed of polyimide and the like. By heating the semiconductor element 200, and adding pressure to the reservoir forming substrate 20, the semiconductor element 200 will adhere to the side surface 20b of the reservoir forming substrate 20.

Furthermore, in the peripheral border of the lower surface side (−Z side) of the semiconductor element 200 are provided multiple connection elements 44. Each connection element 44 is composed of a metallic material of Al or Ni—Cr, Cu, Ni, Au, and Ag and the like. On the periphery of the-X side of the semiconductor element 200 A, the same number of connection elements 44 as in the first wiring 36 are arranged in a row with the same pitch as the first wiring 36, for use in accomplishing an electrical connection with a piezoelectric element 300. Furthermore, on the peripheral margin of the X side of the semiconductor element 200A the same number of connection elements 44 as in the second wiring 34 are arranged in a row at the same pitch as that of the second wiring 34, for use in accomplishing an electrical connection with an external controller. By adjusting the amount of the adhesive arranged on the bottom surface of the semiconductor element 200 and the amount of heat and pressure applied during adhesion, gaps are respectively formed of approximately several μm-10 μm between a connection terminal 44s and the first wiring 36, and between a connection element 44r and the second wiring 34.

In this manner, since there is a gap between the connection terminal 44s in the first wiring 36, in this state, there is no electrical connection between the semiconductor element 200 and the piezoelectric element 300. Therefore, the plating 46 is provided on the surface of each wiring and connection element. Specifically, the plating 36 is provided on the surface of the first wiring 36, a plating 34a is provided on the surface of the second wiring 34, and a plating 44a is provided on the surface of the connection terminals 44r, and 44s respectively. With the second wiring 34 composed of resin material mixed with a catalyst, the plating 34a is provided relative to the catalyst. These plating 46 are composed of a metallic material composed of Cu or Ni and Au and the like. The plating 46 may also be provided of different materials on the surface of each wiring and connection element.

Figure 12:
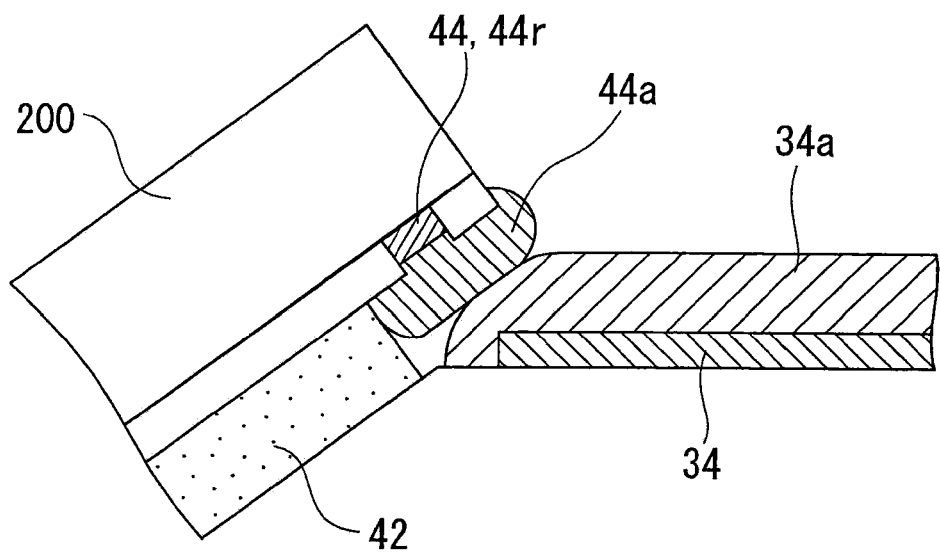
FIG. 12 is a partially enlarged view showing the mounting structure according to the third embodiment.
Figure 14A:
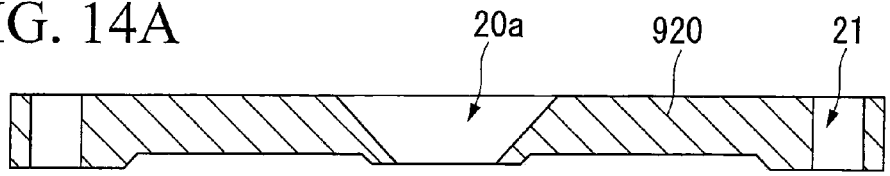
FIGS. 14A, 14B, 14C, 14D, and 14E are cross-sectional process diagrams showing the manufacturing method of the liquid droplet ejection head.
Figure 14B:
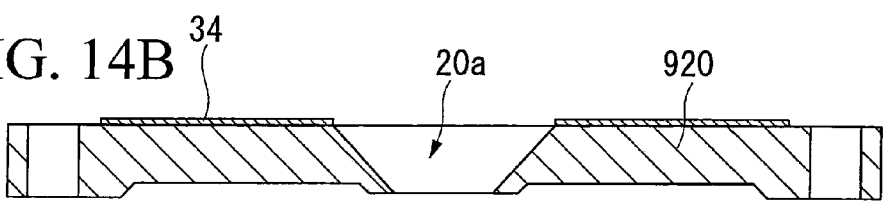
Figure 14C:
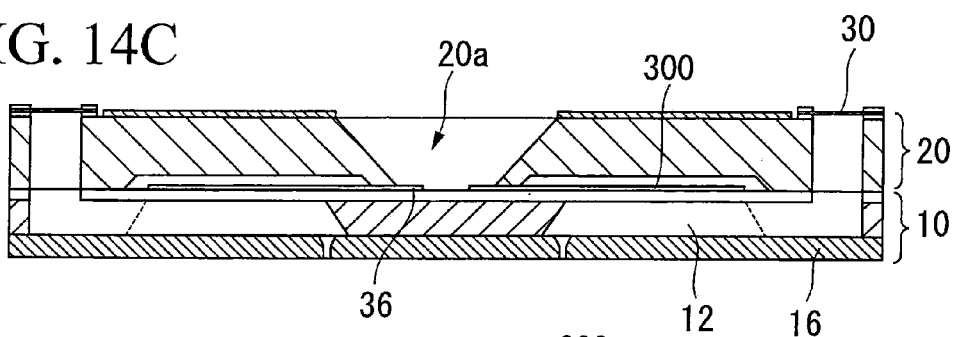
Figure 14D:
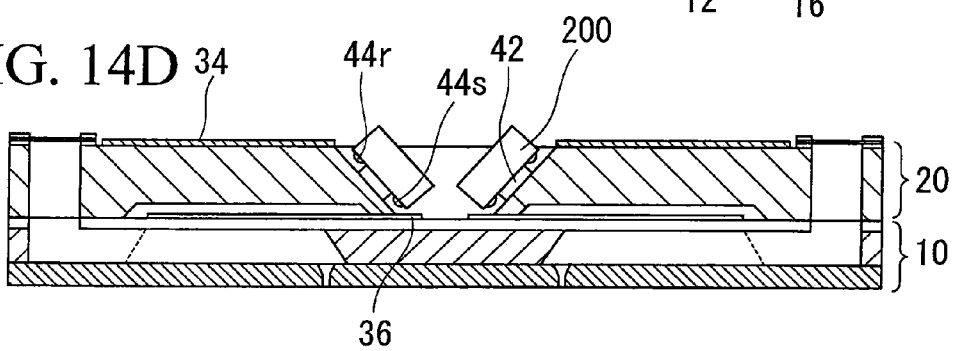
Figure 14E:
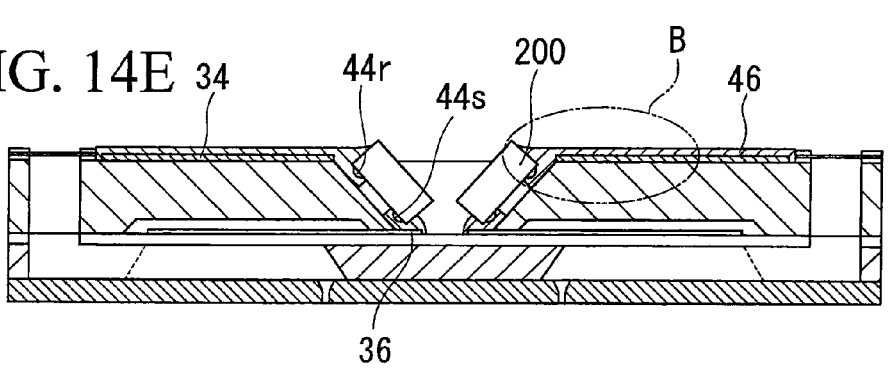

FIG. 12 is explanatory diagram of the mounting structure according to the present embodiment, and is an enlarged diagram of part B of FIG. 14E. As shown in FIG. 12, the plating 44a is provided on the surface of the connection element 44r of semiconductor element 200. The plating 34a is provided on the surface of the second wiring 34. The connection terminal 44 and the second wiring 34 are electrically connected by combining the grown plating 44a and 34a. In the same manner, the provided grown plating 44a on the surface of the connection terminal 44s of the semiconductor element 200 shown in FIG. 11 and the provided grown plating 36a on the surface of the first wiring 36 are combined, thereby electrically connecting the connection terminal 44s and the first wiring 36, by which the semiconductor element 200 is mounted, and the semiconductor element 200 and the piezoelectric element 300 are electrically connected.

By means of the liquid droplet ejection head 1 shown in FIG. 11, in ejecting the liquid droplets of the functional liquid, an un-shown external functional liquid supply device is driven, which is connected to the functional liquid introduction aperture 25 by means of an external controller (omitted from the drawing) connected to the liquid droplet ejection head 1. After supplying the functional liquid sent from the external functional liquid supply device to the reservoir 100 through the functional liquid introduction aperture 25, an internal flow path is achieved for the liquid droplet ejection head 1 which reaches the nozzle aperture 15.

Furthermore, the external controller sends driving power or an instruction signal to the semiconductor element 200 mounted on the reservoir forming substrate 20. The semiconductor element 200 which receives the instruction signal sends a drive signal to each piezoelectric element 300 based on the instructions from the external controller.

As a result of applying an electric voltage between the lower electrode filmed 60 and the upper electrode filmed 80 respectively corresponding to the pressurizing chamber 12, displacement is produced in the flexible film 50, the lower electrode film 60 and the piezoelectric body film 70, changing the capacity of each pressurizing chamber 12, increasing the internal pressure, and ejecting liquid droplets from the nozzle aperture 15.

Figure 13:
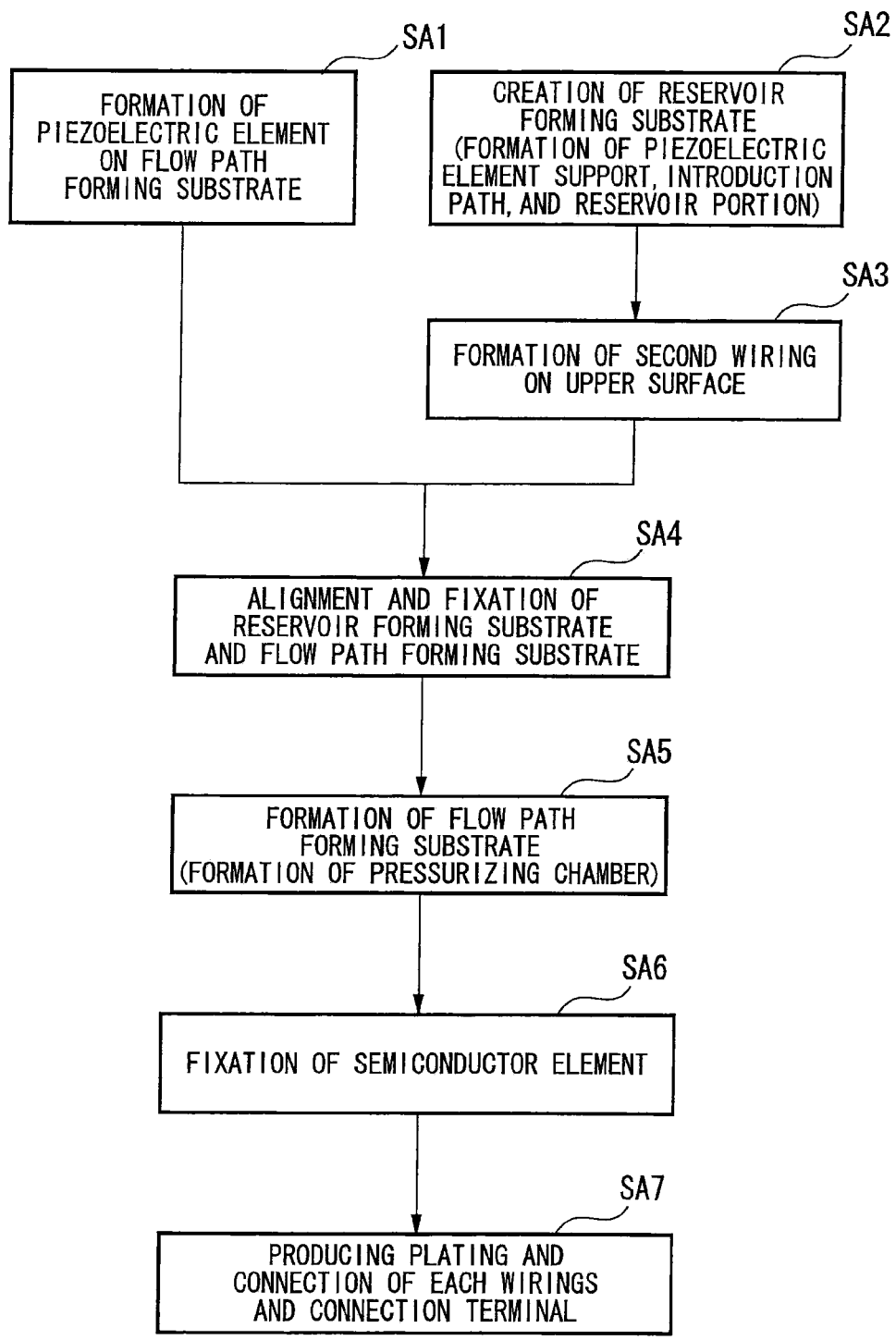
FIG. 13 is a flowchart showing the method of manufacture of the liquid droplet ejection head.

An explanation is provided of the method of manufacture of the liquid droplet ejection head hereafter, with reference to the flowchart diagram of FIG. 13 and the cross-sectional process diagrams 14A-14E.

First of all, an explanation is provided of an outline of the manufacturing process of the liquid droplet ejection head, with reference to FIG. 13 and FIG. 11.

In constructing the liquid droplet ejection head, a laminate is formed on the flow path forming substrate 10 composed of the flexible film 50 and the lower electrode film 60 prior to the etching process, shown in FIG. 11, and then, by the accomplishment of pattern formation of the piezoelectric body film 70 and the electrode film 80 on the lower electrode film 60, formation can be accomplished of the piezoelectric element 300 (in step SA1).

Furthermore, in parallel to step SA1, by executing anisotropic etching on the silicon single crystal substrate, a reservoir forming substrate 20 is created (in step SA2) which is provided with the groove 20a, the piezoelectric element support 24, the introduction path 26, and the reservoir portion 21 and the like. Next, the second wiring 34 is formed on the upper surface of the reservoir forming substrate 20.

Next in a position which covers the piezoelectric element 300 on the flow path forming substrate and which has passed step SA1, the reservoir forming substrate 20 which has passed step SA3 is positionally aligned and fixed (in step SA4). Subsequently, by executing anisotropic etching on the flow path forming substrate 10 formed from the silicon single crystal substrate, the pressurizing chamber 12, the supply path 14, and the coupler 13 and the like shown in FIG. 11 can be created (in step SA5). Subsequently, a semiconductor element 200 can be attached (in step SA6) to the side surface 20b of the groove 20a of the reservoir forming substrate 20. Next, plating is provided on the connection terminal 300 of the first and second wiring, and semiconductor element 200.

By means of the above process, a liquid droplet ejection head 1 can be constructed on which is mounted a semiconductor element 200.

Next, a detailed description is provided concerning the manufacturing process of the reservoir forming substrate 20 and the mounting process of the semiconductor element, with reference to FIGS. 14A to 14E. FIGS. 14A to 14E are diagrams which correspond to the abbreviated cross-sectional structure taken along the line A-A of FIG. 9.

As shown in FIG. 14A, the center of the upper surface (+Z side surface) of the silicon single crystal substrate 920 is removed by etching, forming the groove 20a. Specifically, first of all the silicon oxide film is formed by the thermal oxidation of the surface of the silicon single crystal substrate 920. Next, the resist on the surface of the silicon single crystal substrate 920 is coated, forming the aperture of a resist in the part of the groove 20a which should be formed. Next, the aperture of the resist is processed with fluoric acid, forming a silicon oxide film aperture on the part which should form the groove 20a. Then, the silicon single crystal substrate 920 is immersed in a solution of potassium hydroxide (KOH) having a percentage weight of 35 percent, and anisotropic etching is performed of the silicon single crystal substrate 920 exposed from the aperture of the silicon oxide film. Since the silicon oxide film functions as an etching stopper, the etching suspends the penetration of the silicon single crystal substrate 920. After the completion of etching, a silicon oxide film is formed by the reheated oxidation of the surface of the silicon single crystal substrate 920. In the same manner, the reservoir portion 21 and piezoelectric element support 24 are formed by etching.

Next, as shown in FIG. 14B, the second wiring 34 is formed on the upper surface of the silicon single crystal substrate 920. Specifically, first of all, the liquid state of the resin material mixed with a catalyst is coated by means of the spin coating method on the surface of the silicon single crystal substrate 920. Next, the resin material is exposed and developed through a mask in which the second wiring 34 is partitioned, patterning the second wiring 34 on the surface of the silicon single crystal substrate 920.

In the case of structuring the second wiring 34 with a metallic material, a metallic film formed by sputtering, and patterning is accomplished by means of etching through a resistant mask.

By means of a sputtering method accomplished through an Si mask, or the jet method, direct connect partitioning may be accomplished of the second wiring 34, thereby forming the reservoir forming substrate 20.

Next, as shown in FIG. 14C, in a position which covers the piezoelectric element 300 on the flow path for a substrate and prior to etching processing, the reservoir forming substrate 20 is positionally aligned and fixed. The first wiring 36 of the piezoelectric element 300 extending to the center on the flow path forming substrate 10, in order to accomplish exposure through the groove 20a within the center of the reservoir forming substrate 20, in pre-patterning the first wiring 36, arranges both substrates. Next, the pressurizing chamber 12 and the like is created by executing anisotropic etching on the flow path forming substrate 10 formed from the silicon single crystal substrate. Subsequently, the compliance substrate 30 is connected to the reservoir forming substrate 20, connecting the nozzle substrate 16 to the flow path forming substrate 10.

Next, as shown in FIG. 14D, the semiconductor element 200 is connected to the upper surface of the reservoir forming substrate 20. Specifically, first of all, the lower surface center of the semiconductor element 200 is coated with an adhesive 42 formed from a thermal elastic resin material. Next, the connection terminal 44s of the semiconductor element 200 is positionally aligned with the first wiring 36, and the connection terminal 44r is positionally aligned with the second wiring 34. The semiconductor element 200 is heated, and pressure is applied relative to the reservoir forming substrate 20. By adjusting the amount of coating or the amount of heat/pressure of the adhesive, the gap between the connection terminal 44s and the first wiring 36 and the gap between the connection terminal 44r and the second wiring 34 are respectively set to from several μm-10 μm. Subsequently, the entire body is cooled, and the adhesive 42 is hardened, adhering the semiconductor element 200 to the upper surface of the reservoir substrate 20. After adhering the semiconductor element 200 to the reservoir forming substrate 20, the reservoir forming substrate 20 may also be fixed to the flow path forming substrate 10.

Next, as shown in FIG. 14E, the plating 46 is provided on the surface of the first wiring 36, the second wiring 34, and the connection terminals 44r and 44s. Specifically, non-electrolytic plating is executed by means of the following processes.

With the objective of improving wettability of the surface of each wiring and connection terminal, and removing the residue, immersion is accomplished for from one to five minutes in a solution of 0.01-0.1 percent fluoric acid, and 0.01-1 percent sulfuric acid. Or, immersion may also be accomplished for from 1 to 10 minutes in an aqueous solution of an alkali base including 0.1-10 percent sodium hydroxide.

Next, the surface oxide film is removed by immersion for from one second to five minutes in an alkali aqueous solution heated to 20-60° C. with a pH of 9-13 with a sodium hydroxide base. Immersion may also be accomplished for from one second to five minutes in an acid solution heated to 20-60° C., and having a pH of 1-3 in which 5-30 percent nitric acid serves as the base.

Next, substituting Zn on the surface of each wiring and connection terminal is accomplished by immersion for from one second to two minutes in a zincate solution having a pH of 11-13, and inclusions of ZnO. Next, the Zn is peeled off through immersion for from one to 60 seconds in a 5-30 percent nitric acid solution. Tight Zn particles can be provided on the surface of each wiring and connection terminal by re-immersion for from one to two seconds in the zincate solution.

Next, Ni plating is provided by immersion in a non-electrolytic Ni plating solution. This plating is provided to a height of from 2-30 μm. Furthermore, the plating solution is a solution in which hypo phosphoric acid is the reducing agent, with a pH of 4-5 and a solution temperature of 80-95° C. Phosphorus is co-produced owing to the hypo phosphoric acid solution.

Furthermore, the Ni surface may also be substituted by Au, by immersion in the substitute Au plating solution. The Au is formed to a thickness of approximately 0.05 μm-0.3 μm. Furthermore, the Au solution makes use of a cyan free type, with a pH of 6-8, and a solution temperature of 50-80° C., with immersion taking place for 1-30 minutes.

In this manner, Ni or Ni—Au plating is provided on the surface of each wiring and connection terminal. Furthermore, Au plating may be executed to a thickness on the Ni—Au wiring. Even if each of the wiring including the subterranean plating is thin, the electrical resistance can be reduced by the application of a plating thickness.

Aqueous washing processing is accomplished between each chemical process. As the washing vat, use may be made of an overflow structure or a QDR mechanism, with $N_2$ bubbling occurring from the bottommost surface. The bubbling method is a method of expelling $N_2$ through openings in a resin tube or the like, or a method of expelling $N_2$ through a sintered body, by which rinsing can be accomplished with adequate effect over a short period of time.

By means of this process, as shown in FIG. 12, plating 44a is provided on the surface of the connection terminal 44r of the semiconductor element 200, and plating 34a is provided on the surface of the second wiring 34. By growing both platings until the plating 44a and plating 34a mutually combine, an electrical connection is accomplished between the connection terminal 44r and the second wiring 34. In the same manner, by growing both platings until the plating 44a is provided on the surface of the connection terminal 44s shown in FIG. 11, and the plating 36a is provided on the surface of the first wiring 36 combine, the connection terminal 44s and the first wiring 36 are electrically connected, thereby mounting the semiconductor element 200, and the semiconductor element 200 and the piezoelectric element 300 are electrically connected, forming the liquid droplet ejection head of the present embodiment.

As indicated above, with the liquid droplet ejection head 1 of the present embodiment, the first wiring 36 is electrically connected to the piezoelectric element 300 formed on the upper surface of the flow path forming substrate 10, the second wiring 34 formed on the upper surface of the reservoir forming substrate 20, and the connection terminal 44 of the semiconductor element arranged on the side surface 20b of the reservoir forming substrate 20 is electrically connected by plating provided on the surface of each wiring 34 and 36, and the connection terminal 44.

According to such a structure, since the semiconductor element 200 can be electrically connected relative to the first wiring 36 of the pressurizing chamber 12 and the second wiring 34 of the reservoir forming substrate 20, there is no need to provide a wire guide for wire bonding. Owing to this, even if the first wiring 36 is of a narrow pitch, in accompaniment with making a narrow pitch on the nozzle aperture 15, the semiconductor element 200 can be mounted, while assuring an electrical connection with the first wiring 36. Otherwise, in comparison with mounting accomplished by conventional wire bonding, mounting is possible with a short TAT, at low-cost, and with high yield.

Furthermore, even if there is positional slippage between the connection terminal 44 of the semiconductor element 200 and the wiring 34 and 36, caused by manufacturing errors and the like, an electrical connection can be assured by the provided plating 46. Furthermore, since there is no wiring formed on the side surface 20b of the reservoir substrate 20, there is no need to use a special coating device such as a spray coater or special light exposure technology or the like. Since all of the wiring connections can be completed by mounting the semiconductor element 200, the manufacturing process is simplified.

Furthermore, since with the liquid droplet ejection head 1 of the present embodiment, the side surface 20b of the reservoir forming substrate 20 is an inclined surface, in comparison with when the side surface 20b is a vertical surface, increasing the pressure of the semiconductor element 200 relative to the side surface 20b can be easily executed, and the semiconductor element 200 can be easily mounted.

According to the liquid droplet ejection head 1 of the present embodiment, a nozzle aperture 15 can be made to have a narrow pitch, and if a device is constructed which uses the subject liquid droplet ejection head 1, then a device having high precision and minute fineness can be realized.

Furthermore, according to the mounting structure of the present embodiment, since the wiring 36 of the lower step surface of a stepped body and wiring 34 of the upper step surface and the semiconductor element 200 can be positively electrically connected, not only with the liquid droplet ejection head, but also with other devices as well, mounting becomes possible of a semiconductor element onto a stepped body, and can be broadly applied relative to electronic equipment or transport equipment, or printing equipment or the like.

Fourth Embodiment

Figure 15:
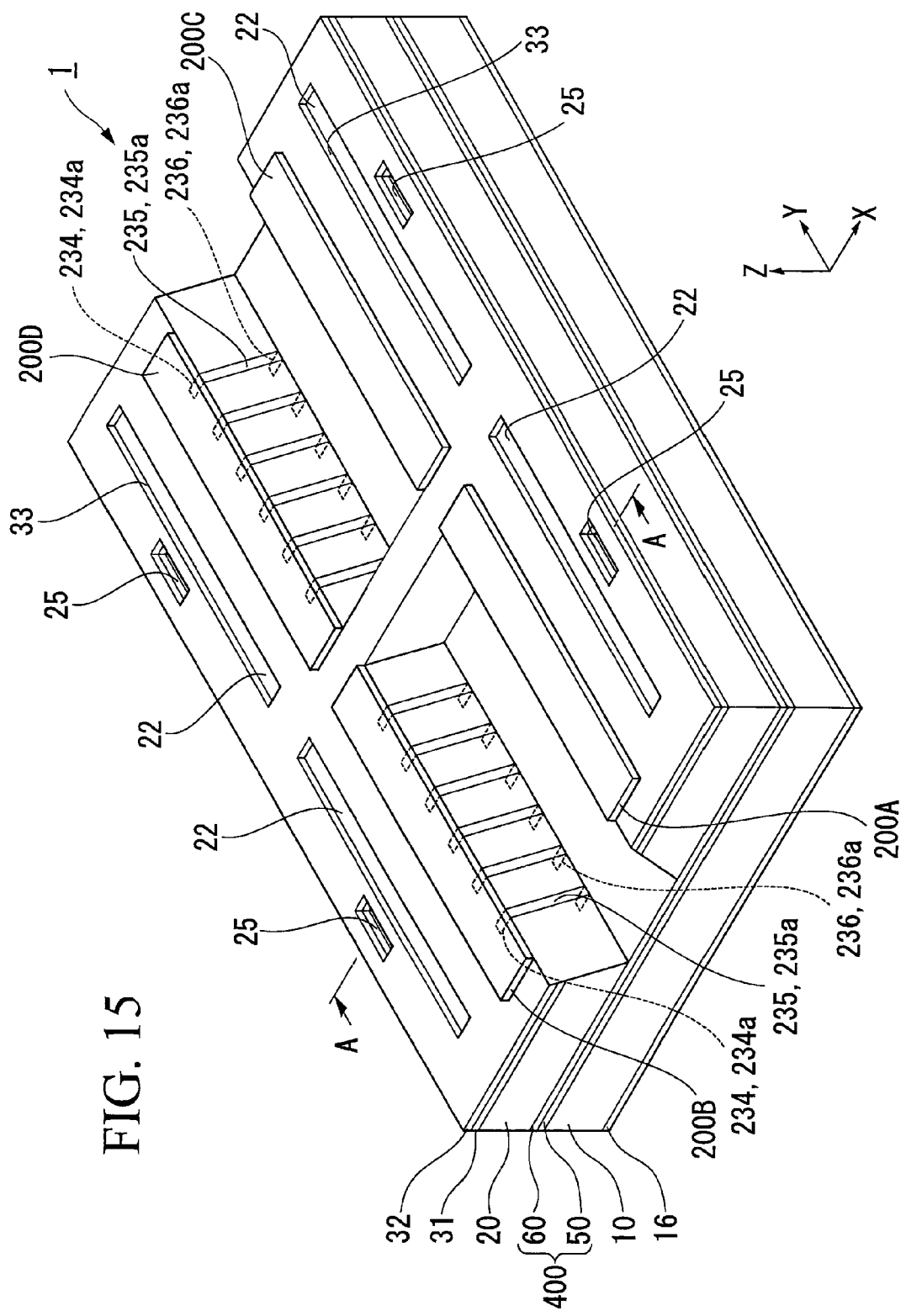
FIG. 15 is a perspective view showing a liquid droplet ejection head according to the fourth embodiment.
Figure 16:
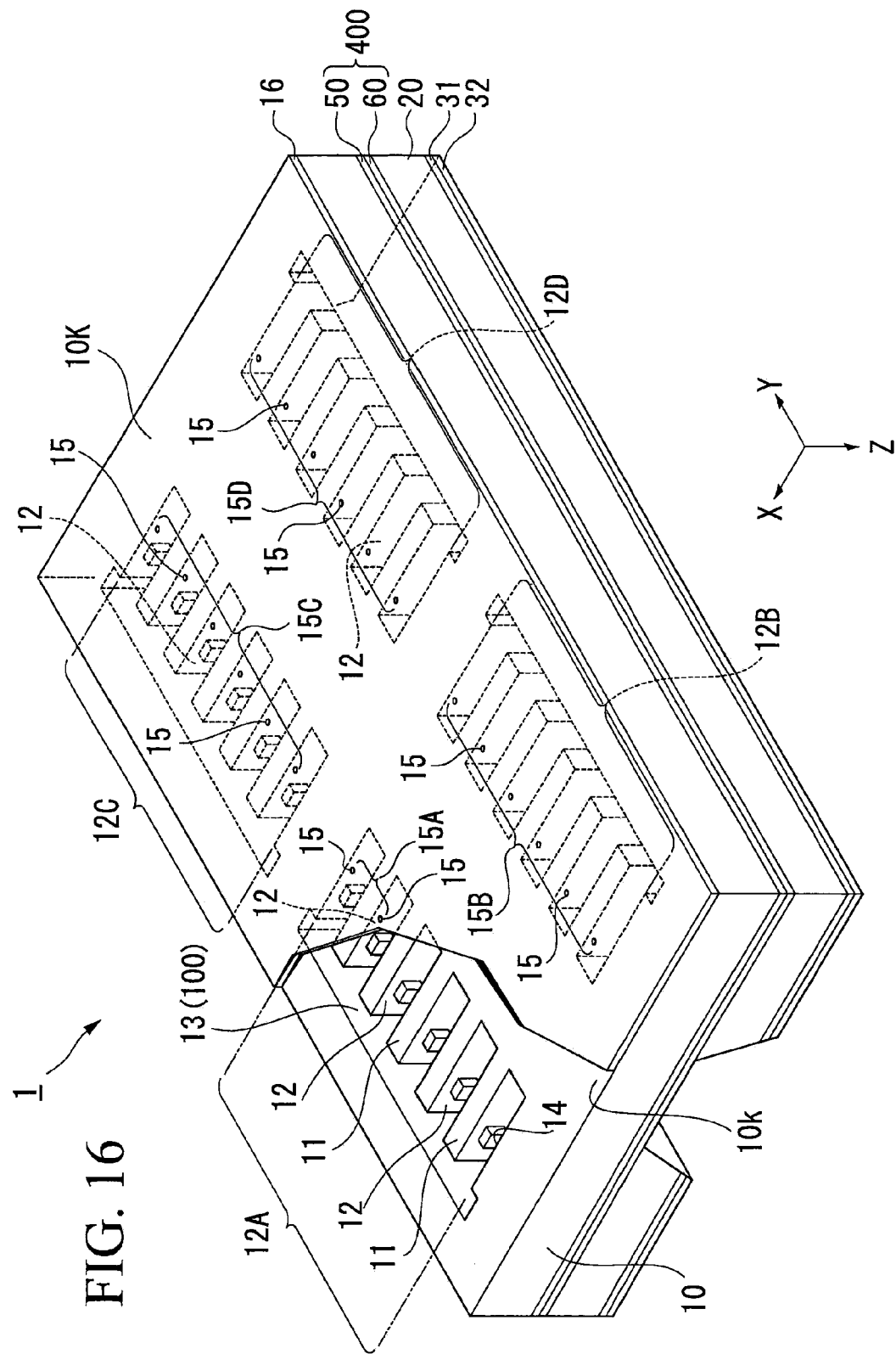
FIG. 16 is a perspective view showing the liquid droplet ejection head viewed from the lower side.
Figure 17:
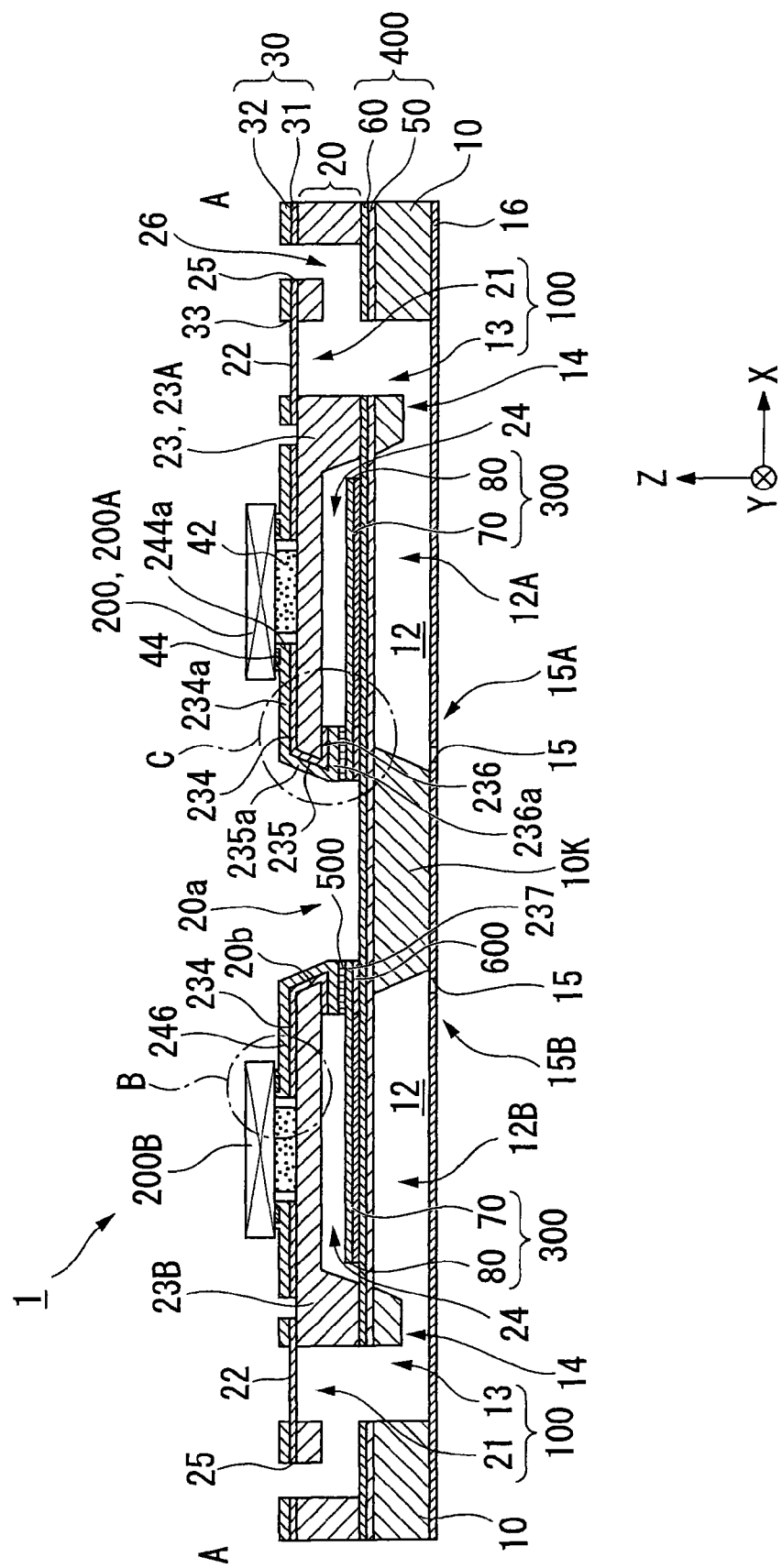
FIG. 17 is a cross-sectional diagram along the line A-A of FIG. 15.

An explanation of the fourth embodiment of the liquid droplet ejection head according to the present invention is provided hereafter, with reference to FIG. 15 to FIG. 17. FIG. 15 is a perspective view of a liquid droplet ejection head according to the fourth embodiment, FIG. 16 is a partially broken diagram of an oblique structure viewing the liquid droplet ejection head from the bottom side, and FIG. 17 is a cross-sectional structural diagram along line A-A of FIG. 15.

As shown in FIG. 17, the liquid droplet ejection head 1 of the present embodiment forms functional liquid into droplets, and ejects it from a nozzle. The liquid droplet ejection head 1 is provided with the pressurizing chamber (first member) 12 coupled to the nozzle aperture 15 from which the liquid droplets are ejected, and the piezoelectric element (driven element) 300 which produces pressure changes on the pressurizing chamber 12 arranged on the upper surface of the pressurizing chamber 12, and the reservoir forming substrate (protective substrate, second member) 20 covering the piezoelectric element 300 is arranged on the upper surface of the pressurizing chamber 12, and the semiconductor element 200 which drives the piezoelectric element 300 arranged on the upper surface of the reservoir forming substrate 20. Furthermore, the operation of the liquid droplet ejection head 1 is controlled by an un-shown external controller connected to the semiconductor element 200.

As shown in FIG. 16, to the lower side (−Z side) of the liquid droplet ejection head FIG. 1 is mounted the nozzle substrate 16. On the nozzle substrate 16 is provided multiple nozzle apertures 15, arranged in the Y-axis direction. In the present embodiment, a group of nozzle apertures 15 arranged in multiple regions on the nozzle substrate 16 is respectively referred to as the first nozzle aperture group 15A, the second nozzle aperture group 15B, the third nozzle aperture group 15C and the fourth nozzle aperture group 15D.

The first nozzle aperture group 15A and the second nozzle aperture group 15B are arranged in a row in the X-axis direction. The third nozzle aperture group 15C is provided on the +Y-side of the first nozzle aperture group 15A, and the fourth nozzle aperture group 15D is provided on the +Y side of the second nozzle aperture group 15B. The third nozzle aperture group 15C and the fourth nozzle aperture group 15D are arranged in a row in the X-axis direction.

In FIG. 16, each of the respective nozzle aperture groups 15A-15D is shown as constructed by the six nozzle apertures 15, however, in actuality each of the nozzle aperture groups, for example, is composed by 720 units of the nozzle apertures 15.

On the upper side (+Z side) of the nozzle substrate 16 is arranged the flow path forming substrate 10. The lower surface of the flow path forming substrate 10 and the nozzle substrate 16, for example, are fixed by an adhesive or a thermal adhesive film or the like. The flow path forming substrate 10 may be structured with a silicon, glass, or ceramic material and the like, and in the case of the present embodiment is formed of silicon. On the inside of the flow path forming substrate 10 is formed multiple partition walls 11 which extend in the X direction from the center. The partition walls 11 are formed by partially removing the silicon single crystal substrate including the welded base of the flow path forming substrate 10 by means of anisotropic etching. By means of the partition wall 11, in the flow path forming substrate 10 are partitions formed by multiple flat visibly abbreviated comb-shape aperture regions. Among these aperture regions, parts formed extending in the X-axis direction compose the pressurizing chamber (first member) 12 encompassed by the nozzle substrate 16 and the oscillation plate 400. The pressurizing chamber 12 houses the functional liquid, and ejects functional liquid from the nozzle aperture 15 by pressure applied when operating the liquid droplet ejection head 1.

Each of the pressurizing chambers 12 is provided corresponding to the multiple nozzle apertures 15. In other words, the pressurizing chamber 12 is provided in multiple rows in the Y-axis direction, so as to correspond to the multiple nozzle apertures 15 respectively composing the first-fourth nozzle aperture groups 15A-15D. The pressurizing chamber 12 multiply formed corresponding to the first nozzle aperture group 15A composes the first pressurizing chamber group 12A. The multiply formed pressurizing chamber 12 corresponding to the second nozzle aperture group 15B composes the second pressurizing chamber group 12B, the pressurizing chamber 12 multiply formed corresponding to the third nozzle aperture group 15C composes the third pressurizing chamber group 12C, and the pressurizing chamber 12 multiply formed corresponding to the fourth nozzle aperture group 15D composes the fourth pressurizing chamber group 12D. The first pressurizing chamber group 12A and the second pressurizing chamber group 12B are arranged a row in the X-axis direction, and between them is formed the partition wall 10K extending in the Y-axis direction. In the same manner, the third pressurizing chamber group 12C and the fourth pressurizing chamber group 12D are arranged in a row in the X-axis direction, and the partition wall 10K extending in the Y-axis direction is also formed between them.

Furthermore, among the aperture regions having the comb-shape formed on the flow path forming substrate 10, the part formed extending in the Y direction shown in the diagram composes the reservoir 100. The end of the substrate outside the border side (+X side) in the multiple pressurizing chambers 12 forming the first pressurizing chamber group 12A is connected to the reservoir 100 referred to above. The reservoir 100 maintains in reserve the functional liquid supplied to the pressurizing chamber 12, becoming the common functional liquid maintenance chamber (ink chamber) of multiple pressurizing chambers 12 composing the first pressurizing chamber group 12A.

To the respective second, third, and fourth pressurizing chamber groups 12B, 12C and 12D as well, are connected reservoirs 100, in the same manner as described above, which function as temporary storage for the functional liquid supplied to the respective pressurizing chamber groups 12B-12D.

As shown in FIG. 17, the reservoir 100 is composed from a reservoir portion 21 formed in the reservoir forming substrate 20 and the coupler 13 formed in the flow path forming substrate 10. The coupler 13 has the function of connecting the reservoir portion 21 to each of the respective pressurizing chambers 12. To the outside (the opposite side of the path-forming substrate 10) of the reservoir forming substrate 20, is connected the compliance substrate 30 having construction which laminates the seal film 31 and the fixed film 32.in the compliance substrate 30, and the sealing film 31 arranged on the inside is formed of a material having low elasticity (for example, from polyphenylene sulfide film, having a thickness of 6 μm).

On the other hand, the fixed plate 32 arranged on the outside is formed from a material having a metallic hardness and the like (for example, stainless steel having a thickness of 30 μm). On the fixed plate 32, is formed the aperture 33 cut out of a flat region corresponding to the reservoir 100. By such a structure, the upper part of the reservoir 100 is sealed only with the elastic sealing film 31, and becomes the elastic component 22 which is capable of deformation by changes in the internal pressure. Furthermore, in the compliance substrate 30 is formed the functional liquid introduction aperture 25 for supplying functional liquid to the reservoir 100. The reservoir forming substrate 20 is provided with the introduction path 26 which communicates with the functional liquid introduction aperture 25 and the reservoir 100.

The functional liquid introduced from the functional liquid introduction aperture 25 flows into the reservoir 100 through the introduction path 26, and having further passed the supply path 14, is respectively supplied to the multiple pressurizing chambers 12 composing the first pressurizing chamber group 12A.

By means of the flow of the functional liquid or the peripheral heat when driving the piezoelectric element 300, pressure changes are produced in the reservoir 100. However, since the elastic unit of the reservoir 100 is elastically deformed, and absorbs the pressure changes, the inside of the reservoir 100 normally maintains a fixed pressure.

On the upper surface side (+Z side in FIG. 17) of the flow path forming substrate is arranged the oscillation plate 400. The oscillation plate 400 is composed so as to laminate, chronologically from the flow path forming substrate 10 side, the flexible film 50, and the lower electrode film 60.

The flexible film 50 arranged on the flow path forming substrate 10 side is formed, for example from a silicon oxide film having a thickness of approximately 1-2 μm. The lower electrode film 60 is formed from a metallic film having a thickness, for example, of approximately 0.2 μm. In the present embodiment, the lower electrode film 60 functions as a common electrode for the multiple piezoelectric elements 20 arranged between the flow path forming substrate 10 and the reservoir forming substrate 20.

On the upper surface side (+Z side in FIG. 17) of the oscillation plate 400 is arranged the piezoelectric element 300 forming the oscillation plate 400. The piezoelectric element 300 is composed to laminate, chronologically from the lower electrode film 60 side, the piezoelectric body film 70 and the upper electrode film 80. The piezoelectric body film 70 is formed, for example, from a PZT film having a thickness of approximately 1 μm. The upper piezoelectric film 80 is formed, for example, from a metallic film having a thickness of approximately 0.1 μm.

The piezoelectric element 300, in addition to the piezoelectric body film 70 and the upper electrode film 80, it may also include a lower electrode film 60. The lower electrode film 60 on the one hand is composed as the piezoelectric element 300, and even functions as the oscillation plate 400. In the present embodiment, the flexible film 50 and the lower electrode film 60 adopt a structure which functions as the oscillation plate 400. However, even by eliminating the flexible film 50, the lower electrode film 60 may function jointly as the flexible film 50.

The piezoelectric element 300 (piezoelectric body film 70 and the upper electrode film 80) are multiply provided so as to correspond to the multiple nozzle apertures 15 and pressurizing chambers 12. In the present embodiment, a group of piezoelectric elements 300 is provided in multiple rows in the direction of the Y-axis so as to respectively correspond to the aperture 15 composing the first nozzle aperture group 15A referred to as the first piezoelectric element group, and the group of piezoelectric elements 300 provided in multiple rows in the Y-axis direction so as to respectively correspond to the nozzle aperture 15 composing the second nozzle aperture group is referred to as the second piezoelectric element group. Furthermore, the group of piezoelectric elements 300 corresponding to the third nozzle aperture group is referred to as the third piezoelectric element group, the group of piezoelectric elements 300 corresponding to the fourth nozzle aperture group is referred to as the fourth piezoelectric element group and the first piezoelectric element group and the second piezoelectric element group are arranged in rows in the X-axis direction, and in the same manner, the third piezoelectric element group and the fourth piezoelectric element group are arranged in rows in the X-axis direction.

On the upper surface side (+Z side in FIG. 17) of the flow path forming substrate 10 is arranged the reservoir forming substrate (protective substrate, second member) 20 so as to cover the piezoelectric element 300. Since the reservoir forming substrate 20 is a member which, in addition to forming the flow path forming substrate 10, forms the liquid droplet ejection head 1, and as its structural material, desirably makes use of a rigid material which has a thermal swell ratio which is roughly the same as that of the flow path forming substrate 10, in the case of the present embodiment, since the flow path forming substrate 10 is formed from silicon, optimal use can be made of a silicon single crystal substrate of the same material. Since the silicon substrate can easily execute processing with a high degree of precision through anisotropic etching, there is the advantage that a piezoelectric element support 24 can be easily formed, as described hereafter. As with the flow path forming substrate 10, it is possible to compose the reservoir forming substrate 20 using glass or ceramic material or the like, as with the flow path forming substrate 10.

The reservoir forming substrate 20 is provided with the seal 23 which tightly seals the piezoelectric element 300. In the case of the present embodiment, the part which seals the first piezoelectric element group is the first seal 23A, and the part which seals the second piezoelectric element group is the second seal 23B. In the same manner, the part which seals the third piezoelectric element group is the third seal, and the part which seals the fourth piezoelectric element group is the fourth seal. The seal 23 is provided with a piezoelectric element support (element support) 24 formed from an indentation of a flat visually abbreviated rectangle which extends vertically from the paper surface of FIG. 17. The piezoelectric element support 24, in addition to assuring a space so as not infringe the movement of the piezoelectric element 300 on the periphery of the piezoelectric element 300, has the function of tightly sealing the space. The piezoelectric element support 24 is dimensioned such that it can seal at least the piezoelectric body film 70 of the piezoelectric element 300. Furthermore, the piezoelectric element support 24 may also be partitioned for multiple piezoelectric elements 300.

In this manner, the reservoir forming substrate 20 functions as a protective substrate which seals the piezoelectric element 300 from the outside environment. By sealing the piezoelectric element 300 with the reservoir forming substrate 20, the characteristic deterioration of the piezoelectric element 300 caused by water entering from the outside and the like can be prevented. Furthermore, in the present embodiment, only the inside of the piezoelectric element support 24 is sealed. However, the inside of the piezoelectric element support 24 can be protected with low humidity by drawing an internal vacuum, or providing an environment filled with nitrogen or argon or the like, by which structure, deterioration of the piezoelectric element 300 can be effectively prevented.

The groove 20a which penetrates the reservoir forming substrate 20 is provided between the first seal 23A and the second seal 23B of the reservoir forming substrate 20. Through the groove 20a, the upper surface of the flow path forming substrate 10 is exposed to the outside, and a step difference is provided from the upper surface of the exposed flow path forming substrate 10 to the upper surface of the seal 23 of the reservoir forming substrate 20.

The side surface 20b of the groove 20a of the reservoir forming substrate 20 is an inclined surface. In particular, the reservoir forming substrate 20 is composed of a silicon substrate having a <1, 0, 0> orientation, and if wet etching is accomplished of the silicon substrate with an alkali solution of KOH and the like, the side surface 20b of the groove 20a can be given an inclined surface of approximately 54° through differences in the etching rate of each of the surface directions.

On the end of the groove 20a side of the upper surface of the reservoir forming substrate 20 is formed a second wiring 234, and on the end of the groove 20a side of the lower surface of the reservoir forming substrate 20 is formed a third wiring 236. Furthermore, from the end of the groove 20a side of the second wiring to 234 to the end of the groove 20a side of the third wiring 236 is formed a fourth wiring 235 on the side surface of the reservoir forming substrate 20. Moreover, since the side surface of the reservoir forming substrate is inclined, in comparison to when the side surface is a vertical surface, the third wiring 35 can be easily formed. Moreover, in FIG. 17, there is a coupling between each wiring; however, a gap may be provided between each wiring of from several μm to 10 μm. Furthermore, the second wiring 234, the third wiring 236 and the fourth wiring 235 may be formed with the same number of wires as a first wiring 237 described hereafter, and positionally arranged in the same Y direction as the first wiring 237.

The second wiring 234, the third wiring 236, and the fourth wiring 235 are desirably composed of a resin material mixed with a catalyst. Specifically, they should be composed of photosensitive a resin material in which minute particles of Pd (palladium) have been dispersed. In this instance, the second wiring 234, the third wiring 236 and the fourth wiring 235 can be formed by means of only photolithography. In other words, by coating the resin material on the upper surface and on the side surface of the reservoir forming substrate 20, and accomplishing exposure and development, patterning can be accomplished on the second wiring 234 and the fourth wiring 235. Furthermore, if the resin material is coated on the lower surface of the reservoir forming substrate 20, patterning can be accomplished on the third wiring 236 by means of exposure and development.

Moreover, the second wiring 234, the third wiring 236 and the fourth wiring 235 may be formed of a metallic material of Al or Ni—Cr, Cu, Ni, Au and Ag and the like. However, in patterning the metallic material, it is necessary for etching to be accomplished in which a resist is used as a mask, complicating the manufacturing process. In this regard, if composed of a photosensitive resin material mixed with a catalyst, patterning can be accomplished of the second wiring 234, and the fourth wiring 235 by means of only photolithography, simplifying the manufacturing process.

Moreover, it is also possible for the second wiring 234, the third wiring 236 and the fourth wiring 235 to be structured of a metallic material of Al or Ni—Cr, Cu, Ni, Au, Ag and the like. However, in patterning the metallic material, it is necessary for etching to be accomplished using the resist as a mask, complicating the manufacturing process. Relative to this, according to construction in which the photosensitive resin material is mixed with a catalyst, it is possible for the second wiring 234 and the fourth wiring 235 to be patterned by only photolithography, simplifying the manufacturing process.

On the upper surface side (+Z side in FIG. 17) of the reservoir forming substrate 20, the semiconductor element 200 is arranged facing down. The semiconductor element 200 is constructed, for example, to include a semiconductor integrated circuit (IC) which includes a circuit substrate or a drive circuit. As shown in FIG. 15, in the present embodiment, 4 semiconductor elements 200A to 200D are arranged in order to drive the first through fourth piezoelectric elements.

Furthermore, in the peripheral border of the lower surface side (−Z side) of the semiconductor elements 200, are arranged multiple connection terminals 44, composed of a metallic material of Al or N i-Cr, Cu, Ni, Au, and Ag and the like. On the end of the-X side of the semiconductor elements 200A the same number of connection elements 44 are provided as in the second wiring 234 for use in providing an electrical connection with the piezoelectric elements, arranged in rows at the same pitch as the second wiring 234. Furthermore, on the end of the +X side of the semiconductor elements 200A is formed an electrical connection 44 for use in electrically connecting an external controller.

In the center of the lower surface side (−Z side) of the semiconductor element 200 shown in FIG. 17 is arranged the adhesive material 42 formed from a thermoplastic resin of polyimide and the like. By heating the semiconductor element 200 and applying pressure to the reservoir forming substrate 20, the semiconductor element 200 is adhered to the upper surface of the reservoir forming substrate 20. In this instance, by adjusting the amount of the adhesive arranged on the lower surface of the semiconductor element 200, and the heat/pressure amount applied when adhering, a gap is formed of approximately several μm-10 μm between the connection terminal 44 and the second wiring 234.

In this manner, a gap is formed between the connection element 44 and the second wiring 234. Furthermore, there are also instances in which a gap of from several μm-μm is formed between each wiring, and there is a particularly great possibility that the gap formed between the fourth wiring 235 and the third wiring 236 will be joined at an acute angle. Furthermore, the resin material mixed with a catalyst composing each wiring is composed of an electrical insulation material. Furthermore, in the above state, the semiconductor element 200 and the piezoelectric element 300 are not electrically connected.

Therefore, plating 246 is provided on the surface of the first-third wiring and the connection terminal. Specifically, plating 244a is provided on the surface of the connection terminal 44, plating 234a is provided on the surface of the second wiring 234, plating 235 is provided on the surface of the fourth wiring 235, and plating 236 is provided on the surface of the third wiring 236, respectively. With each of the wirings composed of a resin material mixed with a catalyst, plating is provided relative to the catalyst. The plating 246 is composed of a metallic material of Cu or Ni, and Au and the like. Plating of different materials may also be provided on the surface of each wiring and connection terminal.

Figure 18:
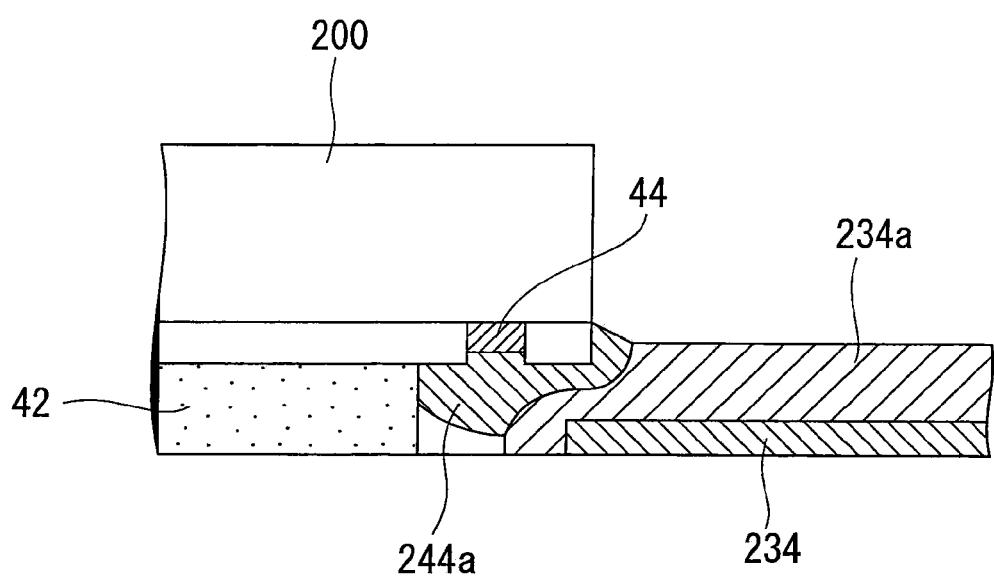
FIG. 18 is a partially enlarged view showing a mounting structure according to the fourth embodiment.

FIG. 18 as an explanatory diagram of the mounting structure of the semiconductor element according to the fourth embodiment, and is an enlarged diagram of part B of FIG. 17. As shown in FIG. 18, plating 244a is provided on the surface of the connection terminal 44 of the semiconductor element 200. The plating 234a is provided on the surface of the second wiring 234. By combining the grown plating 244a and 234a, the connection terminal 44 and the second wiring 234 are electrically connected, mounting the semiconductor element 200. In the same manner, the plating 234a produced/grown on the surface of the second wiring 234 shown in FIG. 17 is combined with the plating 235a, electrically connecting the second wiring 234 and the fourth wiring 235. Furthermore, the plating 235a produced/grown on the surface of the fourth wiring 235 is combined with the plating 236a on the surface of the third wiring 236, electrically connecting the fourth wiring 235 and the third wiring 236, by which the semiconductor element and the third wiring 236 are electrically connected.

Furthermore to extending the second wiring 234 to a position facing the connection terminal 44 of the semiconductor elements 200, a conductive protrusion may also be formed on the surface of the connection element 44, facing the second wiring 234. The conductive protrusion is formed to a height of from several μm-10 μm by means of a metallic material of Al or Ni—Cr, Cu, Ni, Au, and Ag and the like. By pressurizing the semiconductor element 200 to the reservoir forming substrate 20 so that the end of the conductive protrusion makes contact with the second wiring 234, the semiconductor element 200 is adhered by the adhesive 42. A slight gap may also exist between the end of the conductive protrusion and the second wiring 234. According to such a construction, plating provided on the conductive protrusion and the second wiring 234 can be assuredly combined, making possible a positive electrical connection between the connection terminal 44 of the semiconductor element 200 and the second wiring 234, enabling improved reliability of the electrical connection.

The end of the upper electrode film 80 composing the piezoelectric element 300 formed on the flow path forming substrate 10 extends to the groove 20a side of the piezoelectric element support 24 in the reservoir forming substrate 20, thereby composing the first wiring 237. Moreover, the first wiring 237 may be extended to the upper surface of the flow path forming substrate exposed through the groove 20a. The first wiring 237 is composed of Al or Ni—Cr, Cu, Ni, Au, and Ag and the like. However, a structure is also possible which, in the same manner as described for the second to fourth wiring 234-236, may be composed of a photosensitive resin material mixed with a catalyst. Moreover, if the lower electrode film 60 is arranged in an abbreviated beta state on the flow path forming substrate 10, an insulation film 600 is arranged to prevent short-circuiting between both the lower electrode film 60 and the first wiring 237. Furthermore, in lieu of extending the upper electrode film 80 in its existent state, electrode wiring may also be electrically connected to the upper electrode film 80 and formed on the flow path forming substrate 10, and the electrode wiring extended to the end of the groove 20a side of the piezoelectric element support 24, composing the first wiring 237.

The plating 236a provided on the third wiring 236 of the reservoir forming substrate 20 and the first wiring 237 of the flow path forming substrate 10 are electrically connected. An electrical connection is realized by arranging an anisotropic conductive film (ACF) 500 between the two. The anisotropic conductive film 500 is formed by dispersing conductive particles in a heat hardened resin. By dispersing the conductive particles between the plating 236a of the reservoir forming substrate 20 and the first wiring 237 of the flow path forming substrate 10, the two can be electrically connected without short-circuiting closely proximate wiring, thereby mounting the flow path forming substrate 10 and the reservoir forming substrate 20, electrically connecting the piezoelectric element 300 formed on the flow path forming substrate 10 and the semiconductor element 200 mounted on the reservoir forming substrate 20.

In ejecting liquid droplets of functional liquid from the liquid droplet ejection head 1 shown in FIG. 17, an un-shown external functional liquid supply device connected to the functional liquid aperture 25 is driven by an external controller (omitted from the drawing) connected to the liquid droplet ejection head 1. After supplying the reservoir 100 with the functional liquid sent from the external functional liquid supply device, through the functional liquid introduction aperture 25, a flow path which reaches the nozzle aperture 15 is achieved within the liquid droplet ejection head 1.

Furthermore, an external controller transmits a driving power or instruction signal to the semiconductor element 200 mounted on the reservoir forming substrate 20, through a flexible substrate (un-shown in the drawing). The semiconductor element 200 which receives the instruction signal transmits a drive signal to each piezoelectric element 300 based on the instruction from the external controller. Voltage is applied to the piezoelectric body film 70 supported by the lower electrode film 60 and the upper electrode film 80, producing a variation between the lower electrode film 60 and the flexible film 50 closely proximate to the piezoelectric electric film 70, by which the capacity of each pressurizing chamber 12 is changed, increasing the internal pressure, and ejecting liquid droplets from the nozzle aperture 15.

Figure 19:
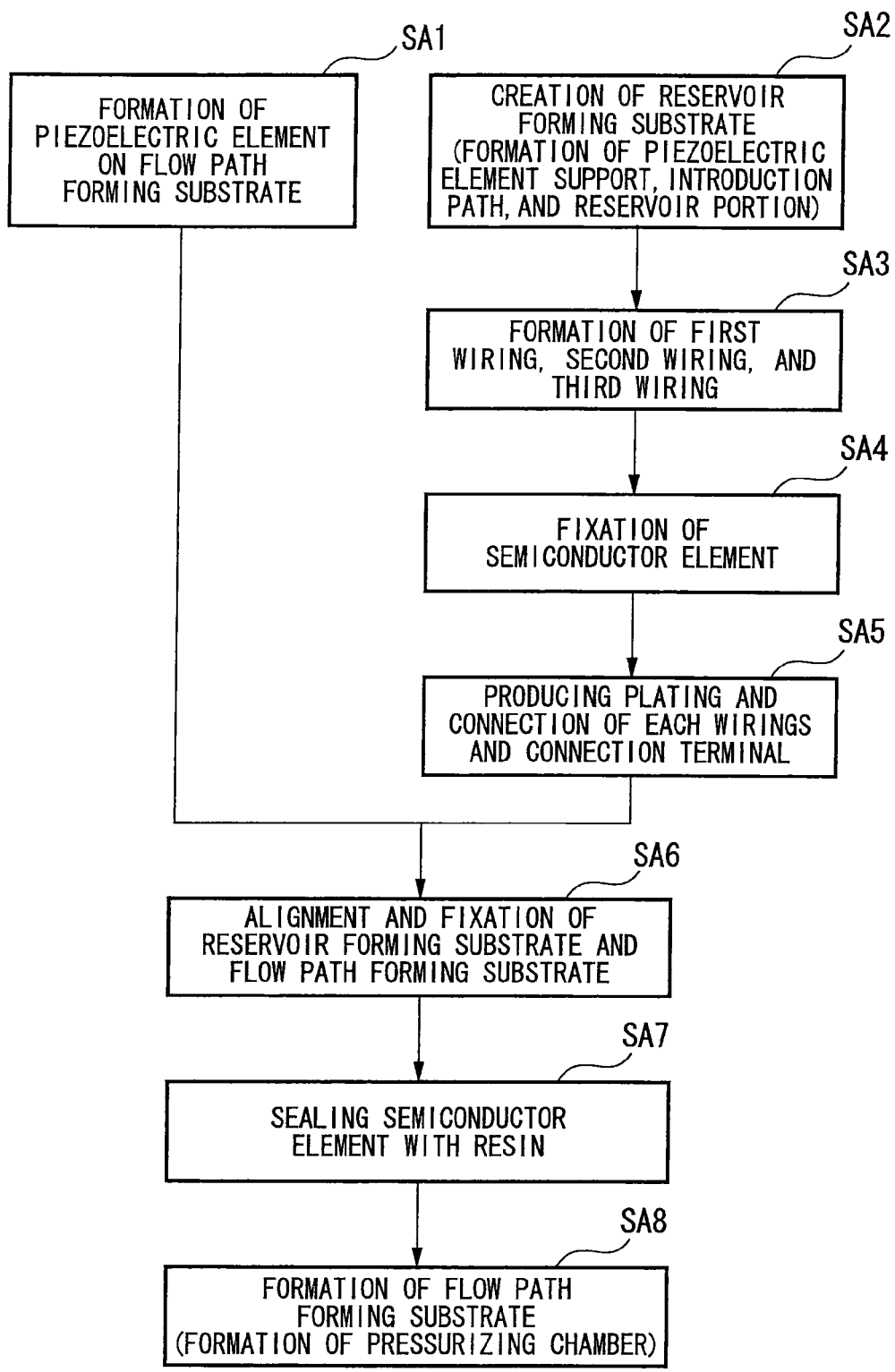
FIG. 19 is a flowchart of the method of manufacture of the liquid droplet ejection head.

An explanation is provided of the construction method of the liquid droplet ejection head, with reference to the flow-chart drawing of FIG. 19 and the cross-sectional process drawings of FIGS. 20A to 20G.

First of all, an explanation is provided of a summary of the construction process of the liquid droplet ejection head, with reference to FIGS. 19 and 17.

In constructing the liquid droplet ejection head, a laminated layer of the flexible film 50 and the lower electrode from 60 is formed on the flow path forming substrate 10, prior to etching processing. Next, the piezoelectric element 300 is formed (in step SA1) by pattern forming the piezoelectric body film 70 and the upper electrode film 80 on the lower electrode film 60.

The reservoir forming substrate 20 is created in parallel with step SA. First of all, the groove 20a, or piezoelectric element support 24, introduction path 26, and reservoir portion 21 are formed (in step SA2) by executing anisotropic etching on the silicon single crystal substrate. Next, the second wiring 234 is formed on the upper surface of the reservoir forming substrate 20, the fourth wiring 235 is formed on the side surface, and the third wiring 236 is formed on the lower surface (in step SA3). Furthermore, the semiconductor element 200 is adhered (in step SA4) to the upper surface of the reservoir forming substrate 20. Plating is provided on the second to fourth wiring as well as on the connection terminal of the semiconductor element, conductively connecting (in step SA5) the semiconductor element 200 and the third wiring 236.

Next, in a position to cover the piezoelectric element 300 of the flow path forming substrate 10 which has passed step SA1, the reservoir forming substrate 20 which has passed step SA5 is positionally aligned and fixed (in step SA6). In this instance, the periphery of the semiconductor element 200 shown in FIG. 20F is sealed (in step SA7) with a resin 201, as shown in FIG. 20F. Subsequently, as shown in FIG. 17, the pressurizing chamber 12, or supply path 14, and coupler 13 and the like are created (in step SA8) by executing anisotropic etching on the flow path forming substrate 10 formed from a silicon single crystal substrate.

By means of the above process, manufacture can be accomplished of the semiconductor ejection head 1 on which is mounted the semiconductor element 200.

A detailed description of the manufacturing processes (SA2 and SA3) of the reservoir forming substrate, the mounting processes (SA4 and SA5) of the semiconductor element, and the mounting process (SA6) of the reservoir forming substrate are explained hereafter, with reference to FIGS. 20A to 20G. Each of the drawings shown in FIGS. 20A to 20G are diagrams corresponding to an outline cross-sectional structure along the line A-A of FIG. 15.

Figure 20A:
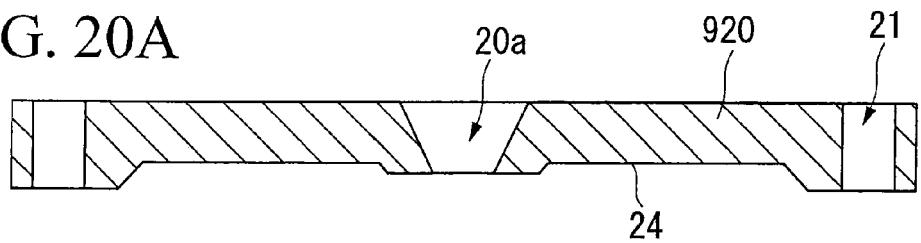
FIGS. 20A, 20B, 20C, 20D, 20E, 20F, and 20G are cross-sectional process diagrams showing the method of manufacture of the liquid ejection head.

First of all, as shown in FIG. 20A, the center of the upper surface (+Z side surface) of the silicon single crystal substrate 920 is removed by means of etching, thereby forming the groove 20a. Specifically, the surface of the silicon single crystal substrate 920 is formed into an oxidized silicon film by thermal oxidation. Next, a resist is coated on the surface of the silicon single crystal substrate 920, and a resist aperture is formed on the groove 20a which should be formed by photolithography. Next, the resist aperture is processed with fluoric acid, forming an aperture of silicon oxide film. Next, the silicon single crystal substrate 920 is submerged in an aqueous solution of 35% wt potassium hydroxide (KOH), and anisotropic etching is performed on the silicon single crystal substrate 920 exposed from the aperture of the silicon oxide film. Since the silicon oxide film functions as an etching stopper, etching is suspended at the place in which the silicon single crystal substrate 920 penetrates. Upon completion of etching, the surface of the silicon single crystal substrate 920 is re-subjected to thermal oxidation, forming a silicon oxide film.

The reservoir portion 21 and the piezoelectric element support 24 are formed by means of etching in the same manner.

Figure 20B:
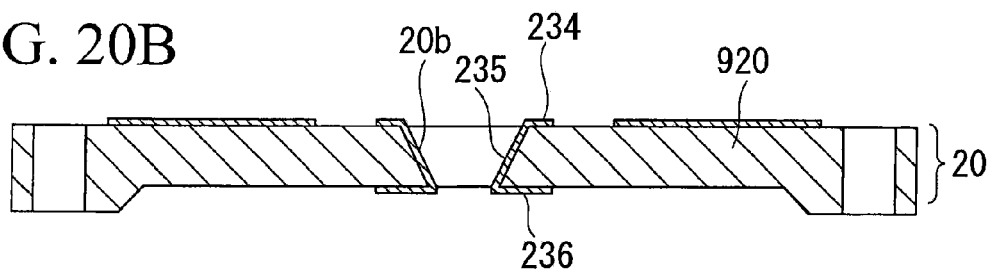

Next, as shown in FIG. 20B, the second wiring 234 is formed on the upper surface of the silicon single crystal substrate 920, and the fourth wiring 235 is formed on the side surface of the groove 20a. Specifically, first of all, on the upper surface of the silicon single crystal substrate 920 and the side surface 20b of the groove 20a a liquid form of resin material mixed with a catalyst is coated by a spin coating method or a spray coating method. Next, the exposure and development of the resin material is accomplished through a mask on which the pattern of the second wiring 234 and the fourth wiring 235 have been drawn, by which the second wiring 234 on the upper surface of the silicon single crystal substrate 920 is patterned, and the fourth wiring 235 is patterned on the side surface.

Next by the same method as that referred to above, the third wiring 236 is formed on the lower surface of the silicon single crystal substrate 920. Specifically, first of all, a coating of the liquid form of a resin material mixed with a catalyst is applied to the lower surface of the silicon single crystal substrate 920 by a spin coating method or a spray coating method. Next, the resin material is exposed and developed through a mask on which the third wiring 236 pattern is drawn, thereby patterning the third wiring 236 on the lower surface of the silicon single crystal substrate 920.

Moreover, in the case of composing each wiring with a metallic material, a metallic film is formed by means of sputtering, and patterning is accomplished by etching through a resist mask. Furthermore, by means of the sputtering method or the ink jet method accomplished through a Si mask, drawing may be accomplished directly onto the second wiring 234, thereby forming the reservoir forming substrate 20.

Figure 20C:
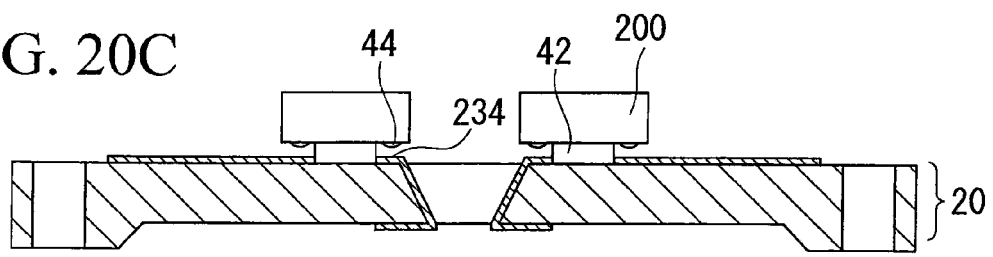

Next, as shown in FIG. 20C, the semiconductor element 200 is directly adhered to the upper surface of the reservoir forming substrate 20. Specifically, first of all, the adhesive material 42 formed from a thermal elastic resin material is coated on the center of the lower surface of the semiconductor element 200. Next, the connection terminal 44 of the semiconductor element 200 is positionally aligned with the second wiring 234 of the reservoir forming substrate 20, the semiconductor element 200 is heated, and pressure is applied relative to the reservoir forming substrate 20. In this instance, by adjusting the amount of coated adhesive and the amount of heat/pressure applied when adhering, a gap of roughly from several μm to 10 μm is established between the connection terminal 44 and the second wiring 234. Subsequently, by cooling the entire body and hardening the adhesive 42, the semiconductor element 200 is adhered to the upper surface of the reservoir forming substrate 20.

Figure 20D:
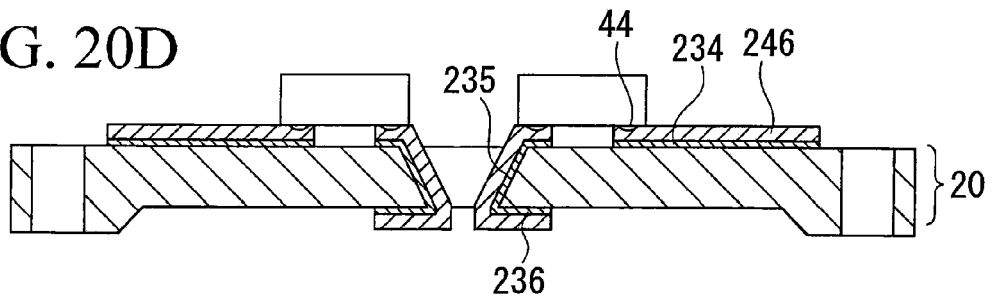

Next, as shown in FIG. 20D, the plating 246 is provided on the surface of the second wiring 234, the third wiring 236, the fourth wiring 235, and the connection terminal 44. Specifically, non-electrolytic plating is accomplished by the following process.

First of all, with the objective of improving the wettability of the surface of each wiring and connection terminal, and removal of residue, immersion is accomplished for from one to five minutes in an aqueous solution including 0.01-0.1 percent fluoric acid, and 0.01-1 percent sulfuric acid. Or immersion may also be accomplished for from 1 to 10 minutes in an alkali base aqueous solution of 0.1-10 percent sodium hydroxide.

Next, immersion is accomplished for from one second to five minutes in an alkali aqueous solution of a sodium hydroxide base having a pH of from 9 to 13, while heating at a temperature of from 20-60° C., and the outside film surface is removed. Or immersion may be accomplished for from one second to five minutes in an acidic aqueous solution of 5-30 percent nitric acid as a base, with a pH of from 1-3, while heating at from 20-60° C.

Next, immersion is accomplished for from one second-two minutes in a zincate solution having a pH of from 11 to 13, which includes ZnO, in which Zn is substituted on the surface of each wiring and connection terminal. Next, immersion is accomplished for from 1-60 seconds in a 5-30 percent nitric acid aqueous solution, and the Zn is peeled off. By re-immersing for from one second to two minutes in a zincate solution, minute Zn particles are provided on the surface of each wiring and connection terminal.

Next, Ni plating is provided through immersion in a non-electrolytic Ni plating solution. This plating is provided to a height of 2-30 μm. Furthermore the plating solution is a solution in which use is made of hypo phosphoric acid as the reducing agent, with a pH of 4 to 5 and a solution temperature of 80 to 95° C. Owing to the hypo phosphoric acid, phosphorus is co-provided.

Furthermore, Au may be substituted on the Ni surface by immersion in a substitute Au plating solution. The Au is formed to a height of 0.05 μm-0.3 μm. Furthermore the Au solution is a cyan free type, with a pH of 6 to 8, and a solution temperature of 50-80° C., with immersion being accomplished for from one to 30 minutes.

In this manner, Ni or Ni—Au plating is provided on the surface of each wiring and connection terminal. Furthermore, Au plating may be executed on the Ni—Au wiring. Even if each wiring beneath the plating is thin, the electrical resistance can be reduced by applying the plating.

Wash processing is accomplished between each chemical process. As a wash bath, use may be made of an overflow structure or a QDR mechanism, with $N_2$ bubbling taking place from the bottommost surface. As bubbling methods, there is the $N_2$ expulsion method from a hole formed in a resin tube, and a method for expelling $N_2$ through a sinter formed body. By this means, an adequate and effective rinse can be accomplished in a short time.

By means of the above processes, as shown in FIG. 18, the plating 244a is provided on the surface of the connection terminal 44 of the semiconductor element 200, and the plating 234a is provided on the surface of the second wiring 234. By growing both of these until the plating 244a and plating 234a mutually combine, the connection terminal 44 and the second wiring 234 are electrically insulated. In the same manner, by growing each plating until the plating 234a provided on the surface of the second wiring 234 shown in FIG. 17, the plating 235a provided on the surface of the fourth wiring 235 and the plating 236a provided on the surface of the third wiring 236 combine, the second wiring 234, the fourth wiring 235 and the third wiring 236 are electrically connected, by which the semiconductor element 200 and the third wiring 236 are electrically connected.

Figure 20E:
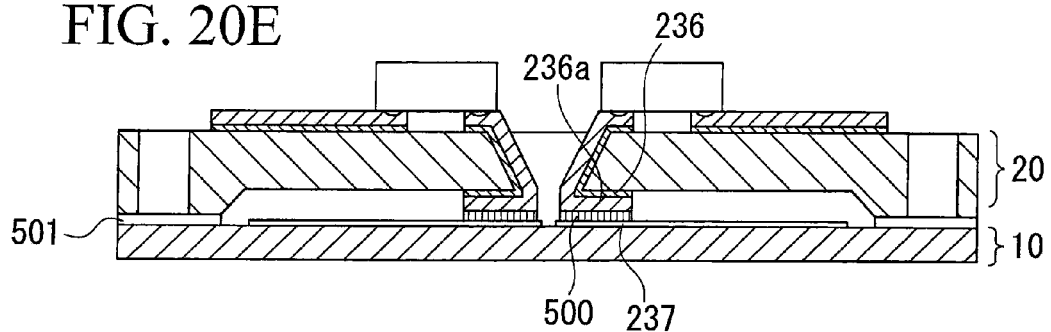
Figure 20F:
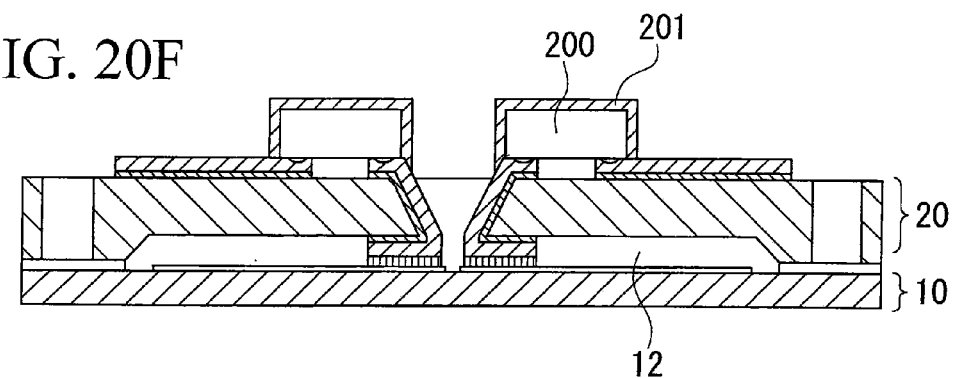

Next, as shown in FIG. 20E, the reservoir forming substrate 20 is mounted on the flow path forming substrate 10. In other words, the plating 236a provided on the surface of the third wiring 236 in the reservoir forming substrate 20, and the first wiring 237 formed on the flow path forming substrate 10 are electrically connected, and both plates are mechanically connected. Specifically, in addition to arranging an anisotropic conductive film 500 between the plating 236a and the first wiring 237, forming an electrical connection, the heat hardened resin 501 is coated on the mechanical connector. The reservoir forming substrate 20 is heated, and pressed facing the flow path forming substrate 10, by which means, in addition to an electrical connection being established between the plating 236a and the first wiring 237, the heat hardened adhesive 501 is hardened, mechanically connecting both substrates.

Next, as shown in FIG. 20F, the semiconductor element 200 is sealed, the creative process of the pressurizing chamber 12 and the like of the flow path forming substrate 10 being explained hereafter. Furthermore to the flow path forming substrate, both the reservoir forming substrate 20 and the semiconductor element 200 are immersed in an etching liquid. The semiconductor element 200 is sealed in order to protect the semiconductor element 200 from the etching liquid. As the seal, it is desirable to adopt a resin material 201 of heat hardened resin and the like. Specifically, the fixed reservoir forming substrate 20 and the flow path forming substrate 10 are arranged in a mold, and the resin material 201 in the periphery of the semiconductor element 200 is desirably an emission mold type. If the semiconductor element 200 is sealed in this manner, following the completion of the liquid droplet ejection head as well, the semiconductor element 200 can be protected from deleterious environmental conditions of light and the like. However, if there are no problems with the environmental conditions, the sealing resin may be removed following the completion of the liquid droplet ejection head.

Figure 20G:
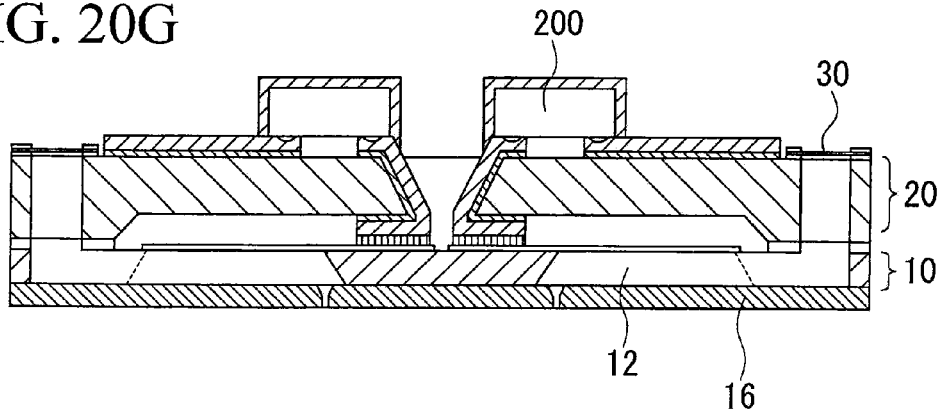

Next, as shown in FIG. 20G, by executing anisotropic etching on the flow path forming substrate 10 formed from a silicon single crystal substrate, a pressurizing chamber 12 is created. The specific method of this etching is the same as the etching method of the reservoir forming substrate 20. Subsequently, the compliance substrate 30 is connected to the reservoir forming substrate 20, and the nozzle substrate 16 is connected to the flow path forming substrate 10. After creating the pressurizing chamber 12, it may be connected to the reservoir forming substrate 20 as well.

The liquid droplet ejection had of the present embodiment is formed according to the above.

As explained in detail above, the liquid droplet ejection head 1 of the present embodiment is formed from the electrical connection of the connection terminal 44 of the semiconductor element 200, the second wiring 234 formed on the upper surface of the reservoir forming substrate 20, the third wiring 235 formed on the lower surface, and the fourth wiring 236 formed on the side surface 20b are conductively connected by plating 246 provided on the surface of each wiring and connection element 44, and by further provided plating 246, a first wiring 237 conductively connected to the piezoelectric element 300 of the path forming substrate 10 is conductively connected.

According to such a structure, in the case of connecting a semiconductor element 200 and the first wiring 237 by means of wire bonding, there is no need to provide a wire guide space. Owing to this, in accompaniment with the narrow pitching of the nozzle aperture 15, even if the first wiring 237 is made to be a narrow pitch, the electrical connection with the first wiring 237 is assured, and the semiconductor element 200 can be mounted. Other than that, in comparison with mounting accomplished by means of conventional wire bonding, mounting is possible with a short TAT, at low-cost, and with high yield.

Furthermore, even if there is positional slippage or a gap between the connection terminal 44 and the wiring 234, or mutually between the wiring, plating 246 is provided, and by growing or combining, an electrical connection can be assured. Furthermore, simultaneously executing mounting of the semiconductor element 200 and the establishment of the electrical connection of each wiring is possible, simplifying the manufacturing process. Furthermore, even if each wiring including subterranean wiring is formed to be thin, electrical resistance can be reduced by the coating of the plating 246.

High precision is required in the piezoelectric element 300 formed in the flow path forming substrate 10. However, if the piezoelectric element 300 is immersed in plating liquid, migration occurs with the Na included in the plating liquid, resulting in reduced electrical reliability. If the piezoelectric element is sealed with resin to protect it from the plating liquid, the manufacturing process becomes complex.

In this regard, in the present embodiment, to the extent that the plating 246 is only educed on the reservoir forming substrate 20, there is no need for the piezoelectric element 300 formed on the flowpath forming substrate 10 to be immersed in the plating liquid. Furthermore, it is possible to avoid the influence of plating processing on the piezoelectric element 300 requiring a high degree of precision, and the electrical reliability of the liquid droplet ejection head 1 can be improved. Furthermore, since the flowpath forming substrate 10 is formed in the same manner as technology for performing wire bonding, there is no need to re-design the flowpath forming substrate 10, or to change the manufacturing process. Furthermore, manufacturing costs can be reduced.

According to the present embodiment, a liquid droplet ejection head 1 in which the nozzle aperture 15 is given a narrow pitch is possible, and if the device is accomplished using the applied liquid droplet ejection head 1, refinement and minuteness of the device can be realized.

Furthermore, according to the mounting construction of the present embodiment, since the wiring 237 of the step difference lower part and the semiconductor element 200 of the step difference upper part can be assuredly electrically connected, not only the liquid droplet ejection head, but other devices may also be mounted through a step difference, enabling broad application relative to electronic devices, transport devices and printing devices and the like.

Fifth Embodiment

Figure 21A:
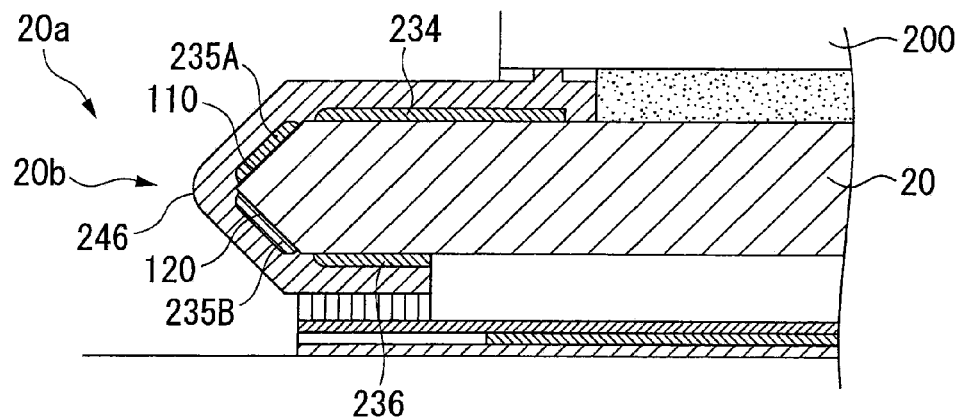
FIG. 21A is a partially enlarged view showing a liquid droplet ejection head according to the fifth embodiment.
Figure 21B:
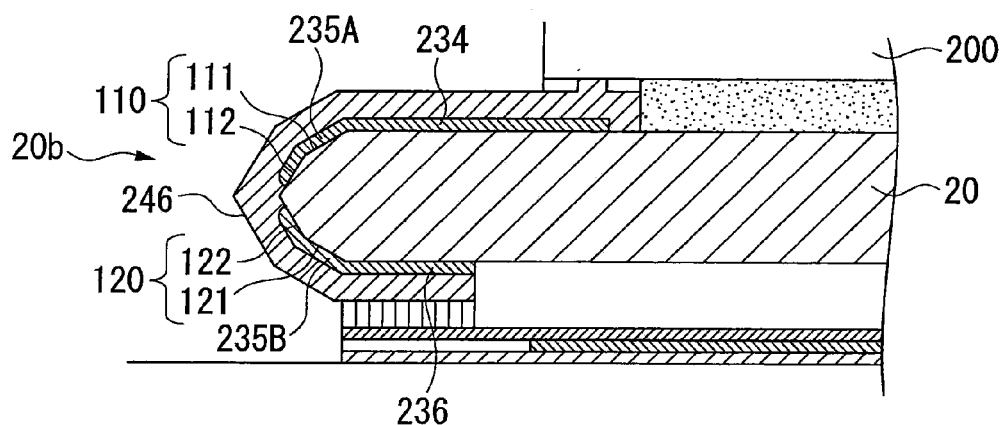
FIG. 21B is a partially enlarged view showing the first deformation example of the liquid droplet ejection head of the fifth embodiment.
Figure 21C:
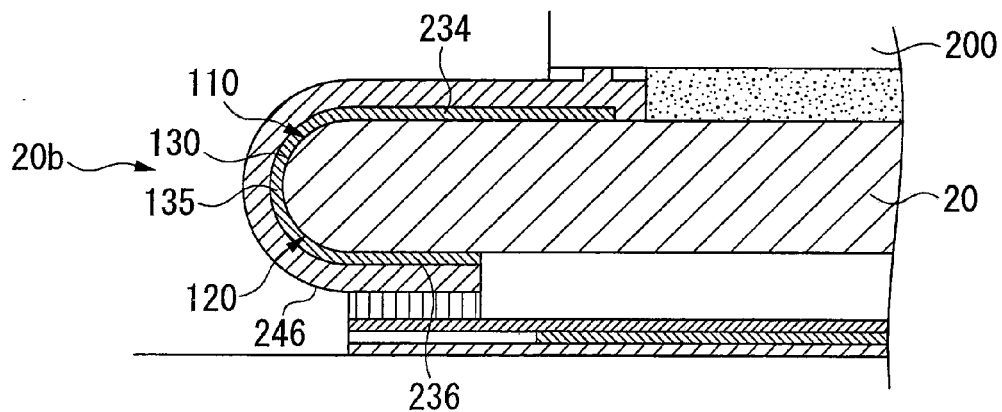
FIG. 21C is a partially enlarged view showing the second deformation example of the liquid droplet ejection head of the fifth embodiment.

An explanation of the fifth embodiment the liquid droplet ejection head according to the present invention is provided hereafter, with reference to FIGS. 21A to 21C.

FIG. 21A is an explanatory diagram of a liquid droplet ejection head according to the fifth embodiment of the present invention.

FIG. 21A is an enlarged diagram corresponding to part C. Given the point that the liquid droplet ejection head of the fifth embodiment shown in FIG. 21A is composed such that the side surface of the reservoir forming substrate 20 is composed of multiple inclined surfaces, it differs from the fourth embodiment composed of 1 inclined surface. A detailed explanation is omitted concerning components, the construction of which is the same as that of the fourth embodiment.

With the liquid droplet ejection head of the fifth embodiment shown in FIG. 21A, the side surface 20b of the groove 20a formed in the reservoir forming substrate 20 is composed of multiple inclined surfaces. In other words, a first inclined surface 110 facing the upper side is arranged on the upper side of the reservoir forming substrate 20, and a second inclined surface 120 facing the lower side is arranged on the lower surface of the reservoir forming substrate 20. Moreover, the reservoir forming substrate 20 is composed of the silicon substrate having a <1, 0, 0> orientation, and by wet etching the silicon substrate with an alkali solution of KOH and the like, then either the first inclined surface 110 and the second inclined surface 120 can be given an inclined surface of approximately 54°. A fourth wiring 235A is formed on the surface of the first inclined surface 110, and a fourth wiring 235B is formed on the surface of the second inclined surface 120.

FIG. 21B is a first deformation example of the liquid droplet ejection head of the fifth embodiment. With the first deformation example the first inclined surface 110 facing the upper side is composed of multiple inclined surfaces of different angles (moderate inclined surface 111 and steep inclined surface 112), wherein each inclined surface 111 and 112 is arranged on the upper side of the reservoir forming substrate 20. Furthermore, the second inclined surface 120 facing the lower side is also composed of multiple inclined surfaces of different angles (moderate inclined surface 121 and steep inclined surface 122), and each inclined surface 121 and 122 is arranged on the lower surface of the reservoir forming substrate 20. Each inclined surface 121,122 is arranged so that the inside angle of the closely proximate inclined surface becomes 90° or greater, and so that the upper surface and the lower surface of the reservoir forming substrate 20 are combined in an obtuse angle. The fourth wiring 235 A is formed on the surface of the first inclined surface 110. The fourth wiring 235B is formed on the surface of the second inclined surface 120.

FIG. 21C is a second deformation example of a liquid droplet ejection head according to the fifth embodiment. With the second deformation example, the upper surface and the lower surface of the reservoir forming substrate 20 are joined by a curved surface 130 which has the cross-sectional surface of a semi-circular state. In this case as well, the first inclined surface 110 facing the upper side is arranged on the upper side of the reservoir forming substrate 20, and the second inclined surface 120 facing the lower side is arranged on the lower surface of the reservoir forming substrate 20. Third wiring 135 is formed on the curved surface 130.

Figure 22A:
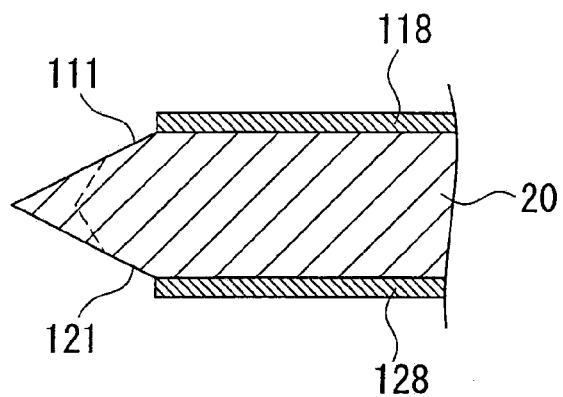
FIGS. 22A, 22B, 22C, and 22D are construction processes of the liquid droplet ejection head according to the first deformation example of the fifth embodiment.

FIGS. 22A to 22D is a manufacturing process diagram of the liquid droplet ejection head according to the first deformation example of the fifth embodiment. In manufacturing the liquid droplet ejection head of the first deformation example shown in FIG. 21B, first of all, as shown in FIG. 22A, a mask 118 is formed on the upper surface of the reservoir forming substrate 20, and a mask 128 is formed on the lower surface. Also, in the same manner as in the fourth embodiment, wet etching is performed relative to the reservoir forming substrate 20. Wet etching is accomplished with time control, and a moderate inclined surface 111 is formed continuous to the upper surface of the reservoir forming substrate 20, and is completed at the point of time in which the moderate inclined surface 121 is formed continuous to the lower surface. In this manner, it is possible to form a reservoir forming substrate 20 provided with an inclined surface of approximately 54° such as is shown in FIG. 21A.

Figure 22B:
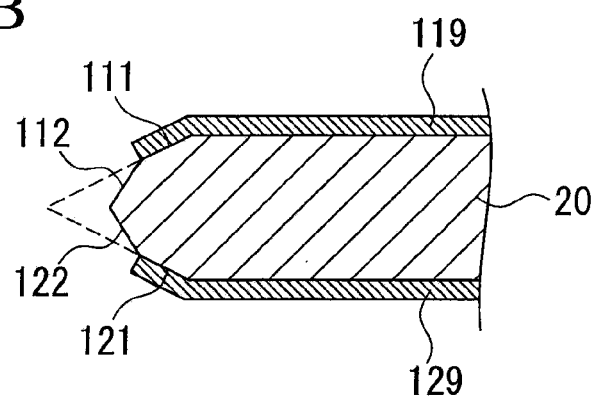

Next, as shown in FIG. 22B, a new mask 119 is formed applying a moderate inclined surface 111 from the upper surface of the reservoir forming substrate 20, and a new mask 129 is formed with a moderate inclined surface 121 from the lower surface, with the re-accomplishment of the wet etching referred to earlier. This wet etching is also performed with time control management, a steep inclined surface 112b formed continuous to the moderate inclined surface 111 of the upper side, and completed with the formation of a steep inclined surface 122, formed continuous to the moderate inclined surface 121 of the lower side. By means of the above, the reservoir forming substrate 20 is formed as the first deformation example shown in FIG. 21B.

Figure 22C:
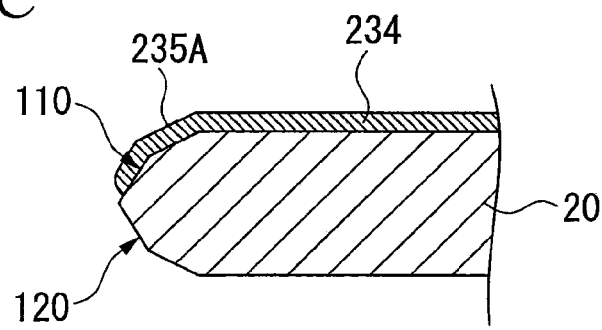

Next, as shown in FIG. 22C, the second wiring 234 and the fourth wiring 235A are formed extending to the first inclining surface 110 from the upper surface of the reservoir forming substrate 20. Specifically, coating is accomplished of a photosensitive resin mixed with a catalyst, and first of all the upper surface and side surface of the reservoir forming substrate 20 is exposed. In this instance, in positively exposing the side surface of the reservoir forming substrate 20 it is necessary to adjust the focal point for the depth of exposure position. However, since the fifth embodiment is composed of the first inclined surface 110 in which the side surface of the reservoir forming substrate 20 faces the upper side, and the second inclined surface 120 in which it faces the lower side, along with the upper surface of the reservoir forming substrate 20, first of all it would be sufficient if only the first inclined surface 110 were exposed. Subsequently, in accomplishing development, the second wiring 234 and the fourth wiring 235A are formed.

Figure 22D:
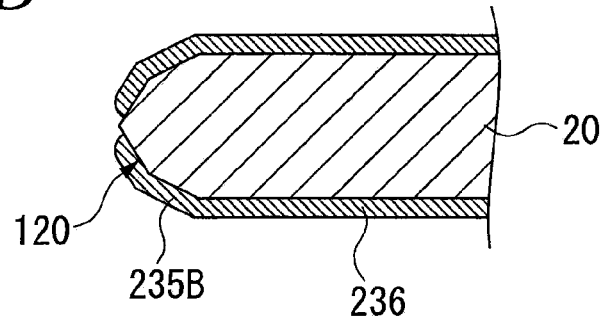

Next, as shown in FIG. 22D, the third wiring 236 and the fourth wiring 235B are formed extending to the second inclining surface 120 from the lower surface of the reservoir forming substrate 20. Specifically, coating is accomplished of a photosensitive resin mixed with a catalyst, and the upper surface and side surface of the reservoir forming substrate 20 are exposed. In this instance, along with the lower surface of the reservoir forming substrate 20, it is sufficient if only the second inclined surface 120 is exposed. Subsequently, in accomplishing development, the third wiring 236 and fourth wiring 235B are formed.

Subsequently, by passing through the same process as that of the fourth embodiment, formation is accomplished of the liquid droplet ejection head of the first deformation example shown in FIG. 21B.

As indicated above, with the droplet ejection head 1, the side surface 20b of when the reservoir forming substrate 20 is composed of multiple inclined surfaces, wherein the first inclined surface 110 which faces the upper side is arranged on the upper side of the reservoir forming substrate 20, and the second inclined surface 120 which faces the lower side is arranged on the lower side of the reservoir forming substrate 20. According to such a construction, exposure of the side surface of the reservoir forming substrate 20 can be accomplished by dividing the exposure light on the side surfaces of the reservoir forming substrate 20 into an upper side and a lower side. Hence, in comparison with when the fourth embodiment accomplishes exposure once over the entire site surface, adjustment of the focal point depth of the exposure device can be easily accomplished. By this means, it is possible to reduce the equipment cost of the exposure device. Furthermore, since the manufacturing process is simplified, manufacturing costs can be reduced. Furthermore, the third wiring can be simply formed at low-cost.

Furthermore, with the liquid droplet ejection head of the fifth embodiment, the side surface 20b of the reservoir for a substrate 20 is composed so that the lower surface and the upper surface of the reservoir forming substrate 20 are formed so as to combine as an obtuse angle or a curved surface. According to such a construction, each subterranean wiring can be formed extending to the lower surface from the upper surface of the reservoir forming substrate 20. Furthermore, in the case a gap is formed between each subterranean wiring as well, the plating 246 grown from the proximate subterranean wiring can be easily combined. Furthermore, a liquid droplet ejection head can be provided with superior electrical reliability.

Next, an explanation is provided of an example of a liquid droplet ejection device provided with the droplet ejection head 1 described above, with reference to FIG. 23. In this example an inkjet type recording device provided with the described liquid droplet ejection head is explained.

Figure 23:
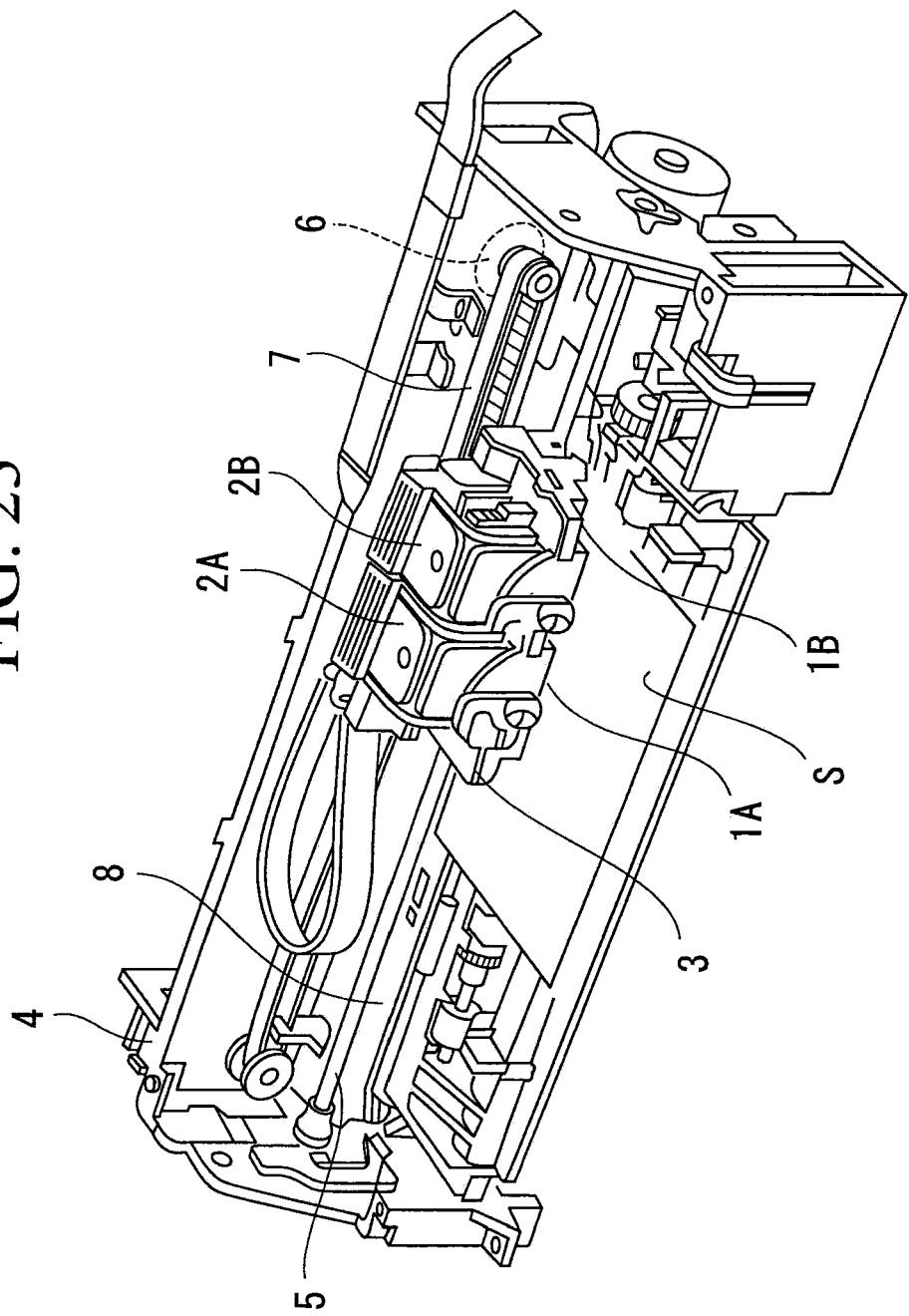
FIG. 23 is a perspective view showing an inkjet type recording device including an example of a liquid droplet ejection device.

The liquid droplet ejection head composed partially of a recording head unit equipped with a pending flow path is coupled with a cartridge and the like, wherein it is mounted on an inkjet type recording device. As shown in FIG. 23, to the recording head units 1A and 1B equipped with a liquid droplet ejection head, cartridges 2A and 2B composing the ink supply means are removably attached, and a carriage 3 which mounts the recording head units 1A and 1B is provided so as to be freely movable in the axial direction of a carriage shaft 5 attached to a device main body 4.

The recording head units 1A and 1B eject, for example, a black ink composition and a color ink composition. The driving force of a driving motor 6 is transmitted to the carriage 3 through multiple un-shown wheels and timing belts 7, moving the carriage 3 on which is mounted the recording head units 1A and 1B along the carriage shaft 5. In the device main body 4 is provided a platen 8 along the carriage shaft 5, wherein a recording sheet S including the recording medium of the paper and the like supplied from an un-shown paper supply roller, is transported on the platen 8. Since the jet format recording device provided with such a construction is provided with the described liquid droplet ejection head, it is a small type, but has high reliability, in a low-cost inkjet format recording device.

In FIG. 23, is shown an inkjet type recording device as a single body printer in an example of the liquid droplet ejected device of the present invention. However, the present invention is not limited to this, and it is possible for it to be applied to a printer unit realized by incorporating the subject liquid droplet ejection head. This type of printer unit, for example, is mounted to an input device of, for example, a television display, or the input device of a white board and the like, and is used to print a display or an input image from a display device or input device.

Furthermore, the liquid droplet ejection head can also be applied to a liquid droplet ejection to accomplish each type of device by a liquid phase method. In this embodiment, as the functional liquid ejected from the liquid droplet ejection head, use is made of a material used for forming a liquid crystal device for forming a liquid crystal display, or material used for organic EL formation forming an organic EL display, or material used for forming a wiring pattern for forming the wiring pattern of an electronic circuit, and the like. According to the manufacturing process selectively arranging the functional liquid on a base by means of a liquid droplet ejection device, since a pattern arrangement is possible of a functional material without passing the photolithography process, a liquid crystal display, or organic EL device, or circuit substrate can be manufactured at low-cost.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A manufacturing method of a device that has a semiconductor element, comprising:
   forming a first wiring on a first surface of a first member;
   forming a second wiring on a second surface of a second member so as to have a gap from a connection terminal and a third wiring on an inclined plane side surface of the second member, the second member disposed on the first surface of the first member, the second surface facing in a same direction as the first surface of the first member, the third wiring positionally aligned with the first wiring and the second wiring for connecting the first wiring and the second wiring;
   disposing the semiconductor element on the first surface of the first member or on the second surface of the second member; and
   providing plating that electrically connects the first wiring, the second wiring, the third wiring, and the connection terminal of the semiconductor element, wherein
   the connection terminal is disposed so as to face the second wiring, and the plating is provided in the gap between the connection terminal and the second wiring.

2. A manufacturing method of a liquid droplet ejection head that ejects liquid droplets through deformation of a driven element, comprising:
   forming a first wiring on a first surface of a first substrate that has a pressurizing chamber which communicates with a nozzle aperture that ejects liquid droplets;
   forming a second wiring on a second surface of a second substrate so as to have a gap from a connection terminal and a third wiring on an inclined plane side surface of the second substrate, the second substrate disposed on the first surface of the first substrate, the second surface facing in a same direction as the first surface of the first substrate, the third wiring positionally aligned with the first wiring and the second wiring for connecting the first wiring and the second wiring;
   disposing the semiconductor element on the second surface of the second substrate; and
   providing plating that electrically connects the first wiring, the second wiring, the third wiring, and the connection terminal of the semiconductor element, wherein
   the connection terminal is disposed so as to face the second wiring, and the plating is provided in the gap between the connection terminal and the second wiring.

3. A manufacturing method of a device that has a semiconductor element, comprising:
   forming a first wiring on a lower step surface of a stepped body,
   forming a second wiring on an upper step surface of the stepped body so as to have a gap from a connection terminal,
   disposing the semiconductor element on a side surface that connects the upper step surface and the lower step surface of the stepped body, and
   providing plating that electrically connects the first wiring, the second wiring, and the connection terminal of the semiconductor element, wherein
   the connection terminal is disposed so as to face the second wiring, and the plating is provided in the gap between the connection terminal and the second wiring.

4. A manufacturing method of a liquid droplet ejection head that ejects liquid droplets through deformation of a driven element, comprising:
   forming a first wiring on a first surface of a first substrate that has a pressurizing chamber which communicates with a nozzle aperture that ejects liquid droplets;
   forming a second wiring on a second surface of a second substrate so as to have a gap from a connection terminal and a third wiring on an inclined plane side surface of the second substrate, the second substrate disposed on the first surface of the first substrate, the second surface facing in a same direction as the first surface of the first substrate, the third wiring positionally aligned with the first wiring and the second wiring for connecting the first wiring and the second wiring;
   disposing the semiconductor element on the side surface of the second substrate; and
   providing plating that electrically connects the first wiring, the second wiring, the third wiring, and the connection terminal of the semiconductor element, wherein
   the connection terminal is disposed so as to face the third wiring, and the plating is provided in the gap between the connection terminal and the third wiring.

5. A manufacturing method of a device that has a semiconductor element, comprising:
   forming a first wiring on a first surface of a first member;
   forming a second wiring on a second surface of a second member so as to have a gap from a connection terminal, a third wiring on a third surface of the second member, and a fourth wiring on an inclined plane side surface of the second member, the third surface being opposite the second surface;
   disposing the semiconductor element on the second surface of the second member;
   providing plating that electrically connects the second wiring, the third wiring, the fourth wiring and the connection terminal of the semiconductor element; and
   disposing the second member on the first surface of the first member to electrically connect the plating and the first wiring, wherein
   the connection terminal is disposed so as to face the second wiring, and the plating is provided in the gap between the connection terminal and the second wiring.

6. A manufacturing method of a liquid droplet ejection head that ejects liquid droplets through deformation of a driven element, comprising:
   forming a first wiring on a first surface of a first substrate that has a pressurizing chamber which communicates with a nozzle aperture that ejects liquid droplets;
   forming a second wiring on a second surface of a second substrate so as to have a gap from a connection terminal, a third wiring on a third surface of the second substrate, and a fourth wiring on an inclined plane side surface of the second substrate, the third surface being opposite the second surface;
   disposing the semiconductor element on the second surface of the second substrate;
   providing plating that electrically connects the second wiring, the third wiring, the fourth wiring and the connection terminal of the semiconductor element; and disposing the second substrate on the first surface of the first substrate to cover the driven element and to electrically connect the plating and the first wiring, wherein
the connection terminal is disposed so as to face the second wiring, and the plating is provided in the gap between the connection terminal and the second wiring.

* * * * *